(12) United States Patent
Hirano et al.

(10) Patent No.: US 8,354,218 B2
(45) Date of Patent: Jan. 15, 2013

(54) RESIST COMPOSITION AND METHOD OF FORMING RESIST PATTERN

(75) Inventors: Isao Hirano, Kawasaki (JP); Toshiaki Hato, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 225 days.

(21) Appl. No.: 12/820,899

(22) Filed: Jun. 22, 2010

(65) Prior Publication Data

US 2011/0039207 A1 Feb. 17, 2011

(30) Foreign Application Priority Data

Jul. 2, 2009 (JP) ................ P2009-158145

(51) Int. Cl.
*G03F 7/039* (2006.01)
*G03F 7/30* (2006.01)

(52) U.S. Cl. ............... 430/280.1; 430/326; 430/270.1

(58) Field of Classification Search .......... None
See application file for complete search history.

(56) References Cited

U.S. PATENT DOCUMENTS

| | | | | |
|---|---|---|---|---|
| 5,362,597 A * | 11/1994 | Sano et al. | ............ | 430/191 |
| 5,945,517 A | 8/1999 | Nitta et al. | | |
| 6,060,207 A * | 5/2000 | Shida et al. | ............ | 430/176 |
| 6,153,733 A | 11/2000 | Yukawa et al. | | |
| 7,074,543 B2 | 7/2006 | Iwai et al. | | |
| 2011/0177302 A1 * | 7/2011 | Takita | ............ | 428/195.1 |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-222999 | 8/2003 |
| JP | 2003-241385 | 8/2003 |
| JP | 2005-336452 | 12/2005 |
| JP | 2006-023489 | 1/2006 |
| JP | 2006-259582 | 9/2006 |
| WO | WO 2004-074242 | 9/2004 |
| WO | WO 2004/076495 | 9/2004 |
| WO | WO-2009/119878 A1 * | 10/2009 |

* cited by examiner

*Primary Examiner* — Cynthia Hamilton
(74) *Attorney, Agent, or Firm* — Knobbe Martens Olson & Bear LLP

(57) ABSTRACT

A resist composition that includes a base component (A) that exhibits changed solubility in an alkali developing solution under the action of acid, an acid generator component (B) that generates acid upon exposure, and an epoxy resin (G). Also, a method of forming a resist pattern that includes using the above resist composition to form a resist film on the substrate, conducting exposure of the resist film, and alkali-developing the resist film to form a resist pattern.

11 Claims, No Drawings

RESIST COMPOSITION AND METHOD OF FORMING RESIST PATTERN

TECHNICAL FIELD

The present invention relates to a resist composition and a method of forming a resist pattern.

Priority is claimed on Japanese Patent Application No. 2009-158145, filed Jul. 2, 2009, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use an exposure light source having a shorter wavelength (and higher energy) than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist is used, which includes a base component that exhibits changed solubility in an alkali developing solution under the action of acid and an acid generator component that generates acid upon exposure.

For example, a chemically amplified positive resist typically contains a resin component (base resin) that exhibits increased solubility in an alkali developing solution under the action of acid, and an acid generator component. If the resist film formed using this resist composition is selectively exposed during formation of a resist pattern, then acid is generated from the acid generator within the exposed portions, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are widely used as base resins for resists that use ArF excimer laser lithography and the like, as they exhibit excellent transparency in the vicinity of 193 nm (for example, see Patent Document 1).

Further, in order to improve various lithography properties, a resin having a plurality of structural units can be used as the base resin. For example, in the case of a positive-type resist composition, a base resin containing a structural unit having an acid-dissociable, dissolution-inhibiting group that is dissociated by the action of the acid generated from the acid generator, a structural unit having a polar group such as a hydroxyl group, a structural unit having a lactone structure, and a structural unit having a glycidyl group is typically used (for example, see Patent Document 2).

Further, in order to reduce the occurrence of developing defects, a chemically amplified positive resist composition in which an epoxy compound (a non-polymer) having a molecular weight of approximately 100 to 1,000 is included together with the base resin has been proposed (see Patent Document 3).

PRIOR ART DOCUMENTS

Patent Documents

[Patent Document 1] Japanese Unexamined Patent Application, First Publication No. 2003-241385
[Patent Document 2] Japanese Unexamined Patent Application, First Publication No. 2003-222999
[Patent Document 3] Japanese Unexamined Patent Application, First Publication No. 2006-023489

DISCLOSURE OF INVENTION

Problems to be Solved by the Invention

In the future, as further progress is made in lithography techniques and the potential application fields for lithography techniques continue to expand, demands will grow for novel materials capable of being used in these lithography applications. For example, further progress in pattern miniaturization will result in ever greater demands for improvements in resist materials, both in terms of lithography properties such as the resolution, exposure margin (EL margin), depth of focus (DOF) and resistance to pattern collapse, and in terms of the pattern shape.

Of these properties, current methods that are used for preventing pattern collapse when forming a resist pattern with a conventional resist material include treating the substrate such as a silicon wafer with a compound such as hexamethyldisilazane (HMDS) or providing an organic antireflective film on top of the substrate, thereby improving the adhesion of the resist film to the substrate. However, using these methods means that an extra step must be provided within the resist pattern formation process for performing the HMDS treatment or forming the organic antireflective film, which increases the number of steps and makes the process more complex.

In the invention disclosed in Patent Document 2, a resin containing introduced glycidyl groups is used as the base resin that functions as the base component. However, investigations by the inventors of the present invention revealed that when a resist pattern was formed using a resist composition containing this resin, the adhesion of the composition to the substrate was unsatisfactory, and the lithography properties were also inadequate.

In the invention disclosed in Patent Document 3, an epoxy compound (non-polymer) having a molecular weight of approximately 100 to 1,000 is used as an additive. However, investigations by the inventors of the present invention revealed that when a resist pattern was formed using a resist composition containing this epoxy compound (non-polymer) and a base resin, the improvement in the adhesion of the composition to the substrate was minimal, and the lithography properties were still unsatisfactory.

Particularly in those applications where a thick resist film is formed (such as implantation processes and the like), increased miniaturization of the pattern increases the likelihood of pattern collapse, and improvements in the adhesion of the resist film to the substrate or the like are highly desirable.

The present invention has been developed in light of the circumstances described above, and has an object of providing a resist composition and a method of forming a resist pattern in which the resist film exhibits excellent adhesion to the substrate or the like, and the occurrence of pattern collapse is suppressed.

Means to Solve the Problems

As a result of intensive investigation aimed at achieving the above object, the inventors of the present invention discovered that the above object could be achieved by using a base component that exhibits changed solubility in an alkali developing solution under the action of acid, and an epoxy resin that is separate from the base component, and they were therefore able to complete the present invention.

In other words, a first aspect of the present invention is a resist composition that includes a base component (A) that exhibits changed solubility in an alkali developing solution under the action of acid, an acid generator component (B) that generates acid upon exposure, and an epoxy resin (G).

A second aspect of the present invention is a method of forming a resist pattern that includes using the resist composition of the first aspect to form a resist film on a substrate, conducting exposure of the resist film, and alkali-developing the resist film to form a resist pattern.

In the present description and claims, the term "alkyl group" includes linear, branched and cyclic monovalent saturated hydrocarbon groups, unless otherwise specified.

The term "alkylene group" includes linear, branched and cyclic divalent saturated hydrocarbon groups, unless otherwise specified.

A "lower alkyl group" is an alkyl group of 1 to 5 carbon atoms.

A "halogenated alkyl group" is a group in which some or all of the hydrogen atoms of an alkyl group have been substituted with halogen atoms, wherein examples of the halogen atoms include fluorine atoms, chlorine atoms, bromine atoms and iodine atoms.

The term "aliphatic" is a relative concept used in relation to the term "aromatic", and defines a group or compound or the like that has no aromaticity.

The term "structural unit" refers to a monomer unit that contributes to the formation of a polymeric compound (a polymer or copolymer).

The term "exposure" is used as a general concept that includes irradiation with any form of radiation, including an ArF excimer laser, KrF excimer laser, $F_2$ excimer laser, extreme ultraviolet rays (EUV), vacuum ultraviolet rays (VUV), electron beam (EB), X-rays or soft X-rays.

In the present description, the term "(meth)acrylic acid" is a generic term that includes either or both of acrylic acid having a hydrogen atom bonded to the α-position and methacrylic acid having a methyl group bonded to the α-position.

The term "(meth)acrylate ester" is a generic term that includes either or both of the acrylate ester having a hydrogen atom bonded to the α-position and the methacrylate ester having a methyl group bonded to the α-position.

The term "(meth)acrylate" is a generic term that includes either or both of the acrylate having a hydrogen atom bonded to the α-position and the methacrylate having a methyl group bonded to the α-position.

Effect of the Invention

The resist composition and method of forming a resist pattern of the present invention produces excellent adhesion of the resist film to a substrate or the like, and can suppress the occurrence of pattern collapse.

BEST MODE FOR CARRYING OUT THE INVENTION

<<Resist Composition>>

The resist composition of the present invention includes a base component (A) (hereafter, referred to as "component (A)") that exhibits changed solubility in an alkali developing solution under the action of acid, an acid-generator component (B) (hereafter, referred to as "component (B)") that generates acid upon exposure, and an epoxy resin (G) (hereafter, referred to as "component (G)").

For a resist film formed using the above resist composition, when selective exposure is conducted during formation of a resist pattern, acid is generated from the component (B), and this acid acts on the component (A) to change the solubility of the component (A) in an alkali developing solution. As a result, the solubility of the exposed portions of the resist film in an alkali developing solution is changed, whereas the solubility of the unexposed portions in an alkali developing solution remains unchanged. Accordingly, by subsequently performing alkali developing, the exposed portions are dissolved and removed in the case of a positive resist composition, whereas the unexposed portions are dissolved and removed in the case of a negative resist composition, and hence in either case, a resist pattern can be formed.

The resist composition of the present invention preferably also includes a nitrogen-containing organic compound (D).

The resist composition of the present invention may be either a negative resist composition or a positive resist composition.

<Component (A)>

As the component (A), an organic compound typically used as a base component for a chemically amplified resist composition can be used alone, or two or more of such organic compounds can be mixed together.

Here, the term "base component" refers to an organic compound capable of forming a film, and is preferably an organic compound having a molecular weight of 500 or more. When the organic compound has a molecular weight of 500 or more, the film-forming ability is improved, and a resist pattern at the nano level can be more readily formed.

The "organic compounds having a molecular weight of 500 or more" which can be used as the base component can be broadly classified into non-polymers and polymers.

In general, as a non-polymer, any of those compounds having a molecular weight of at least 500 but less than 4,000 may be used. Hereafter, a non-polymer having a molecular weight of at least 500 but less than 4,000 is referred to as a "low molecular weight compound".

As a polymer, any of those compounds having a molecular weight of 1,000 or more may be used. Hereafter, a polymer having a molecular weight of 1,000 or more is referred to as a "polymeric compound". In the case of a polymeric compound, the "molecular weight" refers to the polystyrene-equivalent weight average molecular weight value determined by gel permeation chromatography (GPC). Hereafter, a polymeric compound is frequently referred to as simply a "resin".

As the component (A), a resin component that exhibits changed solubility in an alkali developing solution under the action of acid can be used, and a low molecular weight compound component that exhibits changed solubility in an alkali developing solution under the action of acid may also be used.

In those cases where the resist composition of the present invention is a "positive resist composition", a base component (hereafter referred to as "component (A1)") that exhibits increased solubility in an alkali developing solution under the action of acid is used as the component (A).

The component (A1) is substantially insoluble in an alkali developing solution prior to exposure, but when acid is generated from the component (B) upon exposure, the action of the acid causes an increase in the solubility of the component (A) in an alkali developing solution. Therefore, in the formation of a resist pattern, by conducting selective exposure of a resist film formed by applying the positive resist composition onto a substrate, the exposed portions change from an insoluble state to a soluble state in an alkali developing solution, whereas the unexposed portions remain substantially insoluble in an alkali developing solution, and hence, a resist pattern can be formed by alkali developing.

In the resist composition of the present invention, the component (A) is preferably a base component that exhibits increased solubility in an alkali developing solution under the action of acid (namely, the component (A1)). That is, the resist composition of the present invention is preferably a positive resist composition.

The component (A1) may be a resin component (A1-1) that exhibits increased solubility in an alkali developing solution under the action of acid (hereafter, referred to as "component (A1-1)"), a low molecular weight compound (A1-2) that exhibits increased solubility in an alkali developing solution under the action of acid (hereafter, referred to as "component (A1-2)"), or a mixture of the component (A1-1) and the component (A1-2). Of these possibilities, the component (A1) preferably includes a component (A1-1).

[Component (A1-1)]

As the component (A1-1), a single resin component (base resin) typically used as a base component for a chemically amplified resist composition can be used alone, or two or more of such resin components can be mixed together.

In the present invention, the component (A1-1) preferably includes a structural unit derived from an acrylate ester.

In the present descriptions and the claims, the term "structural unit derived from an acrylate ester" refers to a structural unit which is formed by the cleavage of the ethylenic double bond of an acrylate ester.

The term "acrylate ester" is a generic term that includes the acrylate ester having a hydrogen atom bonded to the carbon atom on the α-position, and acrylate esters having a substituent (an atom other than a hydrogen atom or a group) bonded to the carbon atom on the α-position. Examples of the substituent include an alkyl group of 1 to 5 carbon atoms or a halogenated alkyl group of 1 to 5 carbon atoms.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the alkyl group of 1 to 5 carbon atoms for the substituent at the α-position include linear or branched lower alkyl groups such as a methyl group, ethyl group, propyl group, isopropyl group, n-butyl group, isobutyl group, tert-butyl group, pentyl group, isopentyl group and neopentyl group.

Specific examples of the halogenated alkyl group of 1 to 5 carbon atoms include groups in which some or all of the hydrogen atoms of the aforementioned "alkyl group of 1 to 5 carbon atoms for the substituent at the α-position" are substituted with halogen atoms. Examples of the halogen atoms include fluorine atoms, chlorine atoms, bromine atoms and iodine atoms, and fluorine atoms are particularly desirable.

In the present invention, it is preferable that a hydrogen atom, an alkyl group of 1 to 5 carbon atoms or a halogenated alkyl group of 1 to 5 carbon atoms is bonded to the α-position of the acrylate ester, and more preferably a hydrogen atom, an alkyl group of 1 to 5 carbon atoms or a fluorinated alkyl group of 1 to 5 carbon atoms. In terms of industrial availability, a hydrogen atom or a methyl group is the most desirable.

In the resist composition of the present invention, it is particularly desirable that the component (A1-1) have a structural unit (a1) derived from an acrylate ester containing an acid-dissociable, dissolution-inhibiting group.

Further, it is preferable that the component (A1-1) have a structural unit (a2) derived from an acrylate ester containing a lactone-containing cyclic group, as well as the structural unit (a1).

Furthermore, it is preferable that the component (A1-1) have a structural unit (a3) derived from an acrylate ester containing a polar group-containing aliphatic hydrocarbon group, as well as the structural unit (a1).

Moreover, it is preferable that the component (A1-1) have a structural unit (a4) derived from an acrylate ester containing a non-acid-dissociable aliphatic polycyclic group, as well as the structural unit (a1).

Further, it is preferable that the component (A1-1) have a structural unit (a5) represented by general formula (a5-1) shown below, as well as the structural unit (a1).

Further, it is preferable that the component (A1-1) have a structural unit (a6) represented by general formula (a6-1) shown below, as well as the structural unit (a1).

(Structural Unit (a1))

The structural unit (a1) is a structural unit derived from an acrylate ester containing an acid-dissociable, dissolution-inhibiting group.

As the acid-dissociable, dissolution-inhibiting group in the structural unit (a1), any of the groups that have been proposed as acid-dissociable, dissolution-inhibiting groups for the base resins of chemically amplified resists can be used, provided the group has an alkali dissolution-inhibiting effect that renders the entire component (A1-1) insoluble in an alkali developing solution prior to dissociation, and then following dissociation by the action of acid, increases the solubility of the entire component (A1-1) in the alkali developing solution. Generally, groups that form either a cyclic or chain-like tertiary alkyl ester with the carboxyl group of the (meth)acrylic acid or the like, and acetal-type acid-dissociable, dissolution-inhibiting groups such as alkoxyalkyl groups are the most widely known.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid generally causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable, dissolution-inhibiting groups".

Examples of tertiary alkyl ester-type acid-dissociable, dissolution-inhibiting groups include aliphatic branched, acid-dissociable, dissolution-inhibiting groups and aliphatic cyclic group-containing acid-dissociable, dissolution-inhibiting groups.

In the claims and description of the present invention, the term "aliphatic branched" refers to a branched structure having no aromaticity.

The "aliphatic branched, acid-dissociable, dissolution-inhibiting group" is not limited to structures constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid-dissociable, dissolution-inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of the substituent include lower alkyl groups of 1 to 5 carbon atoms, lower alkoxy groups of 1 to 5 carbon atoms, a fluorine atom, fluorinated lower alkyl groups of 1 to 5 carbon atoms, and an oxygen atom (=O).

The basic ring structure of the "aliphatic cyclic group" exclusive of substituents is not limited to structures constituted of only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

Examples of such aliphatic cyclic groups include groups in which one or more hydrogen atoms have been removed from a monocycloalkane or a polycycloalkane such as a bicycloalkane, tricycloalkane or tetracycloalkane, which may or may not be substituted with a lower alkyl group, a fluorine atom or a fluorinated lower alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane.

Examples of the aliphatic cyclic group-containing acid-dissociable, dissolution-inhibiting group include groups having a tertiary carbon atom within the ring structure of a cyclic alkyl group. Specific examples include a 2-methyl-2-adamantyl group and a 2-ethyl-2-adamantyl group. Alternatively, groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded to the aliphatic cyclic group, such as the groups bonded to the oxygen atom of the carbonyloxy group (—C(O)—O—) in the structural units represented by general formulas (a1"-1) to (a1"-6) shown below, may also be used.

[Chemical formula 1]

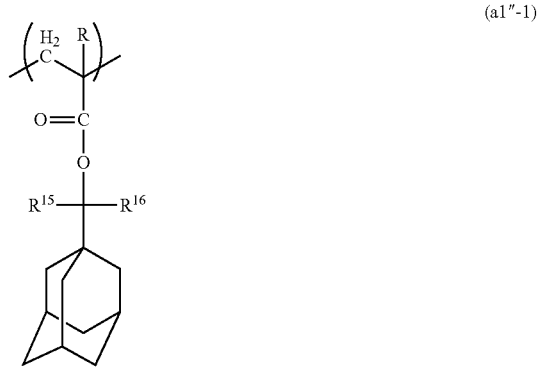

(a1"-1)

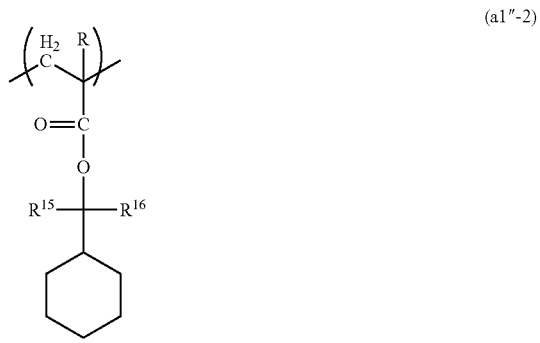

(a1"-2)

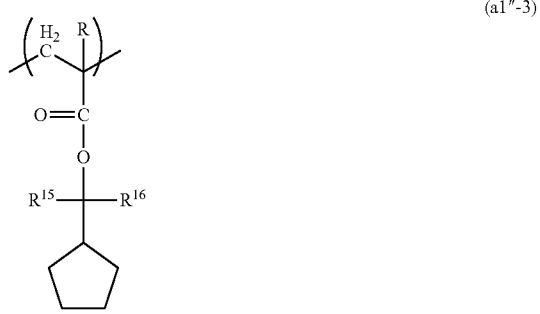

(a1"-3)

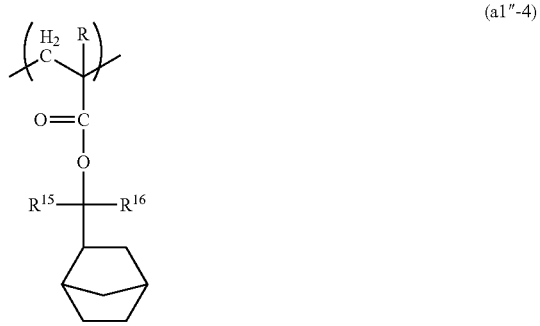

(a1"-4)

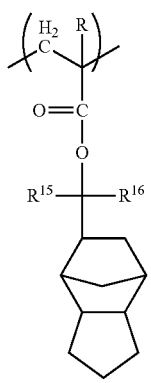

(a1″-5)

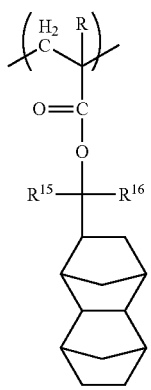

(a1″-6)

In the above formulas, each R represents a hydrogen atom, a lower alkyl group or a halogenated lower alkyl group, and each of le and le independently represents an alkyl group (which may be linear or branched, and preferably has 1 to 5 carbon atoms).

In general formulas (a1″-1) to (a1″-6), the lower alkyl group or halogenated lower alkyl group for R is the same as defined above for the lower alkyl group or halogenated lower alkyl group that may be bonded to the α-position of an aforementioned acrylate ester.

An "acetal-type acid-dissociable, dissolution-inhibiting group" generally substitutes a hydrogen atom at the terminal of an alkali-soluble group such as a carboxyl group or hydroxyl group, so as to be bonded with an oxygen atom. When acid is generated upon exposure, the action of this acid breaks the bond between the acetal-type acid-dissociable, dissolution-inhibiting group and the oxygen atom to which the acetal-type, acid-dissociable, dissolution-inhibiting group is bonded.

Examples of acetal-type acid-dissociable, dissolution-inhibiting groups include groups represented by general formula (p1) shown below.

[Chemical formula 2]

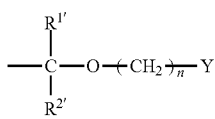

(p1)

In the formula, each of $R^{1'}$ and $R^{2'}$ independently represents a hydrogen atom or a lower alkyl group, n represents an integer of 0 to 3, and Y represents a lower alkyl group or an aliphatic cyclic group.

In the above formula, n is preferably an integer of 0 to 2, more preferably 0 or 1, and is most preferably 0.

Examples of the lower alkyl group for $R^{1'}$ and $R^{2'}$ include the same lower alkyl groups as those listed above for R within general formulas (a1″-1) to (a1″-6), although a methyl group or ethyl group is preferable, and a methyl group is particularly desirable.

In the present invention, it is preferable that at least one of R″ and $R^{2'}$ is a hydrogen atom. In other words, it is preferable that the acid-dissociable, dissolution-inhibiting group (p1) is a group represented by general formula (p1-1) shown below.

[Chemical formula 3]

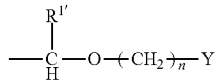

(p1-1)

In this formula, R″, n and Y are the same as defined above for formula (p1).

Examples of the lower alkyl group for Y include the same groups as those listed above for the lower alkyl group for R within formulas (a1″-1) to (a1″-6).

As the aliphatic cyclic group for Y, any of the monocyclic or polycyclic aliphatic cyclic groups that have been proposed for conventional ArF resists and the like may be appropriately selected for use. For example, the same groups as those described above in connection with the "aliphatic cyclic group" may be used.

Further, as the acetal-type, acid-dissociable, dissolution-inhibiting group, groups represented by general formula (p2) shown below may also be used.

[Chemical formula 4]

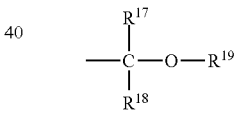

(p2)

In the formula, $R^{17}$ and $R^{18}$ each independently represents a linear or branched alkyl group or a hydrogen atom, and $R^{19}$ represents a linear, branched or cyclic alkyl group. Alternatively, each of $R^{17}$ and $R^{19}$ may independently represent a linear or branched alkylene group, wherein $R^{17}$ is bonded to $R^{19}$ to form a ring.

The alkyl group for $R^{17}$ or $R^{18}$ preferably has 1 to 15 carbon atoms, and may be either linear or branched, although an ethyl group or methyl group is preferable, and a methyl group is the most preferred. It is particularly desirable that one of $R^{17}$ and $R^{18}$ is a hydrogen atom and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, or a polycycloalkane such as adamantane, norbornane, isobornane, tricyclodecane or tetracyclododecane. Among these, a group in which one or more hydrogen atoms have been removed from adamantane is preferable.

Further, in the above formula, each of $R^{17}$ and $R^{19}$ may independently represent a linear or branched alkylene group (and preferably an alkylene group of 1 to 5 carbon atoms), wherein $R^{19}$ is bonded to $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of this cyclic group include a tetrahydropyranyl group and a tetrahydrofuranyl group.

As the structural unit (a1), it is preferable to use at least one type of structural unit selected from the group consisting of structural units represented by general formula (a1-0-1) shown below and structural units represented by general formula (a1-0-2) shown below.

[Chemical formula 5]

(a1-0-1)

In this formula, R represents a hydrogen atom, a lower alkyl group or a halogenated lower alkyl group, and $X^1$ represents an acid-dissociable, dissolution-inhibiting group.

[Chemical formula 6]

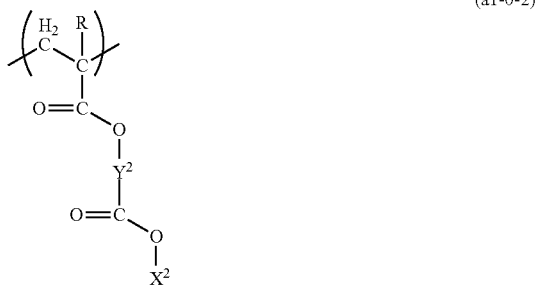

(a1-0-2)

In this formula, R represents a hydrogen atom, a lower alkyl group or a halogenated lower alkyl group, $X^2$ represents an acid-dissociable, dissolution-inhibiting group, and $Y^2$ represents a divalent linking group.

In general formula (a1-0-1), the lower alkyl group or halogenated lower alkyl group for R is the same as defined above for the lower alkyl group or halogenated lower alkyl group that may be bonded to the α-position of an aforementioned acrylate ester.

$X^1$ is not particularly limited, as long as it is an acid-dissociable, dissolution-inhibiting group, and examples include the aforementioned tertiary alkyl ester-type acid-dissociable, dissolution-inhibiting groups and acetal-type acid-dissociable, dissolution-inhibiting groups, and of these, tertiary alkyl ester-type acid-dissociable, dissolution-inhibiting groups are preferable.

In general formula (a1-0-2), R is the same as defined above for R in formula (a1-0-1).

$X^2$ is the same as defined for $X^1$ in formula (a1-0-1).

Examples of the divalent linking group for $Y^2$ include alkylene groups, divalent aliphatic cyclic groups, and divalent linking groups containing a hetero atom.

Examples of the aliphatic cyclic group include the same groups as those exemplified above within the description of the "aliphatic cyclic group", with the exception that two or more hydrogen atoms have been removed therefrom.

When $Y^2$ represents an alkylene group, the group preferably contains 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, a group in which two or more hydrogen atoms have been removed from cyclopentane, cyclohexane, norbornane, isobornane, adamantane, tricyclodecane or tetracyclododecane is particularly desirable.

When $Y^2$ represents a divalent linking group containing a hetero atom, specific examples of the divalent linking group containing a hetero atom include —O—, —C(=O)—O—, —C(=O)—, —O—C(=O)—O—, —C(=O)—NH—, —NH— (wherein H may be substituted with a substituent such as an alkyl group or acyl group or the like), —S—, —S(=O)$_2$—, —S(=O)$_2$—O—, and -A-O (oxygen atom)-B— (wherein each of A and B independently represents a divalent hydrocarbon group which may have a substituent).

In those cases where $Y^2$ is —NH— and the H has been substituted with a substituent such as an alkyl group or acyl group or the like, the number of carbon atoms within the substituent is preferably from 1 to 10 carbon atoms, more preferably from 1 to 8 carbon atoms, and most preferably from 1 to 5 carbon atoms.

When $Y^2$ represents -A-O—B—, each of A and B independently represents a divalent hydrocarbon group which may have a substituent.

The description that the hydrocarbon group "may have a substituent" means that some or all of the hydrogen atoms within the hydrocarbon group may be substituted with an atom other than a hydrogen atom or with a group.

The hydrocarbon group for A may be either an aliphatic hydrocarbon group or an aromatic hydrocarbon group. An "aliphatic hydrocarbon group" refers to a hydrocarbon group that has no aromaticity.

The aliphatic hydrocarbon group for A may be saturated or unsaturated, but in general, is preferably saturated.

Specific examples of the aliphatic hydrocarbon group for A include linear and branched aliphatic hydrocarbon groups, and aliphatic hydrocarbon groups containing a ring in the structure thereof The linear or branched aliphatic hydrocarbon group preferably has 1 to 10 carbon atoms, more preferably 1 to 8, still more preferably 2 to 5, and most preferably 2 carbon atoms.

As the linear aliphatic hydrocarbon group, a linear alkylene group is preferable, and specific examples include a methylene group, ethylene group [—(CH$_2$)$_2$—], trimethylene group [—(CH$_2$)$_3$—], tetramethylene group [—(CH$_2$)$_4$—] and pentamethylene group [—(CH$_2$)$_5$—].

As the branched aliphatic hydrocarbon group, a branched alkylene group is preferable, and specific examples include alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The chain-like aliphatic hydrocarbon group may or may not have a substituent. Examples of the substituent include a fluorine atom, a fluorinated lower alkyl group of 1 to 5 carbon atoms, and an oxygen atom (=O).

Examples of the hydrocarbon group containing a ring in the structure thereof include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Specific examples of the monocycloalkane include cyclopentane and cyclohexane. As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon group may or may not have a substituent. Examples of the substituent include lower alkyl groups of 1 to 5 carbon atoms, a fluorine atom, fluorinated lower alkyl groups of 1 to 5 carbon atoms, and an oxygen atom (=O).

As the group A, a linear aliphatic hydrocarbon group is preferred, a linear alkylene group is more preferred, a linear alkylene group of 2 to 5 carbon atoms is still more preferred, and an ethylene group is the most desirable.

Specific examples of the aromatic hydrocarbon group for A include divalent aromatic hydrocarbon groups in which an additional hydrogen atom has been removed from the nucleus of a monovalent aromatic hydrocarbon group such as a phenyl group, biphenyl group, fluorenyl group, naphthyl group, anthryl group or phenanthryl group, aromatic hydrocarbon groups in which a portion of the carbon atoms that constitute the ring of an aforementioned divalent aromatic hydrocarbon group have been substituted with a hetero atom such as an oxygen atom, sulfur atom or nitrogen atom, and aromatic hydrocarbon groups in which an additional hydrogen atom has been removed from the nucleus of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the hydrocarbon group for B include the same divalent hydrocarbon groups as those listed above for A.

As the group B, a linear or branched aliphatic hydrocarbon group is preferred, and a methylene group or an alkylmethylene group is particularly desirable.

The alkyl group within the alkylmethylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical formula 7]

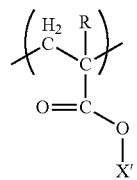

(a1-1)

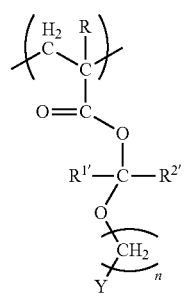

(a1-2)

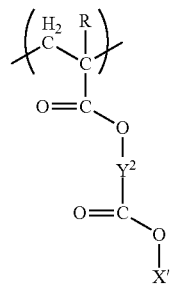

(a1-3)

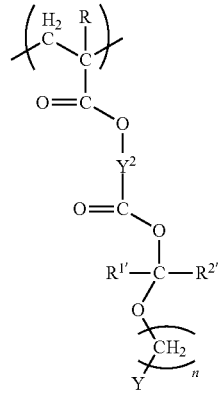

(a1-4)

In the above formulas, X' represents a tertiary alkyl ester-type acid-dissociable, dissolution-inhibiting group, Y represents a lower alkyl group of 1 to 5 carbon atoms or an aliphatic cyclic group, n represents an integer of 0 to 3, $Y^2$ represents a divalent linking group, R is the same as defined above for R in formula (a1-0-1), and each of $R^{1'''}$ and $R^{2'}$ independently represents a hydrogen atom or a lower alkyl group of 1 to 5 carbon atoms.

In the formulas, examples of X' include the same groups as the tertiary alkyl ester-type acid-dissociable, dissolution-inhibiting groups listed above for $X^1$ in formula (a1-0-1).

Examples of $R^{1'}$, $R^{2'}$, n and Y include the same groups and numbers as those listed above for $R^{1'}$, $R^{2'}$, n and Y in general formula (p1) described above in connection with the "acetal-type acid-dissociable, dissolution-inhibiting groups".

Examples of $Y^2$ include the same groups as those listed above for $Y^2$ in general formula (a1-0-2).

Specific examples of the structural units represented by general formulas (a1-1) to (a1-4) are shown below.

In each of the following formulas, IV represents a hydrogen atom, a methyl group or a trifluoromethyl group.

[Chemical formula 8]

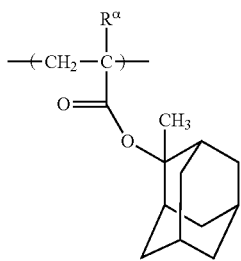
(a1-1-1)

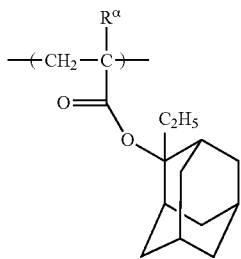
(a1-1-2)

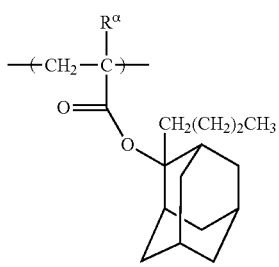
(a1-1-3)

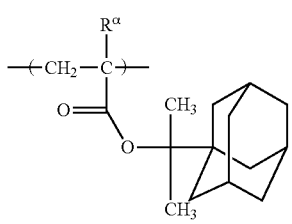
(a1-1-4)

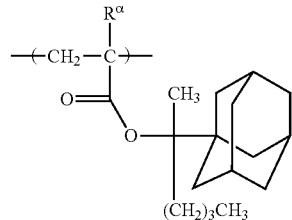
(a1-1-5)

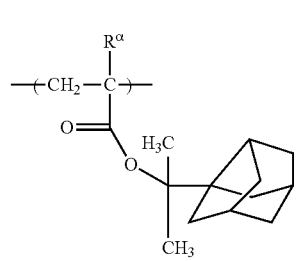
(a1-1-6)

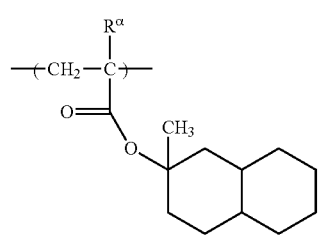
(a1-1-7)

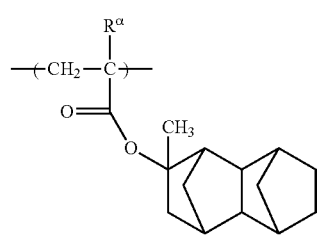
(a1-1-8)

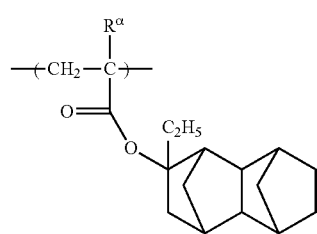
(a1-1-9)

[Chemical formula 9]

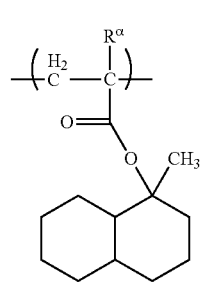
(a1-1-10)

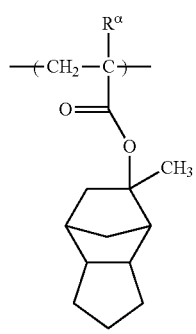 (a1-1-11)
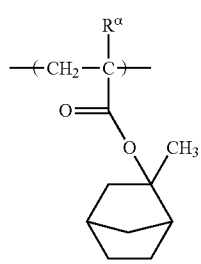 (a1-1-12)
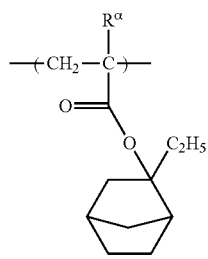 (a1-1-13)
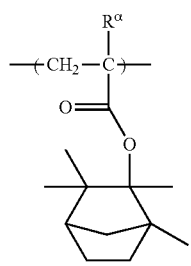 (a1-1-14)
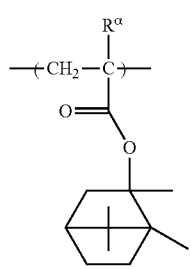 (a1-1-15)
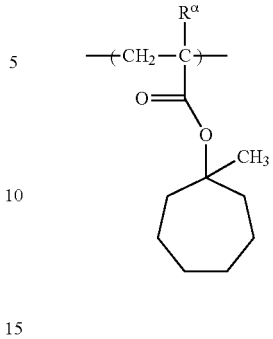 (a1-1-16)
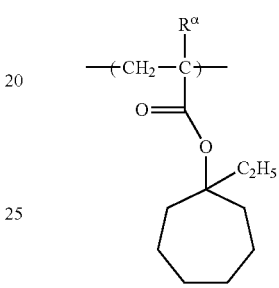 (a1-1-17)
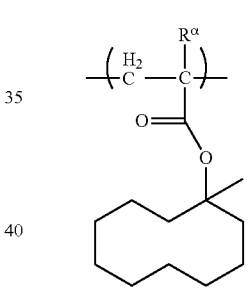 (a1-1-18)
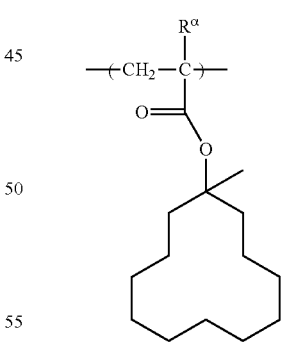 (a1-1-19)
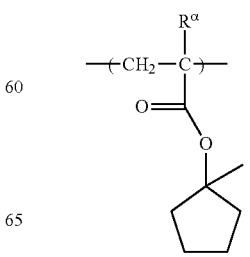 (a1-1-20)

(a1-1-21) 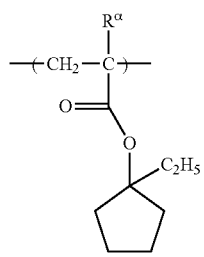
[Chemical formula 10]
(a1-1-22) 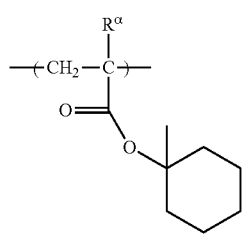
(a1-1-23) 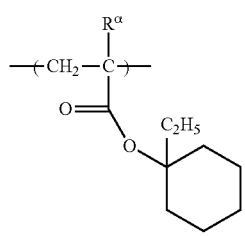
(a1-1-24) 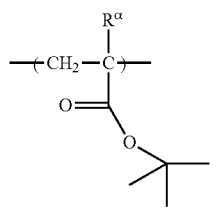
(a1-1-25) 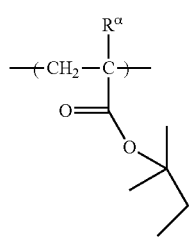
(a1-1-26) 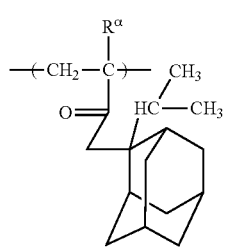
(a1-1-27) 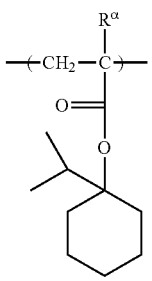
(a1-1-28) 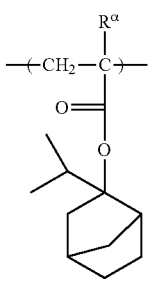
(a1-1-29) 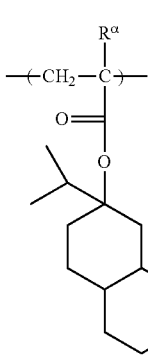
(a1-1-30) 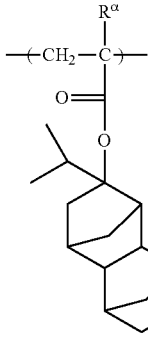
(a1-1-31) 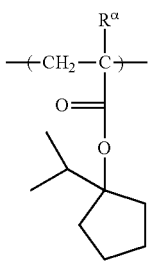

(a1-1-32) 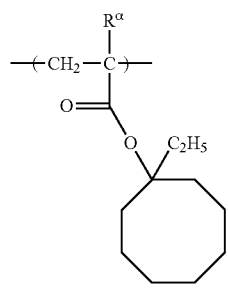
(a1-1-33) 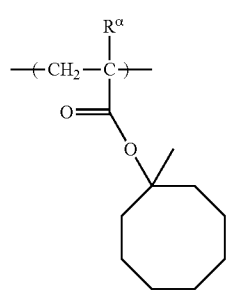
[Chemical formula 11]
(a1-2-1) 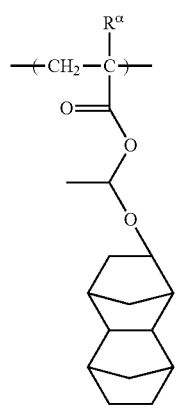
(a1-2-2) 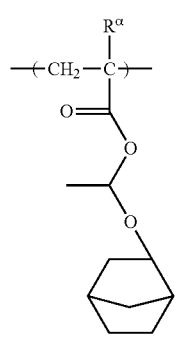
(a1-2-3) 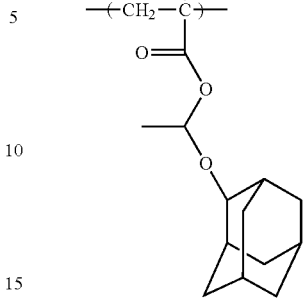
(a1-2-4) 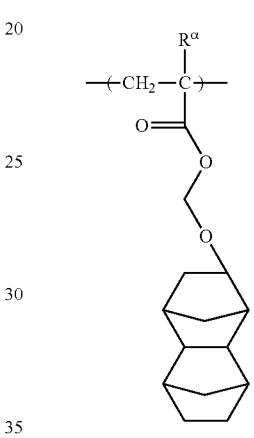
(a1-2-5) 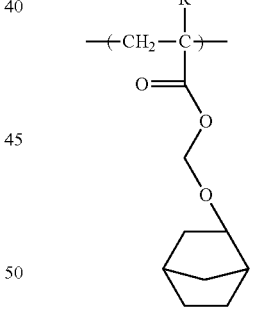
(a1-2-6) 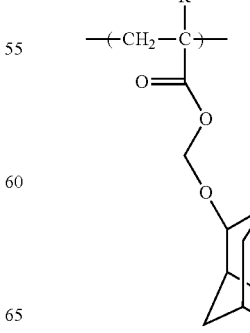

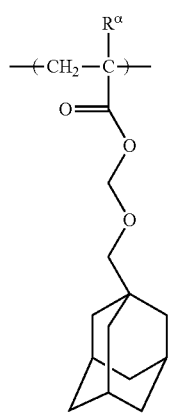
(a1-2-7)
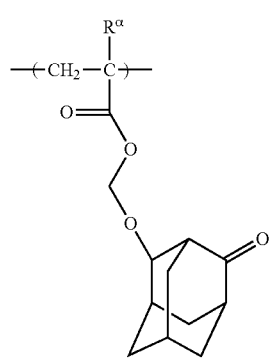
(a1-2-8)
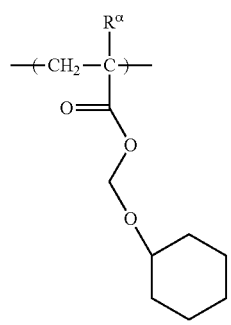
(a1-2-9)
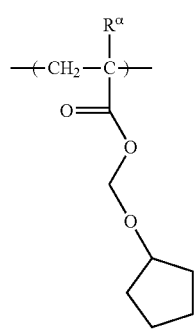
(a1-2-10)
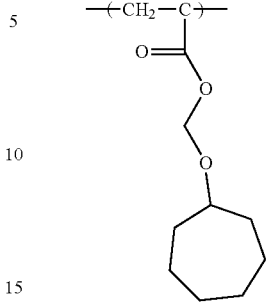
(a1-2-11)
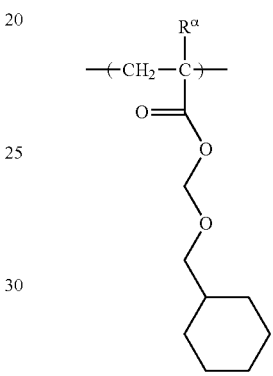
(a1-2-12)
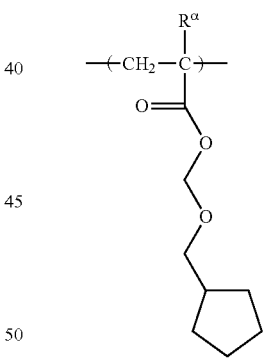
(a1-2-13)
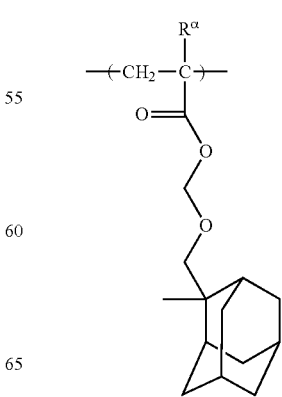
(a1-2-14)

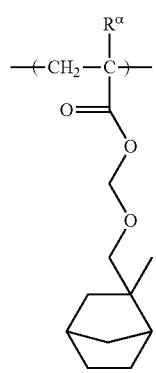 (a1-2-15)
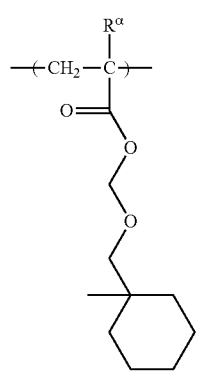 (a1-2-16)
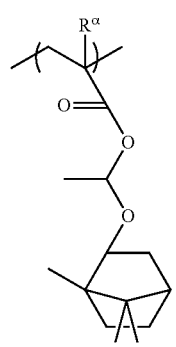 (a1-2-17)
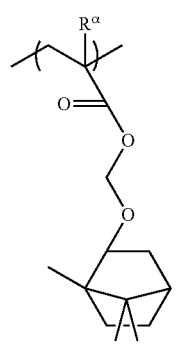 (a1-2-18)
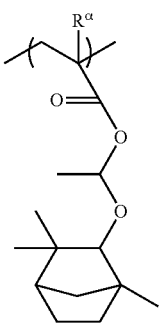 (a1-2-19)
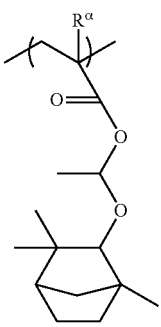 (a1-2-20)
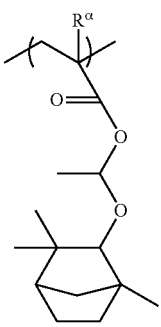 (a1-2-21)
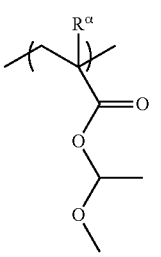 (a1-2-22)
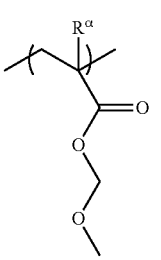 (a1-2-23)
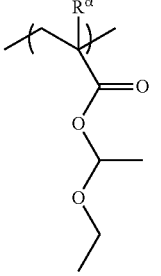

(a1-2-24)
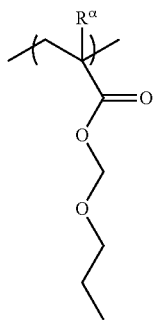
[Chemical formula 12]
(a1-3-1)
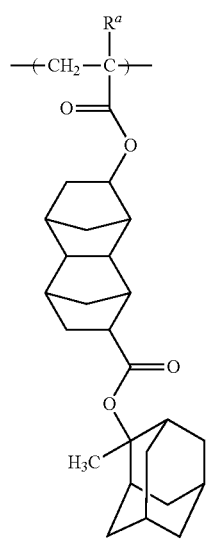
(a1-3-2)
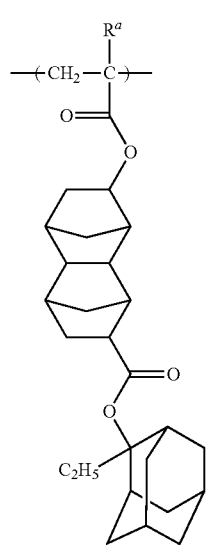
(a1-3-3)
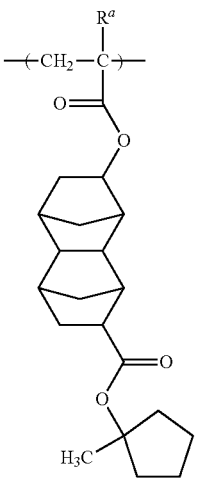
(a1-3-4)
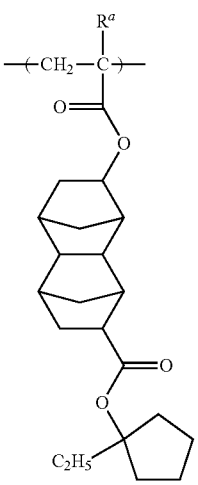
(a1-3-5)
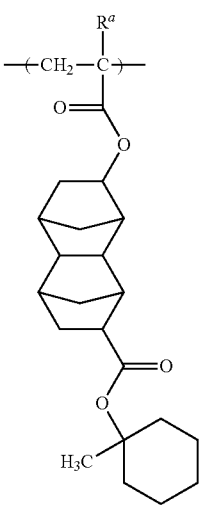

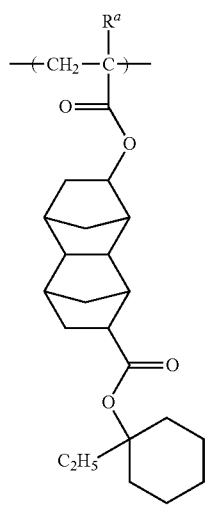
(a1-3-6)
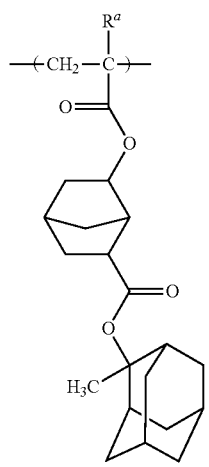
(a1-3-7)
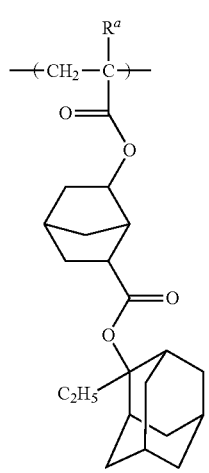
(a1-3-8)
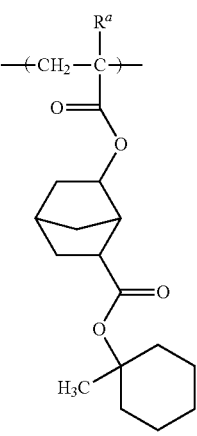
(a1-3-9)
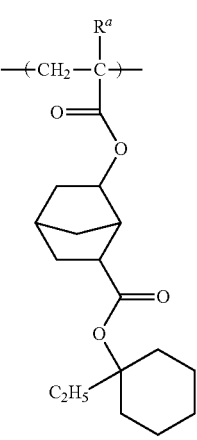
(a1-3-10)
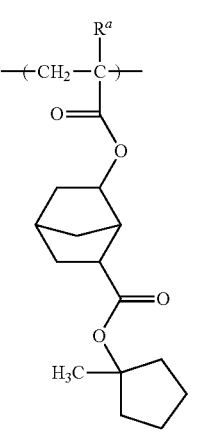
(a1-3-11)

(a1-3-12) 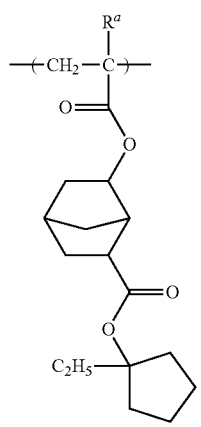
(a1-3-13) 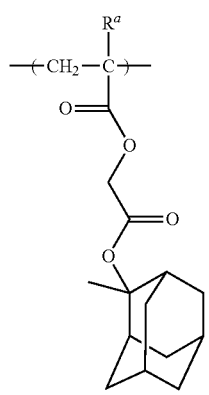
(a1-3-14) 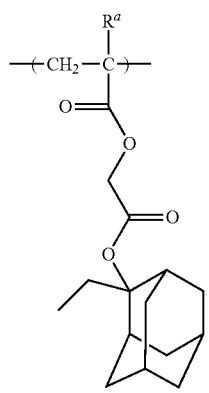
(a1-3-15) 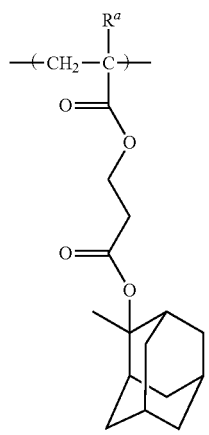
(a1-3-16) 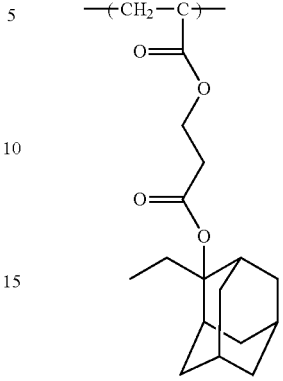
(a1-3-17) 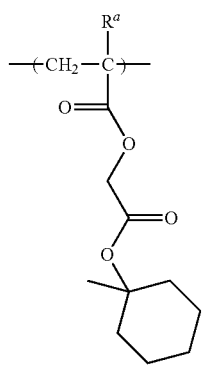
(a1-3-18) 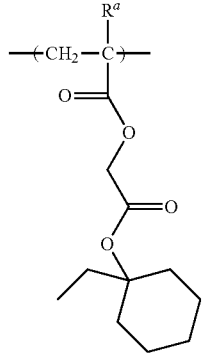
[Chemical formula 13]
(a1-3-19) 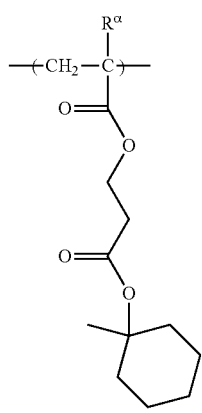

(a1-3-20)
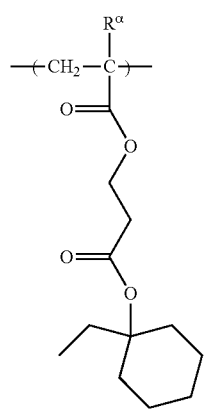
(a1-3-21)
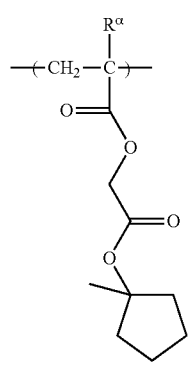
(a1-3-22)
(a1-3-23)
(a1-3-24)
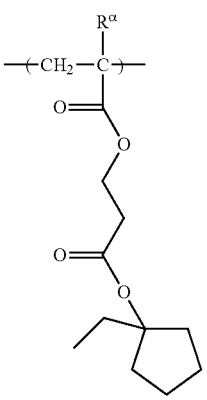
[Chemical formula 14]
(a1-3-25)
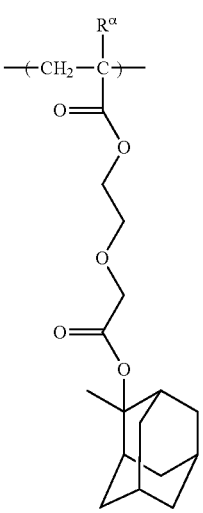
(a1-3-26)
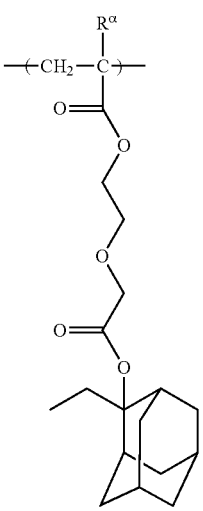

(a1-3-27) 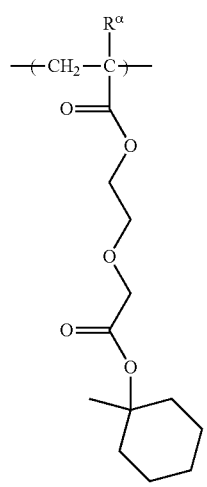
(a1-3-28) 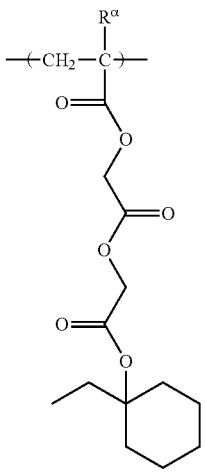
(a1-3-30) 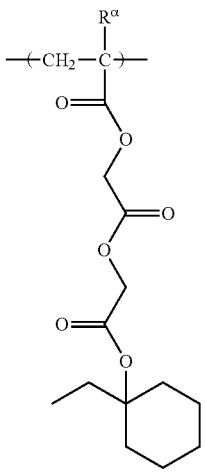
(a1-3-29) 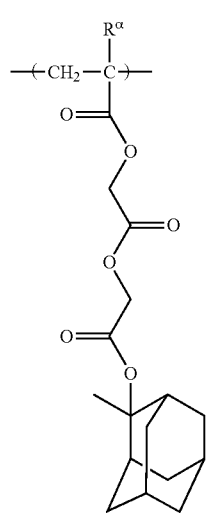
(a1-3-31) 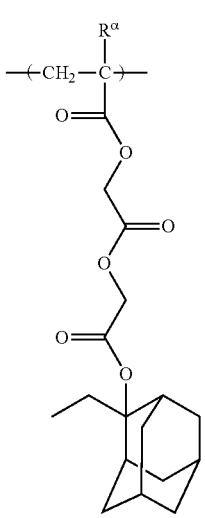
(a1-3-32) 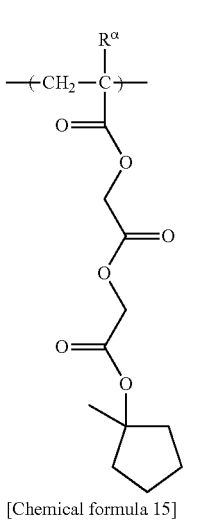
[Chemical formula 15]

(a1-4-1)
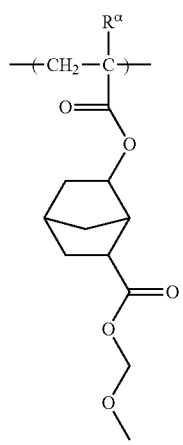
(a1-4-2)
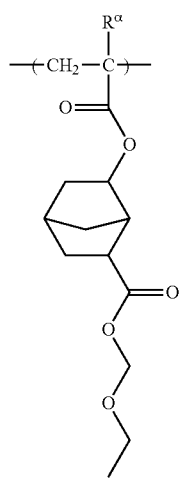
(a1-4-3)
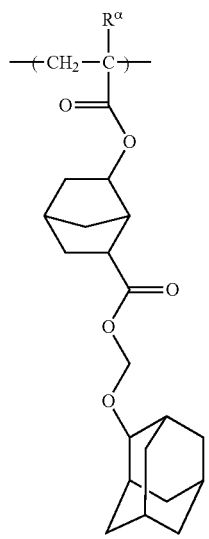
(a1-4-4)
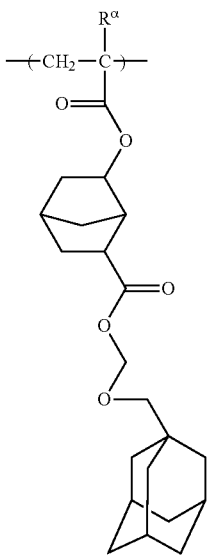
(a1-4-5)
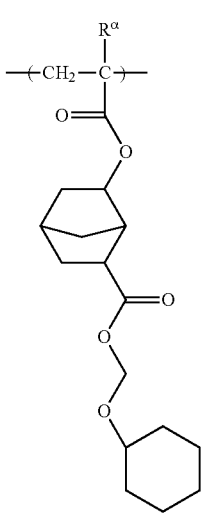
(a1-4-6)
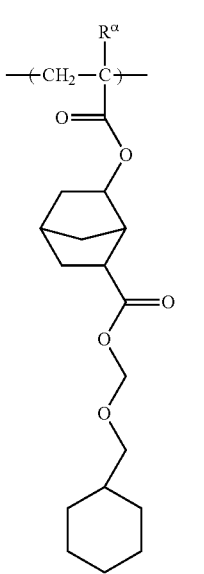

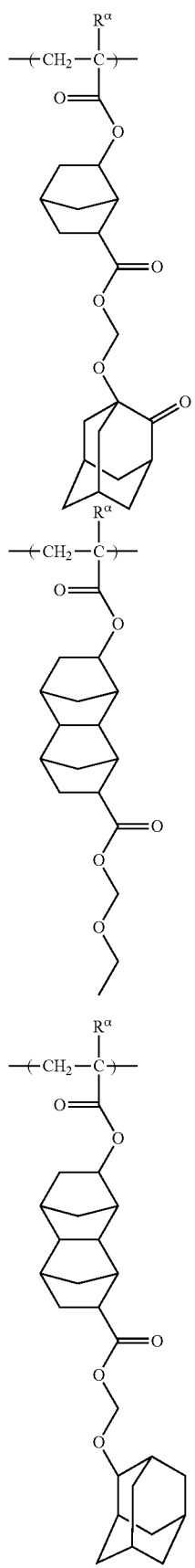
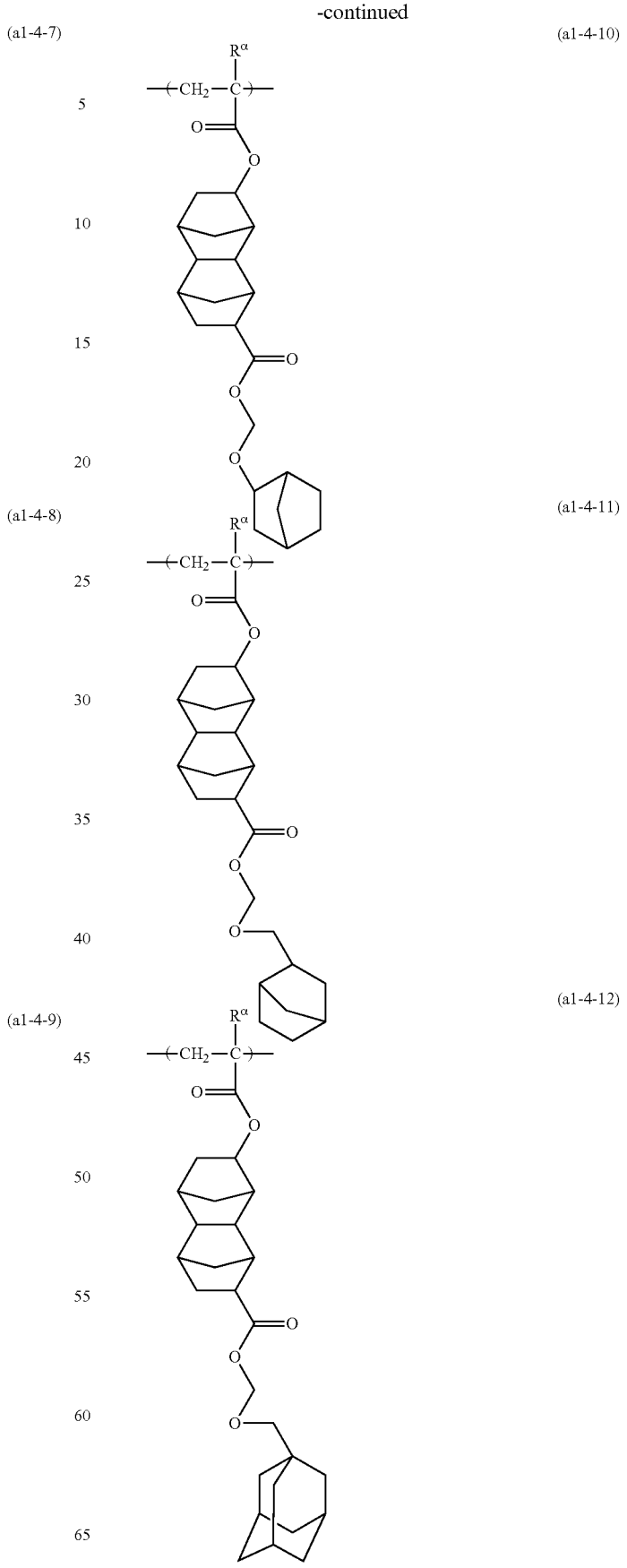

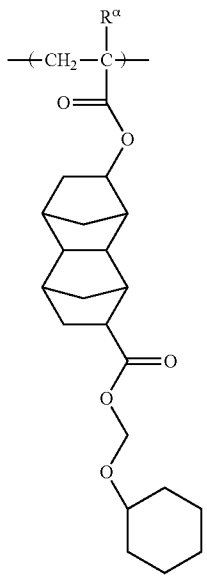
(a1-4-13)

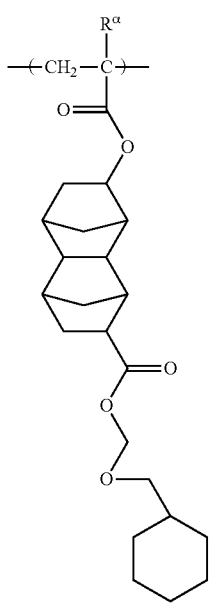
(a1-4-14)

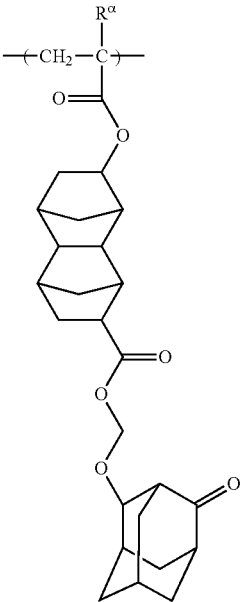
(a1-4-15)

As the structural unit (a1), one type of structural unit may be used alone, or two or more types of structural units may be used in combination.

Among these, structural units represented by general formula (a1-1) to (a1-3) are preferable, and more specifically, the use of at least one structural unit selected from the group consisting of structural units represented by formulas (a1-1-1) to (a1-1-4), formulas (a1-1-16) to (a1-1-17), formulas (a1-1-20) to (a1-1-23), formula (a1-1-26), formulas (a1-1-32) to (a1-1-33), and formulas (a1-3-25) to (a1-3-28) is more preferable.

Moreover, as the structural unit (a1), structural units represented by general formula (a1-1-01) shown below, which includes the structural units represented by formulas (a1-1-1) to (a1-1-3) and formula (a1-1-26), structural units represented by general formula (a1-1-02) shown below, which includes the structural units represented by formulas (a1-1-16) to (a1-1-17), formulas (a1-1-20) to (a1-1-23) and formulas (a1-1-32) to (a1-1-33), structural units represented by general formula (a1-3-01) shown below, which includes the structural units represented by formulas (a1-3-25) to (a1-3-26), and structural units represented by general formula (a1-3-02) shown below, which includes the structural units represented by formulas (a1-3-27) to (a1-3-28) are preferred.

[Chemical formula 16]

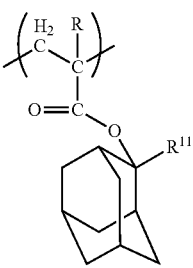
(a1-1-01)

In the formula, R represents a hydrogen atom, an alkyl group of 1 to 5 carbon atoms or a halogenated alkyl group of 1 to 5 carbon atoms, and represents an alkyl group of 1 to 5 carbon atoms.

[Chemical formula 17]

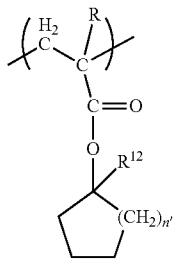

(a1-1-02)

In the formula, R represents a hydrogen atom, an alkyl group of 1 to 5 carbon atoms or a halogenated alkyl group of 1 to 5 carbon atoms, $R^{12}$ represents an alkyl group of 1 to 5 carbon atoms, and n' represents an integer of 1 to 6.

In general formula (a1-1-01), R represents a hydrogen atom, an alkyl group of 1 to 5 carbon atoms or a halogenated alkyl group of 1 to 5 carbon atoms.

The alkyl group of 1 to 5 carbon atoms for is the same as defined above for the alkyl group of 1 to 5 carbon atoms for R, and is preferably a methyl group or an ethyl group.

In general formula (a1-1-02), R is the same as defined above for R in general formula (a1-1-01).

The alkyl group of 1 to 5 carbon atoms for $R^{12}$ is the same as defined above for the alkyl group of 1 to 5 carbon atoms for R in general formula (a1-1-01), is preferably a methyl group or an ethyl group, and is most preferably an ethyl group.

n' is preferably 1 or 2

[Chemical formula 18]

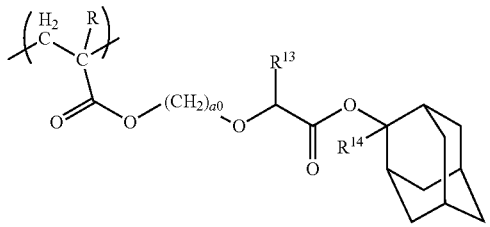

(a1-3-01)

In this formula, R represents a hydrogen atom, an alkyl group of 1 to 5 carbon atoms or a halogenated alkyl group of 1 to 5 carbon atoms, R" represents an alkyl group of 1 to 5 carbon atoms, $R^{13}$ represents a hydrogen atom or a methyl group, and a represents an integer of 1 to 10.

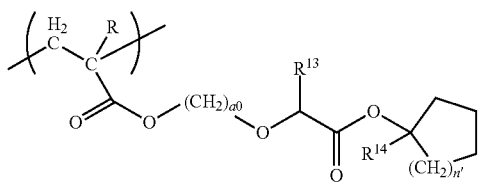

(a1-3-02)

In the formula, R represents a hydrogen atom, an alkyl group of 1 to 5 carbon atoms or a halogenated alkyl group of 1 to 5 carbon atoms, $R^{14}$ represents an alkyl group of 1 to 5 carbon atoms, $R^{13}$ represents a hydrogen atom or a methyl group, a0 represents an integer of 1 to 10, and n' represents an integer of 1 to 6.

In general formulas (a1-3-01) and (a1-3-02), R is the same as defined above for R in formula (a1-1-01).

$R^{13}$ is preferably a hydrogen atom.

The alkyl group of 1 to 5 carbon atoms for $R^{14}$ is the same as defined above for the alkyl group of 1 to 5 carbon atoms for R in formula (a1-1-01), and is preferably a methyl group or an ethyl group.

a0 is preferably an integer of 1 to 8, more preferably an integer of 2 to 5, and most preferably 2.

n' is the same as defined in formula (a1-1-02), and is preferably 1 or 2.

In the component (A1-1), the amount of the structural unit (a1), based on the combined total of all the structural units that constitute the component (A1-1), is preferably within a range from 10 to 80 mol %, more preferably from 20 to 70 mol %, and still more preferably from 25 to 60 mol %. By ensuring that the amount of the structural unit (a1) is at least as large as the lower limit of the above range, a pattern can be formed easily using a resist composition prepared from the component (A1-1), whereas by ensuring that the amount is not more than the upper limit of the above range, a good balance can be achieved with the other structural units.

(Structural Unit (a2))

The structural unit (a2) is a structural unit derived from an acrylate ester containing a lactone-containing cyclic group.

The term "lactone-containing cyclic group" refers to a cyclic group including a ring containing a —O—C(O)— structure (the lactone ring). This "lactone ring" is counted as the first ring, so that a lactone-containing cyclic group in which the only ring structure is the lactone ring is referred to as a monocyclic group, and groups that also contain other ring structures are described as polycyclic groups regardless of the structure of the other rings.

When the component (A1-1) is used for forming a resist film, the lactone-containing cyclic group of the structural unit (a2) is effective in improving the adhesion between the resist film and the substrate, and increasing the compatibility with developing solutions containing water.

There are no particular limitations on the structural unit (a2), and an arbitrary structural unit may be used.

Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical formula 20]

(a2-1)
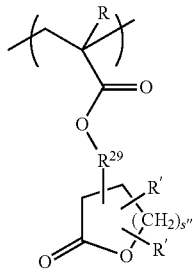

(a2-2)
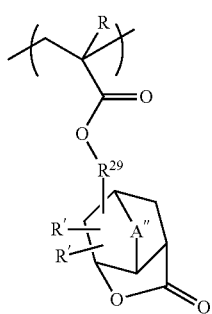

(a2-3)
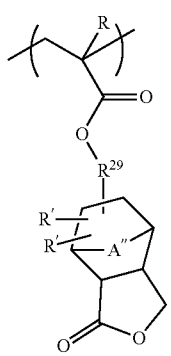

(a2-4)
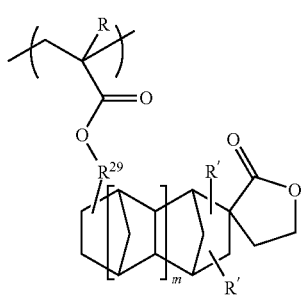

(a2-5)
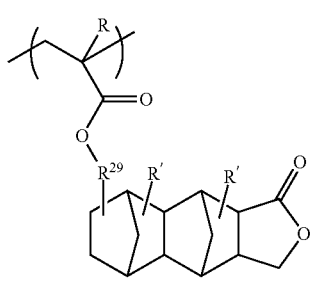

In the above formulas, R represents a hydrogen atom, a lower alkyl group or a halogenated lower alkyl group, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents a single bond or a divalent linking group, s" represents 0 or an integer of 1 or 2, A" represents an oxygen atom, a sulfur atom or an alkylene group of 1 to 5 carbon atoms which may contain an oxygen atom or a sulfur atom, and m represents an integer of 0 or 1.

In general formulas (a2-1) to (a2-5), R is the same as defined above for R in the structural unit (a1).

Examples of the alkyl group of 1 to 5 carbon atoms for R' include a methyl group, ethyl group, propyl group, n-butyl group or tert-butyl group.

Examples of the alkoxy group of 1 to 5 carbon atoms for R' include a methoxy group, ethoxy group, n-propoxy group, iso-propoxy group, n-butoxy group or tert-butoxy group.

In terms of industrial availability, R' is preferably a hydrogen atom.

R" preferably represents a hydrogen atom or a linear, branched or cyclic alkyl group of 1 to 15 carbon atoms.

In those cases where R" represents a linear or branched alkyl group, the alkyl group preferably has 1 to 10 carbon atoms, and more preferably 1 to 5 carbon atoms.

In those cases where R" represents a cyclic alkyl group, the cyclic alkyl group preferably has 3 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms or —O—, is more preferably an alkylene group of 1 to 5 carbon atoms, and is most preferably a methylene group.

$R^{29}$ represents a single bond or a divalent linking group. Examples of the divalent linking group include the same divalent linking groups as those described above for $Y^2$ in general formula (a1-0-2), and of these groups, an alkylene group, an ester linkage (—C(=O)—O—) or a combination thereof is preferred. The alkylene group for the divalent linking group for $R^{29}$ is preferably a linear or branched alkylene group. Specific examples include the same linear alkylene groups and branched alkylene groups as those listed above for the aliphatic hydrocarbon group for A within the description for $Y^2$.

s" is preferably an integer of 1 or 2.

Specific examples of the structural units represented by general formulas (a2-1) to (a2-5) are shown below.

In each of the following formulas, $R^\alpha$ represents a hydrogen atom, a methyl group or a trifluoromethyl group.

[Chemical formula 21]
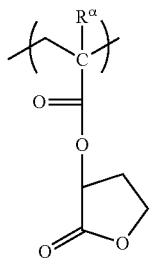 (a2-1-1)
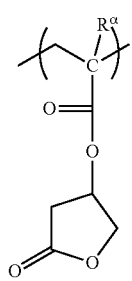 (a2-1-2)
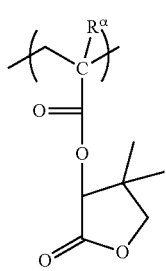 (a2-1-3)
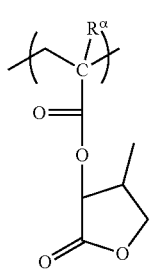 (a2-1-4)
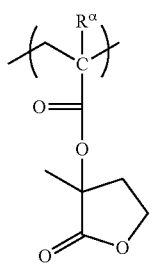 (a2-1-5)
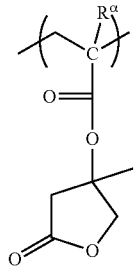 (a2-1-6)
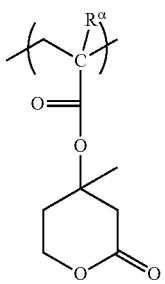 (a2-1-7)
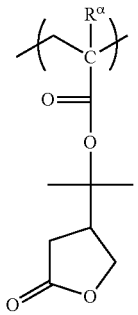 (a2-1-8)
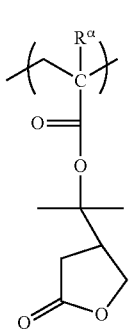 (a2-1-9)
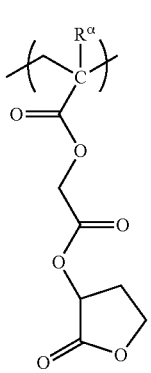 (a2-1-10)
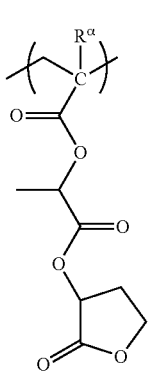 (a2-1-11)

(a2-1-12)
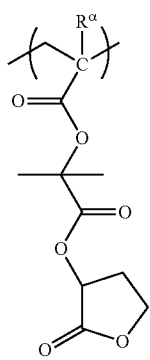
(a2-2-3)
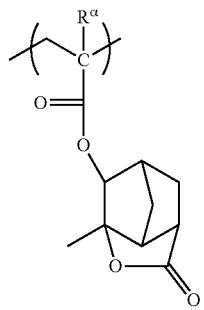
(a2-1-13)
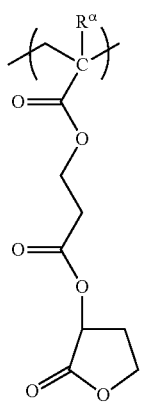
[Chemical formula 22]
(a2-2-1)
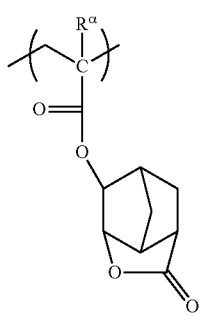
(a2-2-4)
(a2-2-5)
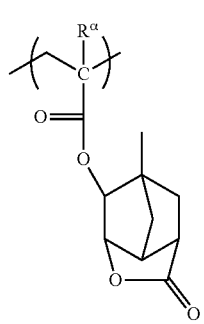
(a2-2-2)
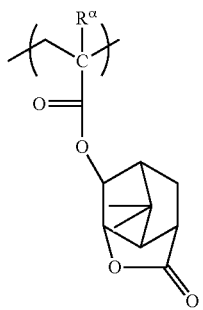
(a2-2-6)
(a2-2-7)
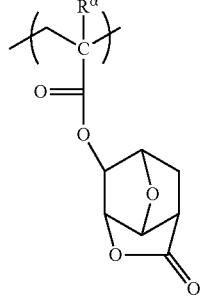

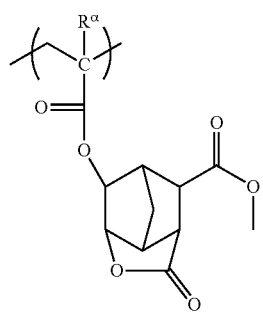
(a2-2-8)
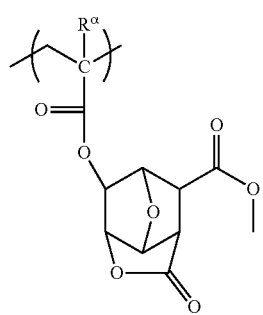
(a2-2-9)
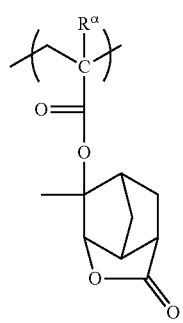
(a2-2-10)
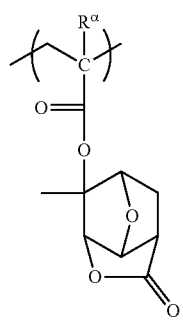
(a2-2-11)
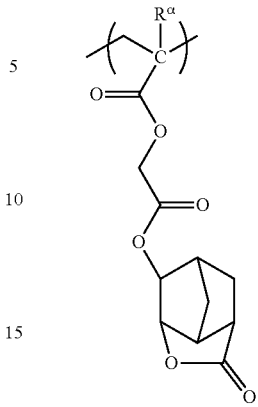
(a2-2-12)
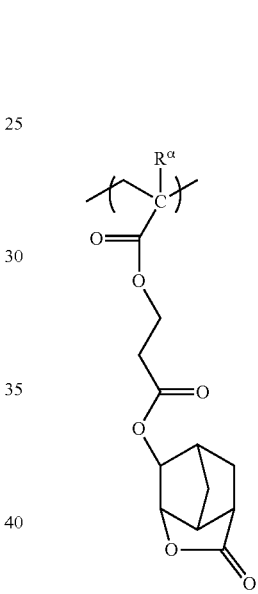
(a2-2-13)
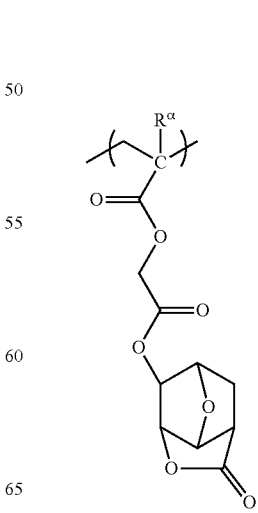
(a2-2-14)

(a2-2-15)
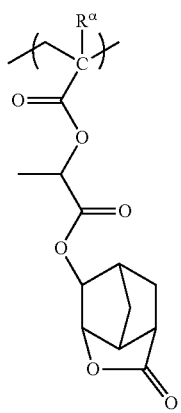
(a2-2-16)
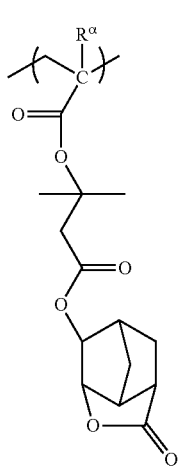
(a2-2-17)
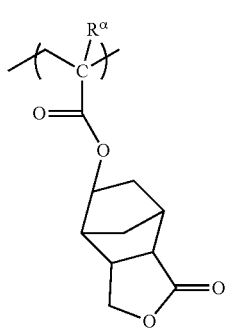
[Chemical formula 23]
(a2-3-1)
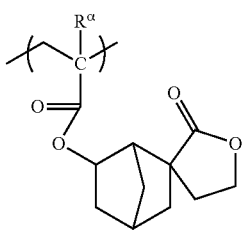
(a2-3-2)
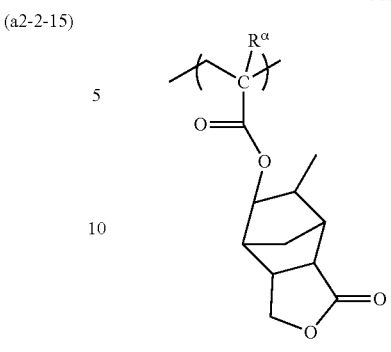
(a2-3-3)
(a2-3-4)
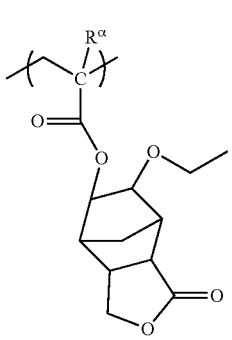
(a2-3-5)
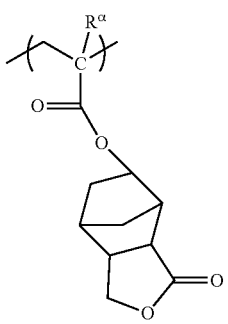
[Chemical formula 24]
(a2-4-1)

(a2-4-2) 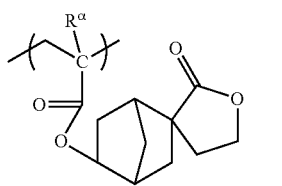
(a2-4-3) 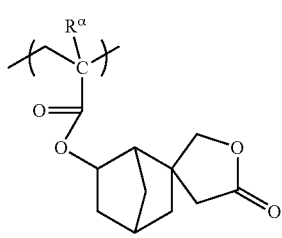
(a2-4-4) 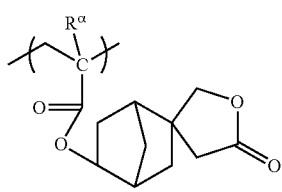
(a2-4-5) 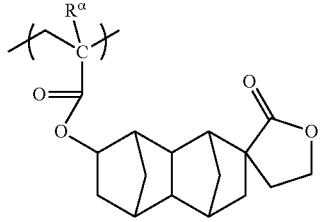
(a2-4-6) 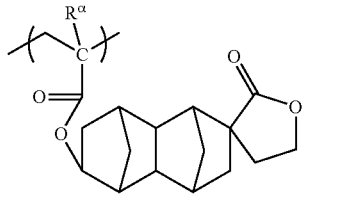
(a2-4-7) 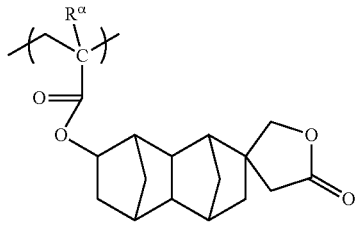
(a2-4-8) 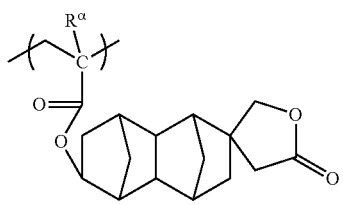
(a2-4-9) 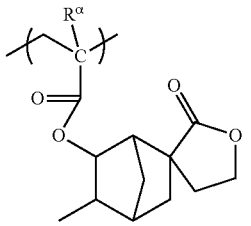
(a2-4-10) 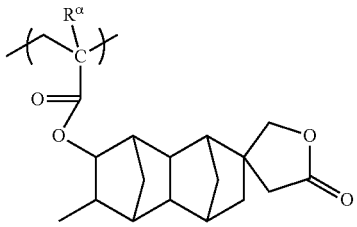
(a2-4-11) 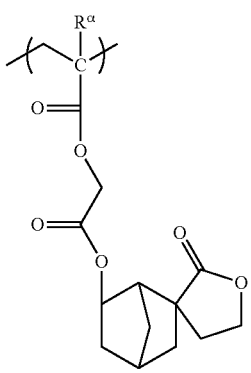
(a2-4-12) 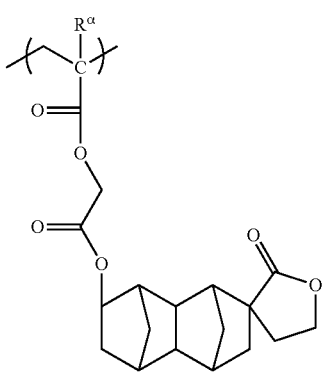
[Chemical formula 25]
(a2-5-1) 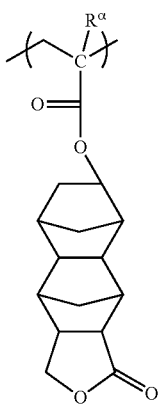

(a2-5-2) 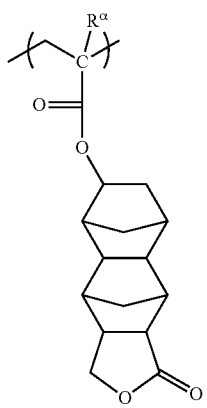

(a2-5-3) 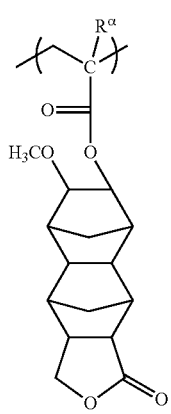

(a2-5-4) 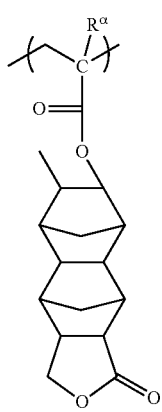

(a2-5-5) 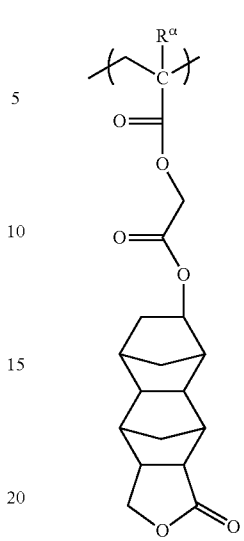

(a2-5-6) 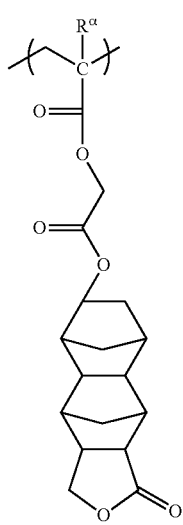

In the component (A1-1), as the structural unit (a2), one type of structural unit may be used alone, or two or more types of structural units may be used in combination.

The structural unit (a2) is preferably at least one structural unit selected from the group consisting of structural units represented by general formulas (a2-1) to (a2-5), and is more preferably at least one structural unit selected from the group consisting of structural units represented by general formulas (a2-1) to (a2-3). Of these, it is particularly preferable to use at least one structural unit selected from the group consisting of the structural units represented by chemical formulas (a2-1-1), (a2-1-2), (a2-2-1), (a2-2-7), (a2-3-1) and (a2-3-5).

The amount of the structural unit (a2) within the component (A1-1), based on the combined total of all the structural units that constitute the component (A1-1), is preferably within a range from 5 to 60 mol %, more preferably from 10 to 50 mol %, and most preferably from 20 to 50 mol %. By ensuring that this amount is at least as large as the lower limit of the above range, the effects generated by including the structural unit (a2) are obtained satisfactorily, whereas by ensuring that the amount is not more than the upper limit of the above range, a good balance can be achieved with the other structural units.

(Structural Unit (a3))

The structural unit (a3) is a structural unit (a3) derived from an acrylate ester containing a polar group-containing aliphatic hydrocarbon group.

By including the structural unit (a3) within the component (A1-1), the hydrophilicity of the component (A) is improved, and the compatibility of the component (A) with the developing solution is improved. As a result, the alkali solubility of the exposed portions improves, which contributes to an improvement in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and cyclic aliphatic hydrocarbon groups (cyclic groups). These cyclic groups may be either monocyclic or polycyclic, and can be selected appropriately from the multitude of groups that have been proposed for the resins of resist compositions designed for use with ArF excimer lasers. The cyclic group is preferably a polycyclic group, and preferably contains 7 to 30 carbon atoms.

Of the various possibilities, structural units derived from an acrylate ester that includes an aliphatic polycyclic group containing a hydroxyl group, cyano group, carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, groups in which two or more hydrogen atoms have been removed from norbornane, or groups in which two or more hydrogen atoms have been removed from tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1) and (a3-2) shown below are preferable.

[Chemical formula 26]

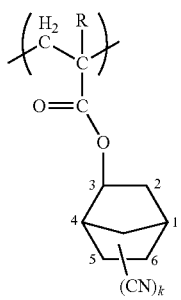

(a3-1)

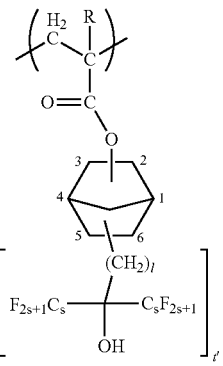

(a3-2)

In these formulas, R is the same as defined above for R within the structural unit (a1), k is an integer of 1 to 3, t' is an integer of 1 to 3, 1 is an integer of 1 to 5, and s is an integer of 1 to 3.

In formula (a3-1), k is preferably 1. The cyano group is preferably bonded to the 5th or 6th position of the norbornyl group.

In formula (a3-2), t' is preferably 1. 1 is preferably 1. s is preferably 1. Further, it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

As the structural unit (a3), one type of structural unit may be used alone, or two or more types may be used in combination.

The amount of the structural unit (a3) within the component (A1-1), based on the combined total of all the structural units that constitute the component (A1-1), is preferably within a range from 5 to 50 mol %, and more preferably from 10 to 40 mol %. By ensuring that this amount is at least as large as the lower limit of the above range, the effects generated by including the structural unit (a3) are obtained satisfactorily, whereas by ensuring that the amount is not more than the upper limit of the above range, a good balance can be achieved with the other structural units.

(Structural Unit (a4))

The structural unit (a4) is a structural unit (a4) derived from an acrylate ester containing a non-acid-dissociable aliphatic polycyclic group.

By including the structural unit (a4) within the component (A1-1), lithography properties such as the depth of focus (DOF), the resolution and the exposure margin (EL margin) can be improved. Further, as a result of an increase in the carbon density, the etching resistance also improves.

Examples of the polycyclic group include the same groups as those described above in connection with the aforementioned structural unit (a1), and any of the multitude of conventional polycyclic groups used within the resin component of resist compositions for use with ArF excimer lasers or KrF excimer lasers (and particularly for ArF excimer lasers) can be used.

In terms of factors such as industrial availability and the like, at least one polycyclic group selected from amongst a tricyclodecyl group, adamantyl group, tetracyclododecyl group, isobornyl group and norbornyl group is particularly desirable. These polycyclic groups may include a linear or branched alkyl group of 1 to 5 carbon atoms as a substituent.

Specific examples of the structural unit (a4) include units with structures represented by general formulas (a-4-1) to (a-4-5) shown below.

[Chemical formula 27]

(a4-1)
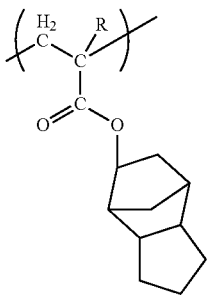

(a4-2)
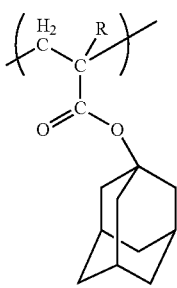

(a4-3)
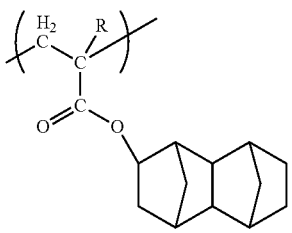

(a4-4)
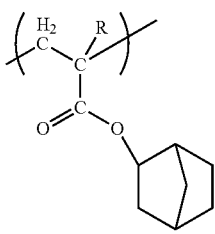

(a4-5)
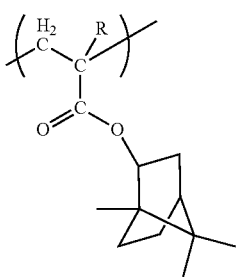

In the above formulas, R is the same as defined above for R within the structural unit (a1).

As the structural unit (a4), one type of structural unit may be used alone, or two or more types may be used in combination.

The amount of the structural unit (a4) within the component (A1-1), based on the combined total of all the structural units that constitute the component (A1-1), is preferably within a range from 1 to 30 mol %, and more preferably from 5 to 20 mol %. By ensuring that this amount is at least as large as the lower limit of the above range, the effects generated by including the structural unit (a4) are obtained satisfactorily, whereas by ensuring that the amount is not more than the upper limit of the above range, a good balance can be achieved with the other structural units.

(Structural Unit (a5))

The structural unit (a5) is a structural unit represented by general formula (a5-1) shown below.

[Chemical formula 28]

(a5-1)
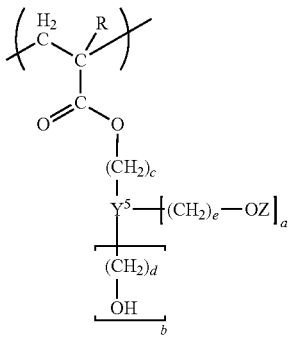

In formula (a5-1), R represents a hydrogen atom, an alkyl group of 1 to 5 carbon atoms or a halogenated alkyl group of 1 to 5 carbon atoms, $Y^5$ represents an aliphatic hydrocarbon group which may have a substituent, Z represents a monovalent organic group, a represents an integer of 1 to 3 and b represents an integer of 0 to 2, provided that a+b=1 to 3, and each of c, d and e independently represents an integer of 0 to 3.

In general formula (a5-1), R is the same as defined above for R within the structural unit (a1). Of the various possibilities, R is preferably a hydrogen atom or a methyl group.

In general formula (a5-1), $Y^5$ represents an aliphatic hydrocarbon group which may have a substituent.

The aliphatic hydrocarbon group for $Y^5$ may be a saturated aliphatic hydrocarbon group or an unsaturated aliphatic hydrocarbon group. Further, the aliphatic hydrocarbon group may be a linear, branched or cyclic group.

In the claims and description of the present invention, the term "aliphatic hydrocarbon group" describes a hydrocarbon group that has no aromaticity.

Further, the expression "may have a substituent" means that a portion of the carbon atoms that constitute the aliphatic hydrocarbon group may be substituted with a substituent containing a hetero atom, or some or all of the hydrogen atoms that constitute the aliphatic hydrocarbon group may be substituted with substituents containing a hetero atom.

There are no particular limitations on this "hetero atom" within $Y^5$, provided it is an atom other than a carbon atom or a hydrogen atom. Examples of the hetero atom include a halogen atom, oxygen atom, sulfur atom and nitrogen atom. Examples of the halogen atom include a fluorine atom, chlorine atom, iodine atom and bromine atom.

The substituent containing a hetero atom may consist solely of the hetero atom, or may be a group that includes the hetero atom together with a group or atom other than the hetero atom. Specific examples include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, these substituents may be included within the ring structure.

Examples of the substituent for substituting some or all of the hydrogen atoms of the aliphatic hydrocarbon group include an alkoxy group, halogen atom, halogenated alkyl group, hydroxyl group, oxygen atom (=O), cyano group and alkyl group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which some or all of the hydrogen atoms within an alkyl group of 1 to 5 carbon atoms (such as a methyl group, ethyl group, propyl group, n-butyl group or tert-butyl group) have been substituted with the aforementioned halogen atoms.

Examples of the alkyl group include alkyl groups of 1 to 5 carbon atoms (lower alkyl groups), and specific examples include a methyl group, ethyl group, propyl group, n-butyl group or tert-butyl group.

In those cases where $Y^5$ is a linear or branched aliphatic hydrocarbon group, the group preferably contains 1 to 10 carbon atoms, more preferably 1 to 5 carbon atoms, and most preferably 1 to 3 carbon atoms. Chain-like alkylene groups are particularly desirable.

In those cases where $Y^5$ represents a cyclic aliphatic hydrocarbon group (an aliphatic cyclic group), the basic ring structure of the aliphatic cyclic group exclusive of substituents (namely, the aliphatic ring) is not limited to rings constituted solely from carbon and hydrogen (not limited to hydrocarbon rings), and may include a hetero atom such as an oxygen atom within the structure of the ring (aliphatic ring). Further, the "hydrocarbon ring" may be either saturated or unsaturated, but is preferably saturated.

The aliphatic cyclic group maybe either a polycyclic group or a monocyclic group. Examples of the aliphatic cyclic group include groups in which two or more hydrogen atoms have been removed from a monocycloalkane or a polycycloalkane such as a bicycloalkane, tricycloalkane or tetracycloalkane, which may or may not be substituted with a lower alkyl group, a fluorine atom or a fluorinated alkyl group. Specific examples include groups in which two or more hydrogen atoms have been removed from a monocycloalkane such as cyclopentane or cyclohexane, or a polycycloalkane such as adamantane, norbornane, isobornane, tricyclodecane or tetracyclododecane.

Further examples of the aliphatic cyclic group include groups in which two or more hydrogen atoms have been removed from a tetrahydrofuran or tetrahydropyran which may or may not be substituted with a lower alkyl group, a fluorine atom or a fluorinated alkyl group.

The aliphatic cyclic group within the structural unit (a5) is preferably a polycyclic group, and of such groups, a group in which two or more hydrogen atoms have been removed from adamantane is particularly desirable.

In the above general formula (a5-1), Z represents a monovalent organic group.

In the description and claims of the present invention, the term "organic group" describes a group containing a carbon atom, which may also contain atoms other than a carbon atom (such as a hydrogen atom, oxygen atom, nitrogen atom, sulfur atom or halogen atom (such as a fluorine atom or chlorine atom)).

Examples of the organic group represented by Z include aliphatic hydrocarbon groups which may have a substituent, aromatic hydrocarbon groups which may have a substituent, and groups represented by a formula -$Q^5$-$R^5$ (wherein $Q^5$ represents a divalent linking group, and $R^5$ represents an aliphatic hydrocarbon group which may have a substituent or an aromatic hydrocarbon group which may have a substituent).

For the organic group represented by Z, examples of the aliphatic hydrocarbon group include linear, branched or cyclic saturated hydrocarbon groups of 1 to 20 carbon atoms, and linear or branched aliphatic unsaturated hydrocarbon groups of 2 to 20 carbon atoms.

Specific examples of the linear saturated hydrocarbon groups include a methyl group, ethyl group, propyl group, butyl group, pentyl group, hexyl group, heptyl group, octyl group, nonyl group or decyl group.

Specific examples of the branched saturated hydrocarbon groups include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The linear or branched alkyl groups listed above may have a substituent. Examples of the substituent include an alkoxy group, halogen atom, halogenated alkyl group, hydroxyl group, oxygen atom (=O), cyano group or carboxyl group or the like.

The alkoxy group used as the substituent within the linear or branched alkyl group is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom used as the substituent within the linear or branched alkyl group include a fluorine atom, chlorine atom, bromine atom or iodine atom, and a fluorine atom is preferable.

Examples of the halogenated alkyl group used as the substituent within the aromatic hydrocarbon groups include groups in which some or all of the hydrogen atoms within an alkyl group of 1 to 5 carbon atoms (such as a methyl group, ethyl group, propyl group, n-butyl group or tert-butyl group) have been substituted with the above halogen atoms.

The cyclic saturated hydrocarbon group may be a polycyclic group or monocyclic group, and examples include cyclic saturated hydrocarbon groups of 3 to 20 carbon atoms. Specific examples include groups in which one hydrogen atom has been removed from a monocycloalkane or a polycycloalkane such as a bicycloalkane, tricycloalkane or tetracycloalkane. Specific examples include groups in which one hydrogen atom has been removed from a monocycloalkane such as cyclopentane, cyclohexane, cycloheptane or cyclooctane, or a polycycloalkane such as adamantane, norbornane, isobornane, tricyclodecane or tetracyclododecane.

The cyclic alkyl groups listed above may have a substituent. For example, a portion of the carbon atoms that constitute a ring within the cyclic alkyl group may be substituted with a hetero atom, or a hydrogen atom bonded to a ring within the cyclic alkyl group may be substituted with a substituent.

Examples of the former case include groups in which one or more hydrogen atoms have been removed from a heterocycloalkane, which is a structure in which a portion of the carbon atoms that constitute a ring of an aforementioned monocycloalkane or polycycloalkane have been substituted with a hetero atom such as an oxygen atom, a sulfur atom or a nitrogen atom, Further, the structure of the ring may include an ester linkage (—C(=O)—O—). Specific examples include lactone-containing monocyclic groups in which one hydrogen atom has been removed from γ-butyrolactone, and lactone-containing polycyclic groups such as groups in which one hydrogen atom has been removed from a bicycloalkane, tricycloalkane or tetracycloalkane that includes a lactone ring.

In the latter case, examples of the substituent include the same substituents as those listed above for the substituent of the linear or branched alkyl groups, as well as alkyl groups of 1 to 5 carbon atoms.

Specific examples of the linear unsaturated hydrocarbon groups include a vinyl group, propenyl group (allyl group) and butynyl group.

Specific examples of the branched unsaturated hydrocarbon groups include a 1-methylpropenyl group and a 2-methylpropenyl group.

The linear or branched unsaturated hydrocarbon groups listed above may have a substituent. Examples of the substituent include the same substituents as those listed above for the linear or branched alkyl groups.

In the organic group of Z, an aromatic hydrocarbon group describes a hydrocarbon group having an aromatic ring. The aromatic hydrocarbon group preferably has 3 to 30 carbon atoms, more preferably 5 to 30, still more preferably 5 to 20, still more preferably 6 to 15, and most preferably 6 to 12 carbon atoms. This number of carbon atoms does not include any carbon atoms within substituents.

The aromatic organic group may include an aromatic hydrocarbon ring in which the ring skeleton of the aromatic ring is composed only of carbon atoms, or an aromatic heterocycle in which the ring skeleton of the aromatic ring also includes a hetero atom as well as carbon atoms.

Specific examples of the aromatic hydrocarbon group include aryl groups, which are groups in which one hydrogen atom has been removed from an aromatic hydrocarbon ring, such as a phenyl group, biphenyl group, fluorenyl group, naphthyl group, anthryl group or phenanthryl group, heteroaryl groups in which some of the carbon atoms constituting the ring within an aforementioned aryl group have been substituted with a hetero atom such as an oxygen atom, a sulfur atom or a nitrogen atom, and arylalkyl groups such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 to 2 carbon atoms, and most preferably 1 carbon atom.

The aromatic hydrocarbon group may have a substituent. For example, some of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which some of the carbon atoms constituting the ring within an aforementioned aryl group have been substituted with a hetero atom such as an oxygen atom, a sulfur atom or a nitrogen atom, and heteroarylalkyl groups in which some of the carbon atoms constituting the aromatic hydrocarbon ring within an aforementioned arylalkyl group have been substituted with an aforementioned hetero atom.

In the latter case, examples of the substituent for the aromatic group include an alkyl group, alkoxy group, halogen atom, halogenated alkyl group, hydroxyl group, oxygen atom (=O), or acetyl group or the like.

Examples of the alkyl groups, alkoxy groups, halogen atoms and halogenated alkyl groups that may be used as the substituent for the aromatic group include the same groups as those listed above for the substituent of the linear or branched alkyl groups, as well as alkyl groups of 1 to 5 carbon atoms.

In the group represented by the aforementioned formula -$Q^5$-$R^5$, $Q^5$ represents a divalent linking group, and $R^5$ represents an aliphatic hydrocarbon group which may have a substituent or an aromatic hydrocarbon group which may have a substituent.

Examples of the divalent linking group for $Q^5$ include the same groups as those listed above within the description for $Y^2$ in formula (a1-0-2).

Examples of $R^5$ include the same groups as those listed above within the description of the aliphatic hydrocarbon groups and aromatic hydrocarbon groups for Z.

Of the above possibilities, in terms of improving the solubility within organic solvents when the component (A) is used to form a resist composition, the organic group for Z is preferably a group that includes an aliphatic hydrocarbon group which may have a substituent, and more preferably a group represented by a formula -$Q^5$-$R^{8'}$ (wherein $Q^5$ represents a divalent linking group and $R^{8'}$ represents an aliphatic hydrocarbon group which may have a substituent), and specific examples of preferred groups include tertiary alkyl group-containing groups and alkoxyalkyl groups.

(Tertiary Alkyl Group-Containing Group)

In the description and claims of the present invention, the term "tertiary alkyl group" describes an alkyl group containing a tertiary carbon atom. As mentioned above, the term "alkyl group" describes monovalent saturated hydrocarbon groups, and includes chain-like (linear or branched) alkyl groups as well as alkyl groups having a cyclic structure.

The "tertiary alkyl group-containing group" describes a group containing a tertiary alkyl group within its structure. The tertiary alkyl group-containing group may be composed solely of the tertiary alkyl group, or may be composed of the tertiary alkyl group and other atom(s) or group(s) besides the tertiary alkyl group.

Examples of these "other atom(s) or group(s) besides the tertiary alkyl group" that may constitute the tertiary alkyl group-containing group together with the tertiary alkyl group include a carbonyloxy group, carbonyl group, alkylene group or oxygen atom.

Examples of the tertiary alkyl group-containing group for Z include tertiary alkyl group-containing groups which do not contain a cyclic structure, and tertiary alkyl group-containing groups which contain a cyclic structure.

A tertiary alkyl group-containing group which does not contain a cyclic structure contains a branched-chain tertiary alkyl group as the tertiary alkyl group, and includes no cyclic structure within the group structure.

Examples of these branched-chain tertiary alkyl groups include the groups represented by general formula (I) shown below.

[Chemical formula 29]

(I)

In formula (I), each of $R^{21}$ to $R^{23}$ independently represents a linear or branched alkyl group. These alkyl groups preferably contain 1 to 5 carbon atoms, and more preferably 1 to 3 carbon atoms.

Further, the total number of carbon atoms within the group represented by general formula (I) is preferably from 4 to 7 carbon atoms, more preferably from 4 to 6 carbon atoms, and most preferably 4 or 5 carbon atoms.

Specific examples of the group represented by general formula (I) include a tert-butyl group and tert-pentyl group, and a tert-butyl group is particularly desirable.

Examples of the tertiary alkyl group-containing groups which do not contain a cyclic structure include the branched-chain tertiary alkyl groups described above, tertiary alkyl group-containing chain-like alkyl groups in which an aforementioned branched-chain tertiary alkyl group is bonded to a linear or branched alkylene group, tertiary alkyloxycarbonyl groups containing an aforementioned branched-chain tertiary alkyl group as the tertiary alkyl group, and tertiary alkyloxycarbonylalkyl groups containing an aforementioned branched-chain tertiary alkyl group as the tertiary alkyl group.

The alkylene group in the tertiary alkyl group-containing chain-like alkyl group is preferably an alkylene group of 1 to 5 carbon atoms, more preferably an alkylene group of 1 to 4 carbon atoms, and still more preferably an alkylene group of 1 or 2 carbon atoms.

Examples of the chain-like tertiary alkyloxycarbonyl groups include groups represented by general formula (II) shown below. In formula (II), $R^{21}$ to $R^{23}$ are the same as defined above for $R^{21}$ to $R^{23}$ in formula (I). As this chain-like tertiary alkyloxycarbonyl group, a tert-butyloxycarbonyl group (t-boc) or tert-pentyloxycarbonyl group is preferred.

[Chemical formula 30]

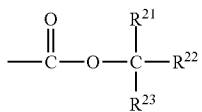

(II)

Examples of the chain-like tertiary alkyloxycarbonylalkyl groups include groups represented by general formula (III) shown below. In formula (III), $R^{21}$ to $R^{23}$ are the same as defined above for $R^{21}$ to $R^{23}$ in formula (I). f represents an integer of 1 to 3, and is preferably 1 or 2. As this chain-like tertiary alkyloxycarbonylalkyl group, a tert-butyloxycarbonylmethyl group or tert-butyloxycarbonylethyl group is preferred.

Of the above groups, the tertiary alkyl group-containing group which does not contain a cyclic structure is preferably a tertiary alkyloxycarbonyl group or a tertiary alkyloxycarbonylalkyl group, is more preferably a tertiary alkyloxycarbonyl group, and is most preferably a tert-butyloxycarbonyl group (t-boc).

[Chemical formula 31]

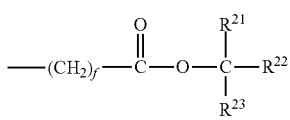

(III)

A tertiary alkyl group-containing group which contains a cyclic structure describes a group that includes a tertiary carbon atom and a cyclic structure within the group structure.

In the tertiary alkyl group-containing group which contains a cyclic structure, the cyclic structure preferably contains 4 to 12 carbon atoms, more preferably 5 to 10 carbon atoms, and most preferably 6 to 10 carbon atoms within the ring. Examples of the cyclic structure include groups in which one or more hydrogen atoms have been removed from a monocycloalkane or a polycycloalkane such as a bicycloalkane, tricycloalkane or tetracycloalkane. Preferable examples include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Examples of the tertiary alkyl group-containing group which contains a cyclic structure include groups having the following group (1) or (2) as the tertiary alkyl group.

(1) A group in which a linear or branched alkyl group is bonded to a carbon atom that constitutes part of the ring of a cyclic alkyl group (cycloalkyl group), so that the carbon atom becomes a tertiary carbon atom (2) A group in which an alkylene group (branched alkylene group) having a tertiary carbon atom is bonded to a carbon atom that constitutes part of the ring of a cycloalkyl group.

In the above group (1), the linear or branched alkyl group preferably has 1 to 5 carbon atoms, more preferably 1 to 4 carbon atoms, and most preferably 1 to 3 carbon atoms.

Examples of the group (1) include a 2-methyl-2-adamantyl group, 2-ethyl-2-adamantyl group, 1-methyl-1-cycloalkyl group or 1-ethyl-1-cycloalkyl group.

In the above group (2), the cycloalkyl group having the branched alkylene group bonded thereto may have a substituent. Examples of the substituent include a fluorine atom, a fluorinated alkyl group of 1 to 5 carbon atoms, and an oxygen atom (=O).

Examples of the group (2) include groups represented by chemical formula (IV) shown below.

[Chemical formula 32]

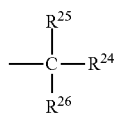

(IV)

In formula (IV), $R^{24}$ represents a cycloalkyl group which may or may not have a substituent. Examples of the substituent which the cycloalkyl group may have include a fluorine atom, a fluorinated alkyl group of 1 to 5 carbon atoms, and an oxygen atom (=O).

Each of $R^{25}$ and $R^{26}$ independently represents a linear or branched alkyl group, and examples of this alkyl group include the same alkyl groups as those listed above for $R^{21}$ to $R^{23}$ in formula (I).

(Alkoxyalkyl Group)

Examples of the alkoxyalkyl group for Z include groups represented by general formula (V) shown below.

[Chemical formula 33]

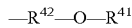

(v)

In formula (V), $R^{41}$ represents a linear, branched or cyclic alkyl group.

When $R^{41}$ represents a linear or branched alkyl group, it is preferably an alkyl group of 1 to 5 carbon atoms, more preferably an ethyl group or methyl group, and is most preferably an ethyl group.

When $R^{41}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, or a polycycloalkane such as adamantane, norbornane, isobornane, tricyclodecane or tetracyclododecane. Of these, groups in which one or more hydrogen atoms have been removed from adamantane are preferable.

$R^{42}$ represents a linear or branched alkylene group. The alkylene group preferably has 1 to 5 carbon atoms, more preferably 1 to 3 carbon atoms, and most preferably 1 or 2 carbon atoms.

The alkoxyalkyl group for Z is preferably a group represented by general formula (VI) shown below.

[Chemical formula 34]

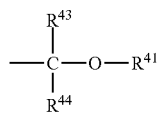
(VI)

In formula (VI), $R^{41}$ is the same as defined above for $R^{41}$ in formula (V), and each of $R^{43}$ and $R^{44}$ independently represents a linear or branched alkyl group, or a hydrogen atom.

For $R^{43}$ and $R^{44}$, the alkyl group preferably has 1 to 15 carbon atoms, may be either linear or branched, is preferably an ethyl group or methyl group, and is most preferably a methyl group. It is particularly desirable that one of $R^{43}$ and $R^{44}$ is a hydrogen atom, and the other is a methyl group.

Of the above possibilities, Z is preferably a tertiary alkyl group-containing group, is more preferably a group represented by general formula (II), and is most preferably a tert-butyloxycarbonyl group (t-boc).

In the above general formula (a5-1), a represents an integer of 1 to 3 and b represents an integer of 0 to 2, provided that a+b=1 to 3.

a is preferably 1.

b is preferably 0.

a+b is preferably 1.

c represents an integer of 0 to 3, is preferably 0 or 1, and is most preferably 0.

d represents an integer of 0 to 3, is preferably 0 or 1, and is most preferably 0.

e represents an integer of 0 to 3, is preferably 0 or 1, and is most preferably 0.

As the structural unit (a5), structural units represented by general formula (a5-1-1) and (a5-1-2) shown below are particularly desirable.

[Chemical formula 35]

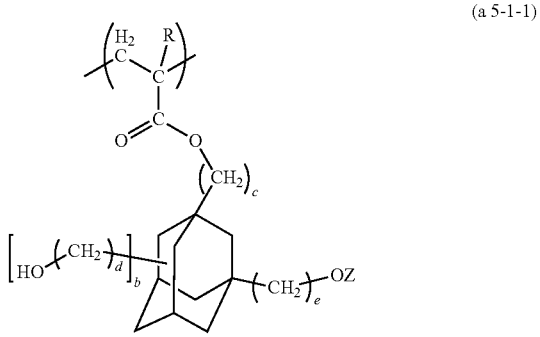
(a5-1-1)

In this formula, R, Z, b, c, d and e are the same as defined above in formula (a5-1).

[Chemical formula 36]

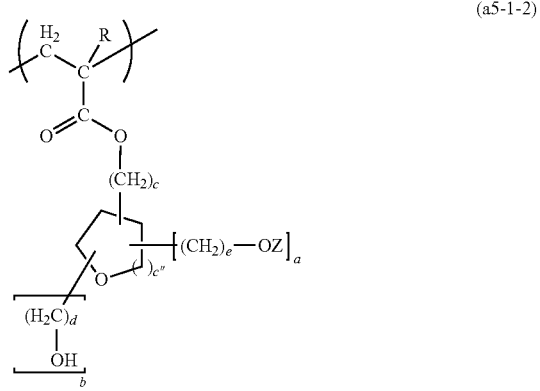
(a5-1-2)

In this formula, R, Z, a, b, c, d and e are the same as defined above in formula (a5-1), and c" represents an integer of 1 to 3.

In formula (a5-1-2), c" represents an integer of 1 to 3, is preferably 1 or 2, and is most preferably 1.

In those cases where c is 0 in formula (a5-1-2), the oxygen atom at the terminal of the carbonyloxy group (—C(═O)—O—) of the acrylate ester is preferably not bonded to a carbon atom that is bonded to the oxygen atom within the ring structure. In other words, when c is 0, it is preferable that two or more carbon atoms exist between the terminal oxygen atom and the oxygen atom within the ring structure (thus excluding the case where the number of carbon atoms is 1 (resulting in an acetal bond)).

The monomer that generates the structural unit (a5) can be synthesized, for example, by using a conventional technique to protect some or all of the hydroxyl groups of a compound represented by general formula (a5-1') shown below (namely, an acrylate ester containing an aliphatic cyclic group having 1 to 3 alcoholic hydroxyl groups) with an organic group (and preferably a tertiary alkyl group-containing group or an alkoxyalkyl group).

[Chemical formula 37]

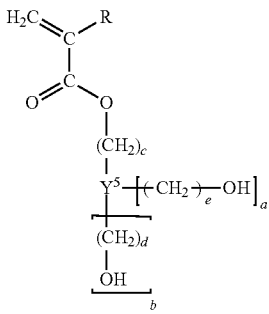

(a 5-1')

In the formula, R, $Y^5$, a, b, c, d and e are the same as defined above in formula (a5-1).

As the structural unit (a5), one type of structural unit may be used alone, or two or more types may be used in combination.

The amount of the structural unit (a5) within the component (A1-1), based on the combined total of all the structural units that constitute the component (A1-1), is preferably within a range from 1 to 45 mol %, more preferably from 5 to 45 mol %, still more preferably from 5 to 40 mol %, and most preferably from 5 to 35 mol %. By ensuring that this amount is at least as large as the lower limit of the above range, the solubility of the component (A1-1) within organic solvents can be improved, whereas by ensuring that the amount is not more than the upper limit of the above range, a good balance can be achieved with the other structural units.

(Structural Unit (a6))

The structural unit (a6) is a structural unit represented by general formula (a6-1) shown below.

[Chemical formula 38]

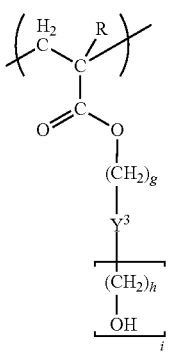

(a6-1)

In formula (a6-1), R represents a hydrogen atom, an alkyl group of 1 to 5 carbon atoms or a halogenated alkyl group of 1 to 5 carbon atoms, $Y^3$ represents an alkylene group or an aliphatic cyclic group, each of g and h independently represents an integer of 0 to 3, and i represents an integer of 1 to 3.

In general formula (a6-1), R represents a hydrogen atom, an alkyl group of 1 to 5 carbon atoms or a halogenated alkyl group of 1 to 5 carbon atoms. This R is the same as R defined above in the structural unit (a1). R is preferably a hydrogen atom or a methyl group.

$Y^3$ represents an alkylene group or an aliphatic cyclic group.

Examples of the alkylene group for $Y^3$ include alkylene groups of 1 to 10 carbon atoms.

Examples of the aliphatic cyclic group for $Y^3$ include the same aliphatic cyclic groups as those listed above in the description of $Y^5$ in formula (a5-1). The basic ring (the aliphatic ring) of $Y^3$ is preferably the same as that of $Y^5$.

g represents an integer of 0 to 3, is preferably 0 or 1, and is most preferably 0.

h represents an integer of 0 to 3, is preferably 0 or 1, and is most preferably 0.

i represents an integer of 1 to 3, and is most preferably 1.

As the structural unit (a6), structural units represented by general formula (a6-1-1) shown below are preferred, and of these, structural units in which one of the i number of —$(CH_2)_h$—OH groups is bonded to the 3rd position of the 1-adamantyl group are preferred.

[Chemical formula 39]

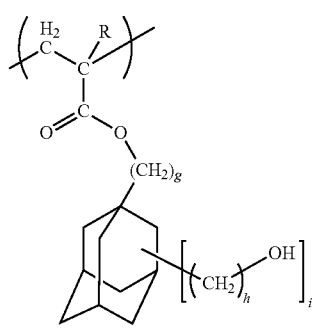

(a6-1-1)

In the formula, R, g, h and i are the same as defined above in formula (a6-1).

As the structural unit (a6), one type of structural unit may be used alone, or two or more types may be used in combination.

The amount of the structural unit (a6) within the component (A1-1), based on the combined total of all the structural units that constitute the component (A1-1), is preferably within a range from 1 to 40 mol %, more preferably from 1 to 35 mol %, still more preferably from 5 to 30 mol %, and most preferably from 5 to 25 mol %. By ensuring that this amount is at least as large as the lower limit of the above range, a resist pattern of favorable shape having a cross-sectional shape with superior rectangularity can be formed, whereas by ensuring that the amount is not more than the upper limit of the above range, a good balance can be achieved with the other structural units.

(Other Structural Units)

The component (A1-1) may also include other structural units besides the above structural units (a1) to (a6), provided the inclusion of these other structural units does not impair the effects of the present invention.

There are no particular limitations on these other structural units, and any other structural unit which cannot be classified as one of the above structural units (a1) to (a6) can be used without any particular limitations. Any of the multitude of conventional structural units used within resist resins for ArF excimer lasers or KrF excimer lasers or the like can be used.

As the other structural unit, a structural unit derived from a compound that is capable of undergoing copolymerization with the compounds that yield the above structural units (a1) to (a6) is preferred.

In the resist composition of the present invention, the component (A1-1) is preferably a polymeric compound that includes the structural unit (a1).

Examples of this type of component (A1-1) include copolymers composed of the structural units (a1), (a3) and (a6), copolymers composed of the structural units (a1), (a2), (a4) and (a6), and copolymers composed of the structural units (a1), (a5) and (a6).

Within the component (A1), the component (A1-1) may be either a single polymeric compound, or a combination of two or more polymeric compounds.

In the present invention, the component (A1-1) is preferably a polymeric compound containing the types of structural unit combinations shown below.

[Chemical formula 40]

Polymeric compound (A1-1-1)

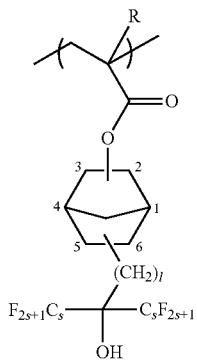

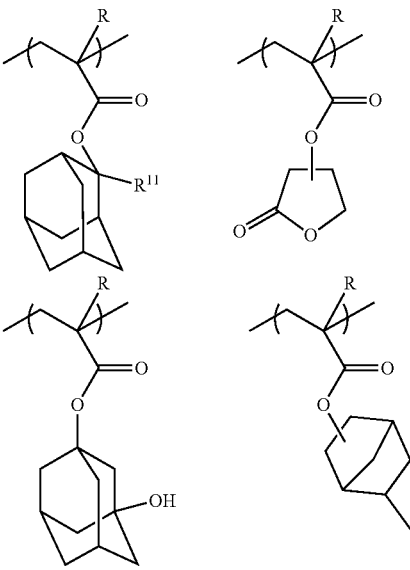

[Chemical formula 41]

Polymeric compound (A1-1-2)

In the above formula, R is the same as defined above for R within the structural unit (a1), wherein the plurality of R groups may be the same or different, is the same as defined above for $R^{11}$ in general formula (a1-1-01), and l and s are the same as defined above for l and s within formula (a3-2).

In formula (A1-1-1), R is preferably a hydrogen atom or an alkyl group of 1 to 5 carbon atoms, and is more preferably a hydrogen atom or a methyl group.

$R^{11}$ is preferably a methyl group or an ethyl group, and is most preferably an ethyl group.

l is preferably 1, and s is preferably 1. The fluorinated alkyl alcohol is preferably bonded to the 5th or 6th position of the norbornyl group.

In the above formula, R is the same as defined above for R within the structural unit (a1), wherein the plurality of R groups may be the same or different, and is the same as defined above for $R^{11}$ in formula (a1-1-01).

In formula (A1-1-2), R is preferably a hydrogen atom or an alkyl group of 1 to 5 carbon atoms, and is more preferably a hydrogen atom or a methyl group.

$R^{11}$ is preferably a methyl group or an ethyl group, and is most preferably a methyl group.

[Chemical formula 42]

Polymeric compound (A1-1-3)

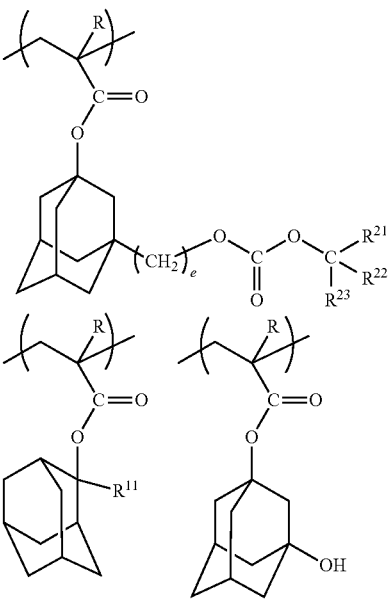

In the above formula, R is the same as defined above for R within the structural unit (a1), wherein the plurality of R groups may be the same or different, is the same as defined above for $R^{11}$ in formula (a1-1-01), each of $R^{21}$ to $R^{23}$ is the same as defined above for $R^{21}$ to $R^{23}$ in formula (I), and e is the same as defined above for e in formula (a5-1).

In formula (A1-1-3), R is preferably a hydrogen atom or an alkyl group of 1 to 5 carbon atoms, and is more preferably a hydrogen atom or a methyl group.

$R^{11}$ is preferably a methyl group or an ethyl group, and is most preferably an ethyl group.

Each of $R^{21}$ to $R^{23}$ preferably independently represents a linear or branched alkyl group of 1 to 5 carbon atoms, more preferably a linear or branched alkyl group of 1 to 3 carbon atoms, and still more preferably a methyl group, and polymeric compounds in which $R^{21}$ to $R^{23}$ are all methyl groups (yielding a tert-butyl group) are particularly desirable.

The component (A1-1) can be obtained, for example, by a conventional radical polymerization or the like of the monomers corresponding with each of the structural units, using a radical polymerization initiator such as azobisisobutyronitrile (AIBN).

Furthermore, in the component (A1-1), by using a chain transfer agent such as $HS-CH_2-CH_2-CH_2-C(CF_3)_2-OH$ during the above polymerization, a $-C(CF_3)_2-OH$ group can be introduced at the terminals of the component (A1-1). Such a copolymer having an introduced hydroxyalkyl group in which some of the hydrogen atoms of the alkyl group are substituted with fluorine atoms is effective in reducing developing defects and LER (line edge roughness:unevenness of the side walls of a line pattern).

The weight average molecular weight (Mw) (the polystyrene equivalent value determined by gel permeation chromatography) of the component (A1-1) is not particularly limited, but is preferably within a range from 1,000 to 50,000, more preferably from 1,500 to 30,000, and most preferably from 2,000 to 20,000. Provided the weight average molecular weight is not more than the upper limit of the above-mentioned range, the component (A1-1) exhibits satisfactory solubility in a resist solvent when used as a resist, whereas provided the weight average molecular weight is at least as large as the lower limit of the above-mentioned range, the dry etching resistance and cross-sectional shape of the resist pattern can be improved.

Further, the dispersity (Mw/Mn) of the component (A1-1) is preferably within a range from 1.0 to 5.0, more preferably from 1.0 to 3.0, and most preferably from 1.2 to 2.5. Here, "Mn" is the number average molecular weight.

[Component (A1-2)]

As the component (A1-2), it is preferable to use a compound that has a molecular weight of at least 500 but less than 2,000, contains a hydrophilic group, and also contains an acid-dissociable, dissolution-inhibiting group such as those listed above in connection with the component (A1-1). Examples of the component (A1-2) include compounds containing a plurality of phenol skeletons in which a portion of the hydroxyl group hydrogen atoms have been substituted with the aforementioned acid-dissociable, dissolution-inhibiting groups.

Examples of the component (A1-2) include low molecular weight phenol compounds in which a portion of the hydroxyl group hydrogen atoms have been substituted with an aforementioned acid-dissociable, dissolution-inhibiting group. These types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenol compound is not limited to these examples.

Also, there are no particular limitations on the acid-dissociable, dissolution-inhibiting group, and suitable examples include the groups described above.

Within the component (A1), the component (A1-2) may be either a single compound or a combination of two or more compounds.

[Component (A2)]

In those cases where the resist composition of the present invention is a negative-type resist composition, the component (A) is preferably a base component (A2) (hereafter referred to as "component (A2)") that is soluble in an alkali developing solution.

In the negative resist composition, a cross-linker (C) (hereafter referred to as "component (C)") is preferably included in addition to the component (A2).

In the negative resist composition, when acid is generated from the component (B) upon exposure, the action of that acid causes cross-linking between the component (A2) and the component (C), and the cross-linked product becomes insoluble in an alkali developing solution. Accordingly, during formation of a resist pattern, by conducting selective exposure of a resist film formed by applying the negative resist composition to a substrate, the exposed portions become insoluble in an alkali developing solution, whereas the unexposed portions remain soluble in an alkali developing solution, meaning a resist pattern can then be formed by alkali developing.

In those cases where the resist composition of the present invention is a negative-type resist composition, the component (A2) preferably includes a resin component that is soluble in an alkali developing solution (hereafter, referred to as "alkali-soluble resin component (A2-1)").

As this alkali-soluble resin, it is preferable to use a resin having a structural unit derived from at least one of α-(hydroxyalkyl)acrylic acid and a lower alkyl ester of α-(hydroxyalkyl)acrylic acid, or a resin having a fluorinated alcohol group, as disclosed in Japanese Unexamined Patent Application, First Publication No. 2005-336452 or Japanese Unexamined Patent Application, First Publication No. 2006-259582, as such resins enable the formation of a favorable resist pattern with minimal swelling. Here, the term "α-(hydroxyalkyl)acrylic acid" refers to one or both of acrylic acid, in which a hydrogen atom is bonded to the carbon atom on the α-position having the carboxyl group bonded thereto, and α-hydroxyalkylacrylic acid, in which a hydroxyalkyl group (and preferably a hydroxyalkyl group of 1 to 5 carbon atoms) is bonded to the carbon atom on the α-position. A more detailed description of the alkali-soluble resin component (A2-1) is presented below.

—Component (A2-1)

The alkali-soluble resin component (A2-1) (hereafter referred to as "component (A2-1)") may include an alkali-soluble resin having a fluorinated hydroxyalkyl group represented by general formula (a1'-1-0) shown below.

A specific example of a preferred alkali-soluble resin having a fluorinated hydroxyalkyl group is a polymeric compound (A2-1-10) (hereafter referred to as "component (A2-1-10)") containing a structural unit (a1") that contains, within the main chain, an aliphatic cyclic group having a fluorinated hydroxyalkyl group, and preferably also containing a structural unit (a2') having a hydroxyalkyl group.

Further, another example of a preferred alkali-soluble resin having a fluorinated hydroxyalkyl group is a polymeric compound (A2-1-20) (hereafter referred to as "component (A2-1-20)") containing a structural unit (a1") that contains an aliphatic cyclic group having a fluorinated hydroxyalkyl group, and preferably also containing a structural unit (a2") derived from an acrylate ester containing a hydroxyl group-containing aliphatic cyclic group, and/or a structural unit (a3") derived from an acrylic acid that has no cyclic structure and has an alcoholic hydroxyl group on a side chain.

—Polymeric Compound (A2-1-10)

The component (A2-1-10) includes a structural unit (a1') that contains, within the main chain, an aliphatic cyclic group having a fluorinated hydroxyalkyl group.

Further, the component (A2-1-10) preferably also includes, in addition to the structural unit (a1'), a structural unit (a2') having a hydroxyalkyl group (hereafter, simply abbreviated as "structural unit (a2')").

—Structural Unit (a1')

The component (A2-1-10) includes a structural unit (a1') that contains, within the main chain, an aliphatic cyclic group having a fluorinated hydroxyalkyl group.

In this structural unit (a1'), the "aliphatic cyclic group having a fluorinated hydroxyalkyl group" refers to a group in which a fluorinated hydroxyalkyl group is bonded to a carbon atom that constitutes part of a ring of an aliphatic cyclic group.

Furthermore, the description of the aliphatic cyclic group as being "within the main chain" means that at least one carbon atom, and preferably two or more carbon atoms, within the ring structure of the aliphatic cyclic group constitute part of the main chain of the component (A2-1-10).

In the resist composition of the present invention, by using a component (A2) that includes the component (A2-1-10) containing the structural unit (a1'), the solubility of the resist film within an alkali developing solution is enhanced, and lithography properties such as the resolution, resist pattern shape, and line edge roughness (LER) are improved. Further, because the component (A2-1-10) includes the aliphatic cyclic group (such as a norbornane or tetracyclododecane structure) within the main chain, the carbon density is increased, yielding an improvement in the etching resistance.

Here, a "fluorinated hydroxyalkyl group" describes a hydroxyalkyl group, in which a portion of the hydrogen atoms of an alkyl group have been substituted with hydroxyl groups, wherein some or all of the remaining hydrogen atoms within the hydroxyalkyl group have been substituted with fluorine atoms.

In a fluorinated hydroxyalkyl group, the fluorination increases the ease with which the hydrogen atom of the hydroxyl group is released.

In the fluorinated hydroxyalkyl group, the alkyl group is preferably a linear or branched alkyl group.

Although there are no particular limitations on the number of carbon atoms within the alkyl group, the number of carbon atoms is preferably from 1 to 20, more preferably from 4 to 16, and most preferably from 4 to 12.

There are no particular limitations on the number of hydroxyl groups, although a single hydroxyl group is preferred.

Of the various possibilities, groups in which a fluorinated alkyl group and/or a fluorine atom is bonded to the carbon atom to which the hydroxyl group is bonded (which refers to the α-position carbon atom of the hydroxyalkyl group) are preferred as the fluorinated hydroxyalkyl group.

Furthermore, the fluorinated alkyl group bonded to the α-position is preferably a group in which all of the hydrogen atoms of the alkyl group have been substituted with fluorine atoms. Furthermore, as the alkyl group of this fluorinated alkyl group, a linear or branched alkyl group of 1 to 5 carbon atoms is preferred, and an alkyl group of one carbon atom is the most desirable.

The term "aliphatic" in the expression "aliphatic cyclic group having a fluorinated hydroxyalkyl group" is a relative concept used in relation to the term "aromatic", and defines a group or compound or the like that contains no aromaticity. The aliphatic cyclic group may be either monocyclic or polycyclic.

The expression "monocyclic aliphatic cyclic group" describes a monocyclic group that contains no aromaticity, whereas the expression "polycyclic aliphatic cyclic group" describes a polycyclic group that contains no aromaticity.

In the structural unit (a1'), the aliphatic cyclic group is preferably a polycyclic group, as such groups provide superior etching resistance and the like.

The aliphatic cyclic group includes both hydrocarbon groups formed solely from carbon and hydrogen (alicyclic groups), and heterocyclic groups in which a portion of the carbon atoms that constitute the ring structure of an alicyclic group have been substituted with a hetero atom such as an oxygen atom, nitrogen atom, or sulfur atom. These aliphatic cyclic groups may have substituents, and examples of these substituents include alkyl groups of 1 to 5 carbon atoms.

The expression "may have substituents" means that some or all of the hydrogen atoms bonded to the carbon atoms that constitute the ring structure of the aliphatic cyclic group may be substituted with substituents (atoms other than a hydrogen atom or groups). In the present invention, an alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The number of carbon atoms within the aliphatic cyclic group is preferably within a range from 5 to 15.

Specific examples of the aliphatic cyclic group include the groups described below.

Examples of the monocyclic group include groups in which two or more hydrogen atoms have been removed from a cycloalkane. Specific examples include groups in which two or two hydrogen atoms have been removed from cyclopentane or cyclohexane.

Examples of the polycyclic group include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane.

These types of aliphatic cyclic groups can be selected appropriately from the multitude of groups that have been proposed for the resins of photoresist compositions designed for use in ArF excimer laser processes.

Of the various possibilities, groups in which two or more hydrogen atoms have been removed from cyclopentane, cyclohexane, adamantane, norbornane or tetracyclododecane are readily available industrially, and are consequently preferred.

Of the alicyclic groups exemplified above, groups such as those shown in a structural unit (a1'-1) below, in which three hydrogen atoms have been removed from norbornane or tetracyclododecane, are preferred, and groups in which three hydrogen atoms have been removed from norbornane are particularly desirable.

Of the units included within the definition of the structural unit (a1'), structural units (a1'-1) represented by general formula (a1'-1) shown below are preferred. By including the structural unit (a1'-1), the solubility of the polymeric compound in an alkali developing solution improves significantly. Furthermore, the lithography properties such as the resolution are also improved.

[Chemical formula 43]

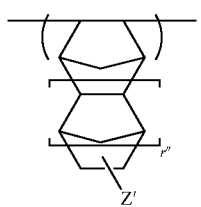

(a1'-1)

In formula (a1'-1), Z' represents a fluorinated hydroxyalkyl group, and r'' is either 0 or 1.

In formula (a1'-1), r'' is either 0 or 1, and in terms of industrial availability, is preferably 0.

Further, in formula (a1'-1), examples of the "fluorinated hydroxyalkyl group" represented by Z' include the same groups as those described above. Of these, Z' is preferably a group represented by general formula (a1'-1-0) shown below, as such groups yield a particularly superior resist pattern shape as well as reduced levels of line edge roughness (LER).

The term "line edge roughness (LER)" refers to non-uniform unevenness in the side walls of a pattern.

[Chemical formula 44]

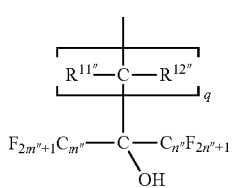

(A1'-1-0)

In formula (a1'-1-0), $R^{11''}$ and $R^{12''}$ each independently represents a hydrogen atom or a lower alkyl group of 1 to 5 carbon atoms, m'' and n'' each independently represents an integer of 1 to 5, and q also represents an integer of 1 to 5.

In formula (a1'-1-0), $R^{11''}$ and $R^{12''}$ each independently represents a hydrogen atom or a lower alkyl group.

As the lower alkyl group, a linear or branched lower alkyl group of not more than 5 carbon atoms is preferred, and specific examples include a methyl group, ethyl group, propyl group, isopropyl group, n-butyl group, isobutyl group, tert-butyl group, pentyl group, isopentyl group or neopentyl group, and a methyl group is particularly desirable.

Of the various possibilities, groups in which $R^{11''}$ and $R^{12''}$ are both hydrogen atoms are particularly desirable.

q represents an integer of 1 to 5, and is preferably an integer of 1 to 3, and most preferably 1.

Each of m'' and n'' independently represents an integer of 1 to 5, and preferably an integer of 1 to 3. Groups in which m'' and n'' are both 1 are preferred in terms of ease of synthesis.

The structural unit (a1') may use either one type of structural unit, or a mixture of two or more types.

The amount of the structural unit (a1') within the component (A2-1-10), based on the combined total of all the structural units that constitute the component (A2-1-10), is preferably within a range from 50 to 90 mol %, more preferably from 55 to 90 mol %, and still more preferably from 60 to 80 mol %. Ensuring that this amount is at least as large as the lower limit of the above-mentioned range yields an improvement in the effects achieved by including the structural unit (a1'), whereas by ensuring that the amount is not more than the upper limit of the above-mentioned range, a good balance can be achieved with the other structural units.

—Structural Unit (a2')

In addition to the structural unit (a1'), the component (A2-1-10) preferably also includes a structural unit (a2') having a hydroxyalkyl group.

In the present invention, including a resin (A2-1-10) containing the structural unit (a2') within the component (A2) improves the solubility of the component (A2) within an alkali developing solution. Further, the cross-linking of the component (A2) with the component (C) is enhanced, meaning the difference in the solubility within the alkali developing solution (the contrast) between the exposed portions and the unexposed portions can be increased, enabling the composition to function more effectively as a negative resist.

As the structural unit (a2'), units such as a structural unit (a210) that contains, within the main chain, an aliphatic cyclic group having a hydroxyalkyl group, and a structural unit (a220) derived from an acrylate ester having a hydroxyl group-containing alkyl group are preferred.

—Structural Unit (a210)

In the present invention, the structural unit (a210) is a structural unit that contains, within the main chain, an aliphatic cyclic group having a hydroxyalkyl group.

Examples of the structural unit (a210) include the same units as those listed above for the structural unit (a1'), with the exception that the "fluorinated hydroxyalkyl group" within the structural unit (a1') is replaced with an unfluorinated hydroxyalkyl group, namely a hydroxyalkyl group in which a portion of the hydrogen atoms of an alkyl group have been substituted with hydroxyl groups, and the remaining hydrogen atoms have not been substituted with fluorine atoms.

Of the units included within the definition of the structural unit (a210), structural units represented by general formula (a2'-1) shown below (hereafter referred to as "structural unit (a2'-1)") are preferred. By including the structural unit (a2'-1), lithography properties such as the resolution, resist pattern shape and line width roughness (LWR) are improved. Further, a favorable contrast is more readily obtained, and the etching resistance also improves.

[Chemical formula 45]

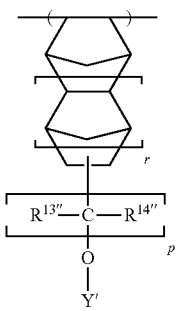
(a2'-1)

In formula (a2'-1), each of $R^{13\prime\prime\prime}$ and $R^{14\prime\prime\prime}$ independently represents a hydrogen atom or a lower alkyl group of 1 to 5 carbon atoms, Y' represents a hydrogen atom or a hydroxyalkyl group, r represents either 0 or 1, and p represents an integer of 1 to 3.

The structural unit (a2'-1) represented by general formula (a2'-1) is a structural unit that contains, within the main chain, a norbornane or tetracyclododecane structure having a hydroxyalkyl group.

In formula (a2'-1), each of $R^{13\prime\prime\prime}$ and $R^{14\prime\prime\prime}$ independently represents a hydrogen atom or a lower alkyl group. Examples of the lower alkyl group include the same groups as those listed above in relation to the lower alkyl groups represented by $R^{11\prime\prime\prime}$ and $R^{12\prime\prime\prime}$ in formula (a1'-1-0). Of the various possibilities, groups in which $R^{13\prime\prime\prime}$ and $R^{14\prime\prime\prime}$ are both hydrogen atoms are particularly desirable.

Y' represents a hydrogen atom or a hydroxyalkyl group.

As the hydroxyalkyl group, a linear or branched hydroxyalkyl group of not more than 10 carbon atoms is preferred, a linear or branched hydroxyalkyl group of not more than 8 carbon atoms is more preferred, and a linear lower hydroxyalkyl group of 1 to 3 carbon atoms is still more preferred.

There are no particular limitations on the number of hydroxyl groups or the bonding positions of those hydroxyl groups within the hydroxyalkyl group, although a single hydroxyl group is typical, and this hydroxyl group is preferably bonded to the alkyl group terminal.

Y' is most preferably a hydrogen atom.

r is either 0 or 1, and is preferably 0.

p represents an integer of 1 to 3, is preferably 1 or 2, and is most preferably 1.

Specific examples of the structural unit (a2'-1) include units represented by chemical formulas (a2'-1-1) to (a2'-1-7) shown below.

(Chemical formula 46)

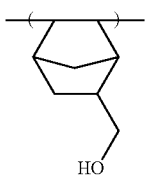
(a2'-1-1)

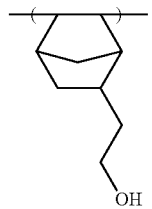
(a2'-1-2)

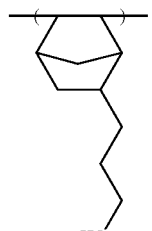
(a2'-1-3)

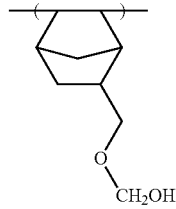
(a2'-1-4)

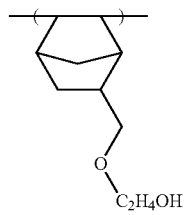
(a2'-1-5)

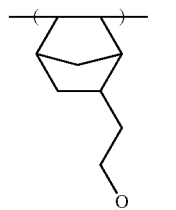
(a2'-1-6)

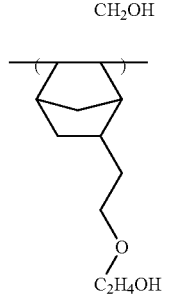
(a2'-1-7)

Of these structural units, those represented by the above chemical formulas (a2'-1-1), (a2'-1-2) and (a2'-1-3) are preferred.

The structural unit (a210) may use either one type of structural unit, or a mixture of two or more types.

The amount of the structural unit (a210) within the component (A2-1-10), based on the combined total of all the structural units that constitute the component (A2-1-10), is preferably within a range from 10 to 50 mol %, more preferably from 15 to 50 mol %, and still more preferably from 20 to 45 mol %. Ensuring this amount is at least as large as the lower limit of the above-mentioned range improves the effects achieved by including the structural unit (a210) such as improving the alkali solubility and making a favorable contrast more readily obtainable. On the other hand, by ensuring that the amount is not more than the upper limit of the above-mentioned range, a good balance can be achieved with the other structural units.

—Structural Unit (a220)

The structural unit (a220) is a structural unit derived from an acrylate ester having a hydroxyl group-containing alkyl group.

If the structural unit (a220) is a structural unit that includes a hydroxyl group-containing cyclic alkyl group (hereafter such structural units are referred to as "structural unit (a221)"), then the resist pattern swelling suppression effect is further enhanced. Further, the resolution is also improved. Furthermore, favorable levels of contrast and etching resistance are also more readily obtained.

Examples of the structural unit (a221) include those units, amongst the structural units listed below in the description of a "structural unit (a2")" derived from an acrylate ester containing a hydroxyl group-containing aliphatic cyclic group" that constitutes the component (A2-1-20) described below, in which the aliphatic cyclic group is a saturated hydrocarbon group. Of these structural units, units in which the substituent bonded to the α-position of the acrylate ester is a fluorinated alkyl group are particularly preferred, and this substituent is most preferably a trifluoromethyl group (—CF$_3$).

Furthermore, if the structural unit (a220) is a structural unit that includes a hydroxyl group-containing chain-like alkyl group (such structural units are referred to as "structural unit (a222)"), then the hydrophilicity of the entire component (A2-1-10) is increased, the solubility of the component within an alkali developing solution is improved, and the resolution also improves. Further, the controllability of the cross-linking reaction that occurs during resist pattern formation improves, yielding improvements in the pattern shape and the resolution. Moreover, the film density also tends to increase, and this enables suppression of thickness loss during etching, and tends to also improve the heat resistance.

Examples of the structural unit (a222) include those units, amongst the structural units exemplified below in the description of a "structural unit (a3")" derived from an acrylic acid that has no cyclic structure and has an alcoholic hydroxyl group on a side chain" that constitutes the component (A2-1-20) described below, that include a hydroxyalkyl group. Of these structural units, units having a hydroxyalkyl group at the acrylate ester portion are preferred, structural units in which the substituent bonded to the α-position of the acrylate ester is a fluorinated alkyl group are particularly preferred, and this substituent is most preferably a trifluoromethyl group (—CF$_3$).

The structural unit (a220) may use either one type of structural unit, or a mixture of two or more types.

The amount of the structural unit (a220) within the component (A2-1-10), based on the combined total of all the structural units that constitute the component (A2-1-10), is preferably within a range from 10 to 80 mol %, more preferably from 15 to 60 mol %, and still more preferably from 20 to 55 mol %. Ensuring that this amount is at least as large as the lower limit of the above-mentioned enables the effects obtained by including the structural unit (a220) to be achieved, whereas by ensuring that the amount is not more than the upper limit of the above-mentioned range, a good balance can be achieved with the other structural units.

In those cases where the structural unit (a220) includes both the structural unit (a221) and the structural unit (a222), the mixing ratio between the two structural units, reported as a molar ratio, is preferably such that structural unit (a221): structural unit (a222) is from 9:1 to 1:9, more preferably from 8:2 to 2:8, and most preferably from 6:4 to 7:3.

By including the structural unit (a221) and the structural unit (a222) in a favorable balance that satisfies the above-mentioned mixing ratio, a favorable exposure margin can be obtained. Further, a suitable level of contrast is also obtained, and the resolution is improved. Moreover, the etching resistance also improves.

—Other Structural Units

In the negative resist composition of the present invention, besides the structural units (a1') and (a2') described above, the component (A) may also include other structural units typically used in the resin component of conventional chemically amplified resist compositions.

In the present invention, the resin (A2-1-10) is preferably a polymeric compound that includes the structural unit (a1') and the structural unit (a2'), and is more preferably a polymeric compound in which the structural units (a1') and (a2') represent main components.

Here the term "main components" means that the combined amount of the structural unit (a1') and the structural unit (a2'), relative to the combined total of all the structural units that constitute the component (A2-1-10), is preferably at least 70 mol %. This amount is more preferably 80 mol % or higher, and may be 100 mol %. Of the various possibilities, polymeric compounds formed solely from the structural unit (a1') and the structural unit (a2') are the most desirable.

In the component (A2-1-10), the combination of the structural unit (a1') and the structural unit (a2') is preferably a combination of the structural unit (a1') and the structural unit (a210).

Preferred examples of the component (A2-1-10) include polymeric compounds containing the combinations of structural units represented by chemical formulas (A2-1-11) to (A2-1-14) shown below.

[Chemical formula 47]

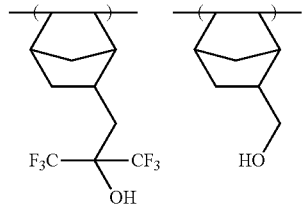

(A2-1-11)

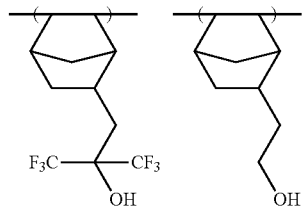

(A2-1-12)

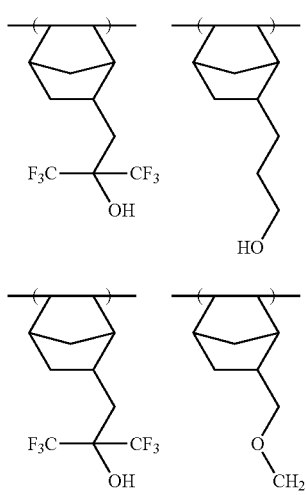

(A2-1-13)

(A2-1-14)

Of the above polymeric compounds, the component (A2-1-10) is preferably a polymeric compound that includes at least one combination of structural units selected from the combinations represented by chemical formulas (A2-1-11) to (A2-1-14), and is most preferably a polymeric compound including the combination of structural units represented by chemical formula (A2-1-11).

In the present invention, the weight average molecular weight (Mw, the polystyrene equivalent molecular weight measured by gel permeation chromatography) of the component (A2-1-10) is preferably within a range from 2,000 to 10,000, more preferably from 3,000 to 6,000, and most preferably from 3,000 to 5,000.

Ensuring that this molecular weight is at least as large as the lower limit of the above-mentioned range enables good contrast to be obtained, whereas ensuring the molecular weight is not more than the upper limit of the above range enables pattern swelling to be suppressed. As a result, the resolution can be improved. Further, suppressing pattern swelling also yields an improvement in the depth of focus (DOF) properties and improved suppression of line edge roughness (LER). Furthermore, ensuring a weight average molecular weight within the above range is preferred in terms of achieving a large suppression effect on resist pattern swelling. Lower weight average molecular weights within the above-mentioned range tend to yield more favorable properties.

Further, the dispersity (Mw/Mn) is preferably within a range from 1.0 to 5.0, and is more preferably from 1.0 to 2.5.

When the component (A2-1) is used in the component (A2), one type of the above component (A2-1-10) may be used alone, or a mixture of two or more types may be used.

In those cases where the component (A2-1-10) is used, the amount of the component (A2-1-10) within the component (A2-1) is preferably at least 40% by weight, more preferably 50% by weight or greater, and most preferably 60% by weight or greater.

Polymeric Compound (A2-1-20)

The component (A2-1-20) includes a structural unit (a1") that contains an aliphatic cyclic group having a fluorinated hydroxyalkyl group.

Further, in addition to the structural unit (a1"), the component (A2-1-20) preferably also includes a structural unit (a2") derived from an acrylate ester containing a hydroxyl group-containing aliphatic cyclic group.

Furthermore, in addition to the structural unit (a1"), or in addition to a combination of the structural unit (a1") and the structural unit (a2"), the component (A2-1-20) preferably also includes a structural unit (a3") derived from an acrylic acid that has no cyclic structure and has an alcoholic hydroxyl group on a side chain.

—Structural Unit (a1")

The structural unit (a1") is a structural unit that includes an aliphatic cyclic group having a fluorinated hydroxyalkyl group. Including the structural unit (a1") improves the solubility of the polymeric compound in an alkali developing solution. Further, swelling of the resist pattern is suppressed, and lithography properties such as the resolution, pattern shape and LWR are improved.

The aliphatic cyclic group having a fluorinated hydroxyalkyl group is the same as that described above for the structural unit (a1'), and as the aliphatic cyclic group (prior to the bonding of the fluorinated hydroxyalkyl group), groups in which two hydrogen atoms have been removed from cyclohexane, adamantane, norbornane or tetracyclododecane are readily available industrially, and are consequently preferred.

Of these monocyclic and polycyclic groups, a group in which two hydrogen atoms have been removed from norbornane is particularly desirable.

The structural unit (a1") is preferably a structural unit derived from acrylic acid. A structure in which the above-mentioned aliphatic cyclic group is bonded to the oxygen atom (—O—) at the terminal of the carbonyloxy group [—C(O)—O—] of an acrylate ester (namely, a structure in which the hydrogen atom of the carboxyl group of acrylic acid has been substituted with the aliphatic cyclic group) is particularly desirable.

As the structural unit (a1"), structural units (a1"-1) represented by general formula (1) shown below are preferred.

[Chemical formula 48]

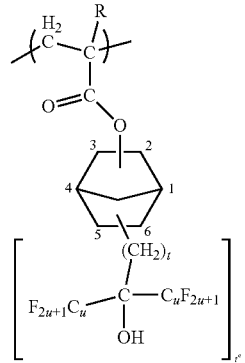

(1)

In formula (1), R represents a hydrogen atom, a lower alkyl group or a halogenated lower alkyl group, and each of u, t and t" independently represents an integer of 1 to 5.

In formula (1), R represents a hydrogen atom, a lower alkyl group or a halogenated lower alkyl group.

Examples of the lower alkyl group or halogenated lower alkyl group for R include the same groups as those listed above for the lower alkyl group or halogenated lower alkyl group that may be bonded to the α-position of the above-mentioned acrylate ester.

In the present invention, R is preferably a hydrogen atom or a lower alkyl group, and in terms of industrial availability, is most preferably a hydrogen atom or a methyl group.

Each u independently represents an integer of 1 to 5, and is preferably an integer of 1 to 3, and most preferably 1.

t represents an integer of 1 to 5, preferably an integer of 1 to 3, and most preferably 1.

t" represents an integer of 1 to 5, preferably an integer of 1 to 3, more preferably an integer of 1 or 2, and most preferably 1.

The structural unit (a1"-1) represented by general formula (1) preferably has a 2-norbornyl group or 3-norbornyl group bonded to the terminal of the carboxyl group of the (α-lower alkyl)acrylic acid. The fluorinated alkyl alcohol is preferably bonded to the 5th or 6th position of the norbornyl group.

The structural unit (a1") may use either one type of structural unit, or a mixture of two or more types.

The amount of the structural unit (a1") within the component (A2-1-20), based on the combined total of all the structural units that constitute the component (A2-1-20), is preferably within a range from 10 to 90 mol %, more preferably from 20 to 90 mol %, still more preferably from 40 to 90 mol %, and most preferably from 45 to 85 mol %. Ensuring that this amount is at least as large as the lower limit of the above-mentioned range enables the effects generated by including the structural unit (a1") to be obtained, whereas by ensuring that the amount is not more than the upper limit of the above range, a good balance can be achieved with the other structural units.

—Structural Unit (a2")

In addition to the structural unit (a1"), the component (A2-1-20) preferably also includes a structural unit (a2") derived from an acrylate ester containing a hydroxyl group-containing aliphatic cyclic group.

When a component (A2-1-20) that includes the structural unit (a2") is blended into the negative resist composition, the hydroxyl group (the alcoholic hydroxyl group) of this structural unit (a2") reacts with the component (C) under the action of the acid generated from the component (B), and this reaction causes the component (A2-1-20) to change from a state that is soluble in the alkali developing solution to a state that is insoluble.

The expression "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either monocyclic or polycyclic, but is preferably a polycyclic group. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same groups as those listed above in connection with the aliphatic cyclic group of the structural unit (a1").

As the aliphatic cyclic group of the structural unit (a2"), of the groups described above, a cyclohexyl group, adamantyl group, norbornyl group and tetracyclododecanyl group are the most readily available commercially, and are consequently preferred. Of these, a cyclohexyl group or adamantyl group is particularly preferred, and an adamantyl group is the most desirable.

Besides the hydroxyl group, a linear or branched alkyl group of 1 to 4 carbon atoms may also be bonded to the aliphatic cyclic group.

In the structural unit (a2"), the hydroxyl group-containing aliphatic cyclic group is preferably bonded to the oxygen atom at the terminal of the ester group (—C(O)—O—) of the acrylate ester.

In such cases, in the structural unit (a2"), another substituent may be bonded to the α-position (the α-position carbon atom) of the acrylate ester instead of a hydrogen atom. Examples of preferred substituents include a lower alkyl group or a halogenated lower alkyl group.

Examples of this lower alkyl group or halogenated lower alkyl group include the same groups as those listed above for R within general formula (1) representing the above-mentioned structural unit (a1"), and of the various moieties that can be bonded to the α-position, a hydrogen atom or a lower alkyl group is preferred, and a hydrogen atom or methyl group is particularly desirable.

As the structural unit (a2"), structural units (a2"-1) represented by general formula (2) shown below are preferred.

[Chemical formula 49]

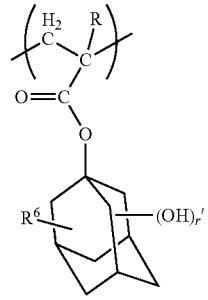

(2)

In formula (2), R is the same as defined above for R in general formula (1), $R^6$ represents a hydrogen atom, a lower alkyl group, or an alkoxy group of 1 to 5 carbon atoms, and r' represents an integer of 1 to 3.

R is the same as defined above for R in general formula (1).

The lower alkyl group for $R^6$ is the same as defined above for the lower alkyl group for R in formula (1).

In general formula (2), R and $R^6$ are preferably both hydrogen atoms.

r' represents an integer of 1 to 3, and is most preferably 1.

Although there are no particular limitations on the bonding position of the hydroxyl group, units in which the hydroxyl group is bonded to the 3rd position of the adamantyl group are preferred.

The structural unit (a2") may use either one type of structural unit, or a mixture of two or more types.

The amount of the structural unit (a2") within the component (A2-1-20), based on the combined total of all the structural units that constitute the component (A2-1-20), is preferably within a range from 10 to 70 mol %, more preferably from 10 to 50 mol %, and most preferably from 20 to 40 mol %. Ensuring that this amount is at least as large as the lower limit of the above-mentioned range enables the effects generated by including the structural unit (a2") to be obtained, whereas by ensuring that the proportion is not more than the upper limit of the above range, a good balance can be achieved with the other structural units.

—Structural Unit (a3")

In addition to the structural unit (a1"), or in addition to both the structural unit (a1") and the structural unit (a2"), the component (A2-1-20) preferably also includes a structural unit (a3") derived from an acrylic acid that has no cyclic structure and has an alcoholic hydroxyl group on a side chain.

When a component (A2-1-20) that includes the structural unit (a3") is blended into the negative resist composition, the alcoholic hydroxyl group of this structural unit (a3") reacts with the component (C), together with the hydroxyl group of the structural unit (a2"), under the action of the acid generated from the component (B).

Accordingly, the component (A2-1-20) changes more readily from a state that is soluble in the alkali developing solution to a state that is insoluble, which has the effect of improving the lithography properties such as the resolution. Further, thickness loss can also be suppressed. Furthermore, the controllability of the cross-linking reaction that occurs during pattern formation improves. Moreover, the film density also tends to increase, and as a result, the heat resistance tends to improve. Moreover, the etching resistance also improves.

In the structural unit (a3"), the expression "has no cyclic structure" means that the structural unit includes no aliphatic cyclic groups or aromatic groups.

The structural unit (a3") is readily distinguishable from the structural unit (a2") as a result of having no cyclic structure.

Examples of structural units that include an alcoholic hydroxyl group on a side chain include structural units having a hydroxyalkyl group.

Examples of this hydroxyalkyl group include the same hydroxyalkyl groups as those within the "fluorinated hydroxyalkyl group" described above in relation to the structural unit (a1").

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group.

In the structural unit (a3"), the hydroxyalkyl group preferably exists at either one, or both of these locations.

In those cases where the hydroxyalkyl group is not bonded to the α-position, the hydrogen atom at the α-position carbon atom may be replaced with a lower alkyl group or a halogenated lower alkyl group.

Examples of this lower alkyl group or halogenated lower alkyl group include the same groups as those described above for R within general formula (1).

As the structural unit (a3"), structural units (a3"-1) represented by general formula (3) shown below are preferred.

[Chemical formula 50]

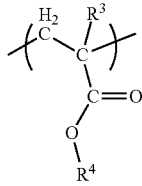

(3)

In formula (3), $R^3$ represents a hydrogen atom, a lower alkyl group, a halogenated lower alkyl group or a hydroxyalkyl group, and $R^4$ represents a hydrogen atom, an alkyl group or a hydroxyalkyl group, provided that at least one of $R^3$ and $R^4$ represents a hydroxyalkyl group.

The hydroxyalkyl group for $R^3$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or hydroxyethyl group.

There are no particular limitations on the number of hydroxyl groups or the bonding positions of those groups, although one hydroxyl group is typical, and the hydroxyl group is preferably bonded to the terminal of the alkyl group.

The lower alkyl group for $R^3$ is preferably an alkyl group of not more than 10 carbon atoms, more preferably an alkyl group of 2 to 8 carbon atoms, and is most preferably an ethyl group or methyl group.

The halogenated lower alkyl group for $R^3$ is preferably a lower alkyl group of not more than 5 carbon atoms (most preferably an ethyl group or methyl group) in which some or all of the hydrogen atoms have been substituted with halogen atoms (and preferably fluorine atoms).

Examples of the alkyl group and hydroxyalkyl group for $R^4$ include the same groups as those listed above for the lower alkyl group and hydroxyalkyl group for $R^3$.

Specific examples of the structural unit (a3"-1) represented by general formula (3) include structural units derived from α-(hydroxyalkyl)acrylic acids (but not including structural units derived from acrylate esters), structural units derived from alkyl α-(hydroxyalkyl)acrylate esters, and structural units derived from hydroxyalkyl α-alkyl)acrylate esters.

Of these, including a structural unit derived from an alkyl α-(hydroxyalkyl)acrylate ester as the structural unit (a3") is preferred in terms of improving the film density. Of the various possibilities, structural units derived from ethyl α-(hydroxymethyl)acrylate or methyl α-(hydroxymethyl)acrylate are particularly desirable.

Furthermore, including a structural unit derived from a hydroxyalkyl α-alkyl)acrylate ester as the structural unit (a3") is preferred in terms of improving the cross-linking efficiency. Of such units, structural units derived from hydroxyethyl α-methyl-acrylate or hydroxymethyl α-methyl-acrylate are particularly desirable.

The structural unit (a3") may use either one type of structural unit, or a mixture of two or more types.

The amount of the structural unit (a3") within the component (A2-1-20), based on the combined total of all the structural units that constitute the component (A2-1-20), is preferably within a range from 5 to 50 mol %, more preferably from 5 to 40 mol %, still more preferably from 5 to 30 mol %, and most preferably from 10 to 25 mol %. Ensuring that this amount is at least as large as the lower limit of the above-mentioned range enables the effects generated by including the structural unit (a3") to be obtained, whereas by ensuring that the amount is not more than the upper limit of the above range, a good balance can be achieved with the other structural units.

—Other Structural Units

Besides each of the structural units (a1") to (a3") described above, the component (A2-1-20) may also include other copolymerizable structural units.

As such structural units, any of the structural units used in known resin components of conventional chemically amplified resist compositions can be used. An example is a structural unit (a4") derived from an acrylate ester that includes a lactone-containing monocyclic or polycyclic group.

As the structural unit (a4"), any unit that satisfies the above definition can be used without any particular limitations. Specifically, examples of lactone-containing monocyclic groups include groups in which one hydrogen atom has been removed from γ-butyrolactone. Further, examples of lactone-containing polycyclic groups include groups in which one hydrogen atom has been removed from a lactone ring-containing bicycloalkane, tricycloalkane, or tetracycloalkane.

The structural unit (a4″) may use either one type of structural unit, or a mixture of two or more types.

If the structural unit (a4″) is included in the component (A2-1-20), then the amount of the structural unit (a4″) within the component (A2-1-20), based on the combined total of all the structural units that constitute the component (A2-1-20), is preferably within a range from 10 to 70 mol %, more preferably from 10 to 40 mol %, and most preferably from 10 to 25 mol %. Ensuring that this amount is at least as large as the lower limit of the above-mentioned range enables the effects generated by including the structural unit (a4″) to be obtained, whereas by ensuring that the amount is not more than the upper limit of the above range, a good balance can be achieved with the other structural units.

However, in the present invention, the component (A2-1-20) is preferably a polymeric compound in which the structural units (a1″) to (a3″) represent the main components.

Here, the term "main components" means that the combined amount of the structural units (a1″) to (a3″) represents at least 50 mol %, preferably at least 70 mol %, and more preferably 80 mol % or greater, of all the structural units. Polymeric compounds in which this proportion is 100 mol %, namely polymeric compounds composed solely of the structural unit (a1″), the structural unit (a2″) and the structural unit (a3″), are the most desirable.

As the component (A2-1-20), polymeric compounds that include a combination of structural units such as that represented by formula (A2-1-21) shown below are particularly desirable.

[Chemical formula 51]

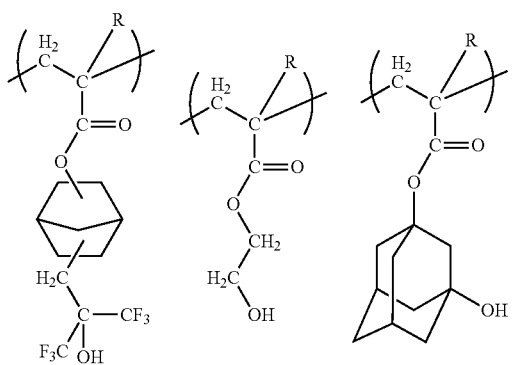

(A2-1-21)

In the above formula, R is the same as defined above for R in formula (1), and the plurality of R groups may be the same or different.

The weight average molecular weight (Mw) of the component (A2-1-20) is preferably within a range from 2,000 to 30,000, more preferably from 2,000 to 10,000, and most preferably from 3,000 to 8,000. Ensuring a molecular weight within this range is preferred in terms of obtaining a favorable dissolution rate within an alkali developing solution, and achieving a high level of resolution. For the weight average molecular weight, lower values within the above-mentioned range tend to yield more favorable properties.

Further, the dispersity (Mw/Mn) is preferably within a range from 1.0 to 5.0, and more preferably from 1.0 to 2.5.

When the component (A2-1) is used in the component (A2), one type of the component (A2-1-20) may be used alone, or a mixture of two or more types may be used.

In those cases where the component (A2-1-20) is used, the amount of the component (A2-1-20) within the component (A2-1) is preferably at least 40% by weight, more preferably at least 50% by weight, and still more preferably 60% by weight or greater.

The component (A2-1-10) or the component (A2-1-20) used in the present invention can be synthesized, for example, by the method disclosed in International Patent Publication 2004/076495 pamphlet, or a method in which the monomers that give rise to each of the structural units are subjected to a radical polymerization using normal methods.

In the negative resist composition of the present invention, the component (A2) may use either one type of resin, or a combination of two or more types.

Besides the component (A2-1-10) and the component (A2-1-20), the component (A2) may also use other polymeric compounds typically used within conventional negative resist compositions (such as hydroxystyrene resins, novolak resins or acrylic resins).

The amount of the component (A) within the resist composition of the present invention may be adjusted in accordance with factors such as the thickness of the resist film that is to be formed.

<Component (B)>

In the present invention, there are no particular limitations on the component (B), and any of the known acid generators proposed for use in conventional chemically amplified resist compositions can be used.

Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzylsulfonate-based acid generators, iminosulfonate-based acid generators, and disulfone-based acid generators.

As an onium salt-based acid generator, a compound represented by general formula (b-1) or (b-2) shown below may be used.

[Chemical formula 52]

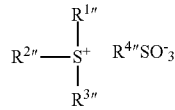

(b-1)

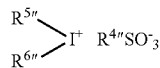

(b-2)

In the above formulas, $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ in formula (b-1) may be bonded to each other to form a ring with the sulfur atom, and $R^{4\prime\prime}$ represents an alkyl group, halogenated alkyl group, aryl group or alkenyl group which may have a substituent, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), each of $R^{1\prime\prime}$ to $R^{3\prime\prime}$ independently represents an aryl group or an alkyl group. In formula (b-1), two of $R^{1\prime\prime}$ to $R^{3\prime\prime}$ may be bonded to each other to form a ring with the sulfur atom.

Further, among R$^{1\prime\prime}$ to R$^{3\prime\prime}$, at least one group represents an aryl group. Among R$^{1\prime\prime}$ to R$^{3\prime\prime}$, two or more groups are preferably aryl groups, and it is particularly desirable that all of R$^{1\prime\prime}$ to R$^{3\prime\prime}$ are aryl groups.

There are no particular limitations on the aryl group for R$^{1\prime\prime}$ to R$^{3\prime\prime}$, and for example, an aryl group having 6 to 20 carbon atoms may be used in which some or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and naphthyl group.

The alkyl group with which hydrogen atoms of the aryl group may be substituted is preferably an alkyl group having 1 to 5 carbon atoms, and most preferably a methyl group, ethyl group, propyl group, n-butyl group, or tert-butyl group.

The alkoxy group with which hydrogen atoms of the aryl group may be substituted is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or ethoxy group.

The halogen atom with which hydrogen atoms of the aryl group may be substituted is preferably a fluorine atom.

There are no particular limitations on the alkyl group for R$^{1\prime\prime}$ to R$^{3\prime\prime}$, and examples include a linear, branched or cyclic alkyl group having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group or decanyl group, and a methyl group is most preferable because it is excellent in resolution and can be synthesized at a low cost.

When two of R$^{1\prime\prime}$ to R$^{3\prime\prime}$ in formula (b-1) are bonded to each other to form a ring with the sulfur atom, it is preferable that the two of R$^{1\prime\prime}$ to R$^{3\prime\prime}$ form a 3- to 10-membered ring including the sulfur atom, and it is particularly desirable that the two of R$^{1\prime\prime}$ to R$^{3\prime\prime}$ form a 5- to 7-membered ring including the sulfur atom.

When two of R$^{1\prime\prime}$ to R$^{3\prime\prime}$ in formula (b-1) are bonded to each other to form a ring with the sulfur atom, the remaining one of R$^{1\prime\prime}$ to R$^{3\prime\prime}$ is preferably an aryl group. Examples of the aryl group include the same groups as those listed above for the aryl groups for R$^{1\prime\prime}$ to R$^{3\prime\prime}$.

Preferred examples of the cation moiety for the compound represented by formula (b-1) include cation moieties containing a triphenylmethane skeleton represented by formulas (I-1-1) to (1-1-8) shown below.

[Chemical formula 53]

(I-1-1)

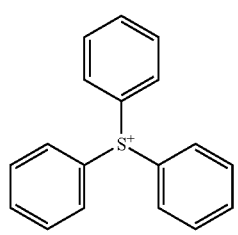

(I-1-2)

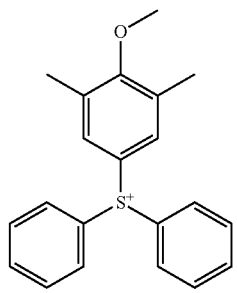

(I-1-3)

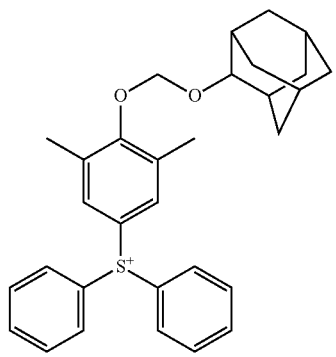

(I-1-4)

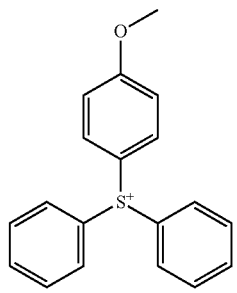

(I-1-5)

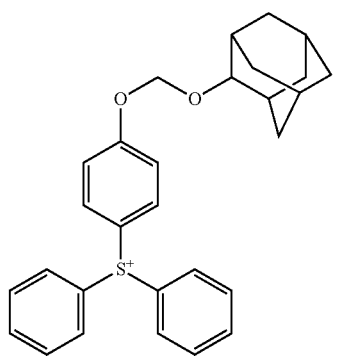

(I-1-6)

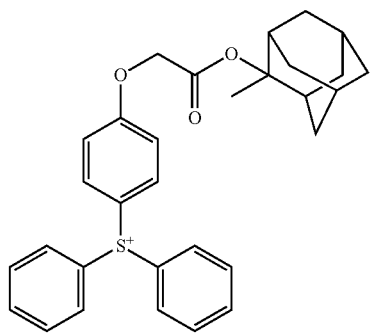

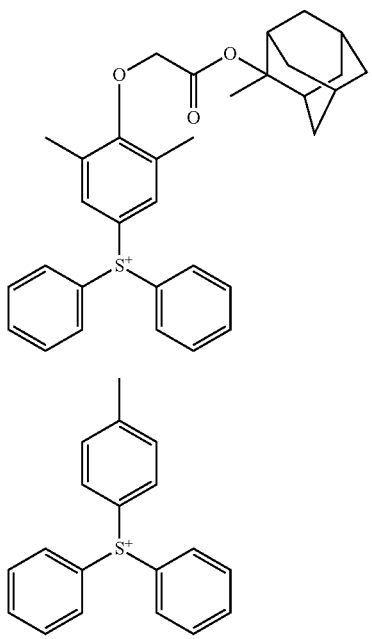

(I-1-7)

(I-1-8)

Further, cation moieties represented by formulas (I-1-9) and (I-1-10) shown below are also preferred as the cation moiety for an onium salt-based acid generator.

In formulas (I-1-9) and (I-1-10), each of $R^{27}$ and $R^{39}$ independently represents a phenyl group or naphthyl group which may have a substituent, an alkyl group of 1 to 5 carbon atoms, an alkoxy group or a hydroxyl group.

v is an integer of 1 to 3, and is most preferably 1 or 2.

[Chemical formula 54]

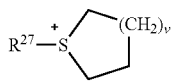

(I-1-9)

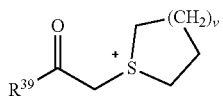

(I-1-10)

$R^{4'''}$ represents an alkyl group, halogenated alkyl group, aryl group or alkenyl group, which may have a substituent.

The alkyl group for $R^{4'''}$ may be any of linear, branched or cyclic.

The linear or branched alkyl group preferably contains 1 to 10 carbon atoms, more preferably 1 to 8 carbon atoms, and most preferably 1 to 4 carbon atoms.

The cyclic alkyl group preferably contains 4 to 15 carbon atoms, more preferably 4 to 10 carbon atoms, and most preferably 6 to 10 carbon atoms.

Examples of the halogenated alkyl group for $R^{4'''}$ include groups in which some or all of the hydrogen atoms of an aforementioned linear, branched or cyclic alkyl group have been substituted with halogen atoms. Examples of the halogen atoms include a fluorine atom, chlorine atom, bromine atom or iodine atom, and a fluorine atom is preferable.

In the halogenated alkyl group, the percentage of the number of halogen atoms based on the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that some or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include halogen atoms, hetero atoms, alkyl groups, and groups represented by the formula X-Q¹- (wherein Q¹ represents a divalent linking group containing an oxygen atom, and X represents a hydrocarbon group of 3 to 30 carbon atoms which may have a substituent).

Examples of the halogen atoms and alkyl groups include the same halogen atoms and alkyl groups as those described above with respect to the halogenated alkyl group for $R^{4'''}$.

Examples of the hetero atoms include an oxygen atom, a nitrogen atom, and a sulfur atom.

In the group represented by formula X-Q¹-, Q¹ represents a divalent linking group containing an oxygen atom.

Q¹ may also contain atoms other than the oxygen atom. Examples of atoms other than the oxygen atom include a carbon atom, a hydrogen atom, a sulfur atom and a nitrogen atom.

Examples of the divalent linking group containing an oxygen atom include non-hydrocarbon-based oxygen atom-containing linking groups such as an oxygen atom (an ether bond, —O—), an ester bond (—C(=O)—O—), an amido bond (—C(=O)—NH—), a carbonyl group (—C(=O)—), a carbonate bond (—O—C(=O)—O—), and combinations of these non-hydrocarbon-based oxygen atom-containing linking groups with an alkylene group.

Specific examples of these combinations of include —$R^{91}$—O—, —$R^{92}$—O—C(=O)—, and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably contains 1 to 12 carbon atoms, more preferably 1 to 5 carbon atoms, and most preferably 1 to 3 carbon atoms.

Specific examples of alkylene group include a methylene group [—CH₂—]; alkylmethylene groups such as —CH(CH₃)—, —CH(CH₂CH₃)—, —C(CH₃)₂—, —C(CH₃)(CH₂CH₃)—, —C(CH₃)(CH₂CH₂CH₃)— and —C(CH₂CH₃)₂—; an ethylene group [—CH₂CH₂—]; alkylethylene groups such as —CH(CH₃)CH₂—, —CH(CH₃)CH(CH₃)—, —C(CH₃)₂CH₂— and —CH(CH₂CH₃)CH₂—; a trimethylene group (n-propylene group) [—CH₂CH₂CH₂—]; alkyltrimethylene groups such as —CH(CH₃)CH₂CH₂— and —CH₂CH(CH₃)CH₂—; a tetramethylene group [—CH₂CH₂CH₂CH₂—]; alkyltetramethylene groups such as —CH(CH₃)CH₂CH₂CH₂— and —CH₂CH(CH₃)CH₂CH₂—; and a pentamethylene group [—CH₂CH₂CH₂CH₂CH₂—].

Q¹ is preferably a divalent linking group containing an ester linkage or ether linkage, and more preferably a group represented by —$R^{91}$—O—, —$R^{92}$—O—C(=O)— or —C(=O)—O—$R^{93}$—O—C(=O)—.

In the group represented by the formula $X-Q^1-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12 carbon atoms. This number of carbon atoms does not include any carbon atoms within substituents.

Specific examples of the aromatic hydrocarbon group include aryl groups, which are aromatic hydrocarbon rings having one hydrogen atom removed therefrom, such as a phenyl group, biphenyl group, fluorenyl group, naphthyl group, anthryl group or phenanthryl group, and arylalkyl groups such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, a portion of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which a portion of the carbon atoms constituting the ring within an aforementioned aryl group have been substituted with a hetero atom such as an oxygen atom, a sulfur atom or a nitrogen atom, and heteroarylalkyl groups in which a portion of the carbon atoms constituting the aromatic hydrocarbon ring within an aforementioned arylalkyl group have been substituted with an aforementioned hetero atom.

In the latter example, examples of the substituent for the aromatic hydrocarbon group include an alkyl group, alkoxy group, halogen atom, halogenated alkyl group, hydroxyl group or oxygen atom (=O) or the like.

The alkyl group as the substituent for the aromatic hydrocarbon group is preferably an alkyl group having 1 to 5 carbon atoms, and a methyl group, ethyl group, propyl group, n-butyl group or tert-butyl group is particularly desirable.

The alkoxy group as the substituent for the aromatic hydrocarbon group is preferably an alkoxy group having 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which some or all of the hydrogen atoms within an aforementioned alkyl group have been substituted with an aforementioned halogen atom.

The aliphatic hydrocarbon group for X may be either a saturated aliphatic hydrocarbon group or an unsaturated aliphatic hydrocarbon group. Further, the aliphatic hydrocarbon group may be linear, branched or cyclic.

In the aliphatic hydrocarbon group for X, a portion of the carbon atoms constituting the aliphatic hydrocarbon group may be substituted with a substituent containing a hetero atom, and/or some or all of the hydrogen atoms constituting the aliphatic hydrocarbon group may be substituted with a substituent containing a hetero atom.

There are no particular limitations on this "hetero atom" within X, as long as it is an atom other than a carbon atom or a hydrogen atom. Examples of the hetero atom include a halogen atom, oxygen atom, sulfur atom and nitrogen atom. Examples of the halogen atom include a fluorine atom, chlorine atom, iodine atom and bromine atom.

The substituent containing a hetero atom may consist solely of the hetero atom, or may be a group that also contains a group or atom other than a hetero atom.

Specific examples of the substituent for substituting a portion of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, any of these substituent may be included within the ring structure of the aliphatic hydrocarbon group.

Examples of the substituent for substituting some or all of the hydrogen atoms include an alkoxy group, halogen atom, halogenated alkyl group, hydroxyl group, oxygen atom (=O) and cyano group.

The alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group includes a group in which some or all of the hydrogen atoms within an alkyl group of 1 to 5 carbon atoms (such as a methyl group, ethyl group, propyl group, n-butyl group or tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group or docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group or 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30, still more preferably 5 to 20, still more preferably 6 to 15, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure thereof, the hetero atom-containing substituent is preferably —O—, —C(=O)—O—, —S—, —S(=O)$_2$— or —S(=O)$_2$—O—. Specific examples of such aliphatic cyclic groups include the aliphatic cyclic groups represented by formulas (L1) to (L5) and (S1) to (S4) shown below.

[Chemical formula 55]

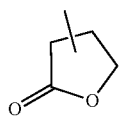
(L1)

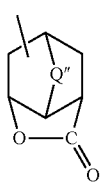
(L2)

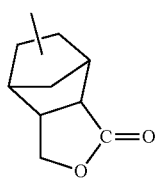
(L3)

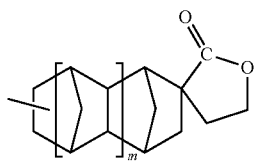
(L4)

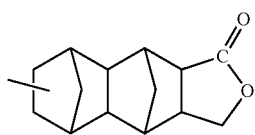
(L5)

-continued

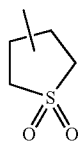
(S1)

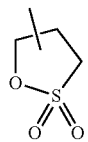
(S2)

(S3)

(S4)

In the formulas, Q″ represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms), and m represents an integer of 0 or 1.

Examples of the alkylene groups for Q″, R$^{94}$ and R$^{95}$ include the same alkylene groups as those described above for R$^{91}$ to R$^{93}$.

In these aliphatic cyclic groups, a portion of the hydrogen atoms bonded to the carbon atoms that constitute the ring structure may be substituted with a substituent. Examples of this substituent include an alkyl group, alkoxy group, halogen atom, halogenated alkyl group, hydroxyl group or oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting some or all of the hydrogen atoms.

Of the above options, X is preferably a cyclic group which may have a substituent. This cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic group which may have a substituent is preferable. As this polycyclic aliphatic group, groups in which one or more hydrogen atoms have been removed from an aforementioned polycycloalkane, and groups represented by formulas (L2) to (L5), and (S3) and (S4) above are preferable.

Further, in the present invention, X is preferably a group containing a polar region, as such groups yield superior improvements in the lithography properties and resist pattern shape.

Examples of these groups containing a polar region include groups in which a portion of the carbon atoms that constitute the aliphatic cyclic group of the aforementioned group X have been substituted with a substituent containing a hetero atom, namely with a substituent such as —O—, —C(=O)—O—, —C(=O)—, —O—C(=O)—O—, —C(=O)—NH—, —NH— (wherein H may be substituted with a substituent such as an alkyl group or acyl group or the like), —S—, —S(=O)$_2$— or —S(=O)$_{2\text{-O}}$.

In the present invention, $R^{4\prime\prime\prime}$ preferably has X-Q$^1$- as a substituent. In such a case, $R^{4\prime\prime\prime}$ is preferably a group represented by the formula X-Q$^1$-Y$^1$— (wherein Q$^1$ and X are the same as defined above, and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, examples of the alkylene group represented by Y$^1$ include those alkylene groups described above for Q$^1$ in which the number of carbon atoms is from 1 to 4.

Examples of the fluorinated alkylene group for Y$^1$ include groups in which some or all of the hydrogen atoms of an aforementioned alkylene group have been substituted with fluorine atoms.

Specific examples of Y$^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—, —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—, —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)— and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$— and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of substituents which the alkylene group or fluorinated alkylene group may have include alkyl groups of 1 to 4 carbon atoms, alkoxy groups of 1 to 4 carbon atoms, and a hydroxyl group.

In formula (b-2), each of $R^{5\prime\prime\prime}$ and $R^{6\prime\prime\prime}$ independently represents an aryl group or alkyl group. At least one of $R^{5\prime\prime\prime}$ and $R^{6\prime\prime\prime}$ represents an aryl group. It is preferable that $R^{5\prime\prime\prime}$ and $R^{6\prime\prime\prime}$ both represent aryl groups.

Examples of the aryl group for $R^{5\prime\prime\prime}$ and $R^{6\prime\prime\prime}$ include the same aryl groups as those listed above for $R^{1\prime\prime\prime}$ to $R^{3\prime\prime\prime}$ in formula (b-1).

Examples of the alkyl group for $R^{5\prime\prime\prime}$ and $R^{6\prime\prime\prime}$ include the same alkyl groups as those listed above for $R^{1\prime\prime\prime}$ to $R^{3\prime\prime\prime}$ in formula (b-1).

It is particularly desirable that $R^{5\prime\prime\prime}$ and $R^{6\prime\prime\prime}$ both represent phenyl groups.

As $R^{4\prime\prime\prime}$ in formula (b-2), the same groups as those mentioned above for $R^{4\prime\prime\prime}$ in formula (b-1) can be used.

Specific examples of the onium salt-based acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate, di(1-naphthyl)phenylsulfonium trifluoromethanesulfonate, heptafluoropropanesulfonate or nonafluorobutanesulfonate, 1-phenyltetrahydrothiophenium trifluoromethanesulfonate, heptafluoropropanesulfonate or nonafluorobutanesulfonate, 1-(4-methylphenyl)tetrahydrothiophenium trifluoromethanesulfonate, heptafluoropropanesulfonate or nonafluorobutanesulfonate, 1-(3,5-dimethyl-4-hydroxyphenyl)tetrahydrothiophenium trifluoromethanesulfonate, heptafluoropropanesulfonate or nonafluorobutanesulfonate, 1-(4-methoxynaphthalene-1-yl)tetrahydrothiophenium trifluoromethanesulfonate, heptafluoropropanesulfonate or nonafluorobutanesulfonate, 1-(4-ethoxynaphthalene-1-yl)tetrahydrothiophenium trifluoromethanesulfonate, heptafluoropropanesulfonate or nonafluorobutanesulfonate, 1-(4-n-butoxynaphthalene-1-yl)tetrahydrothiophenium trifluoromethanesulfonate, heptafluoropropanesulfonate or nonafluorobutanesulfonate, 1-phenyltetrahydrothiopyranium trifluoromethanesulfonate, heptafluoropropanesulfonate or nonafluorobutanesulfonate, 1-(4-hydroxyphenyl)tetrahydrothiopyranium trifluoromethanesulfonate, heptafluoropropanesulfonate or nonafluorobutanesulfonate, 1-(3,5-dimethyl-4-hydroxyphenyl)tetrahydrothiopyranium trifluoromethanesulfonate, heptafluoropropanesulfonate or nonafluorobutanesulfonate, and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced by either an alkylsulfonate such as methanesulfonate, n-propanesulfonate, n-butanesulfonate, n-octanesulfonate, 1-adamantanesulfonate or 2-norbornanesulfonate; or a sulfonate such as d-camphor-10-sulfonate, benzenesulfonate, perfluorobenzenesulfonate or p-toluenesulfonate.

Further, onium salts in which the anion moiety of these onium salts has been replaced by an anion moiety represented by any one of chemical formulas (b1) to (b8) shown below can also be used.

[Chemical formula 56]

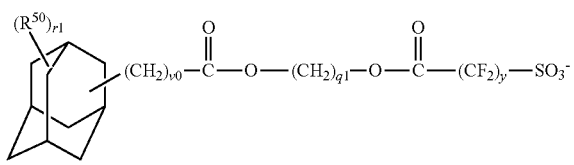
(b1)

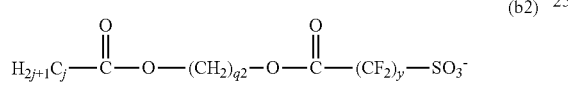
(b2)

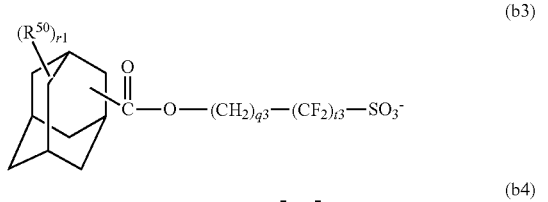
(b3)

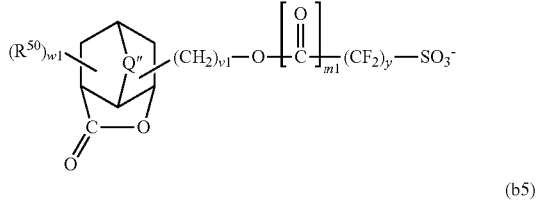
(b4)

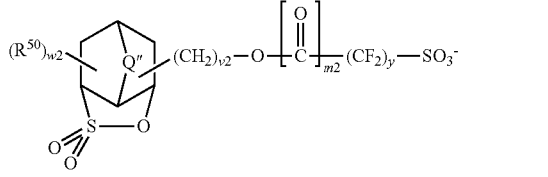
(b5)

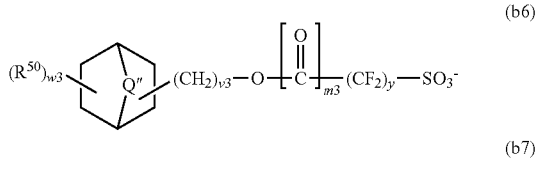
(b6)

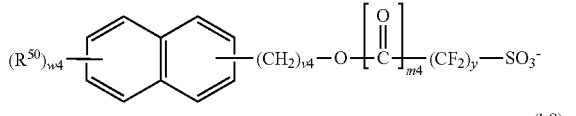
(b7)

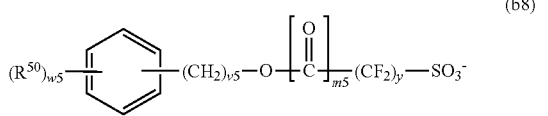
(b8)

In the formulas, y represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, j represents an integer of 1 to 20, $R^{50}$ represents a substituent, each of m1 to m5 independently represents 0 or 1, each of v0 to v5 independently represents an integer of 0 to 3, each of w1 to w5 independently represents an integer of 0 to 3, and Q″ is the same as defined above.

Examples of the substituent for $R^{50}$ include the same groups as those which the aforementioned aliphatic hydrocarbon group or aromatic hydrocarbon group for X may have as a substituent.

If there are two or more $R^{50}$ groups, as indicated by the values r1 and r2, and w1 to w5, then the plurality of $R^{50}$ groups within the compound may be the same or different from each other.

Further, onium salt-based acid generators in which the anion moiety ($R^{4''}SO_3^-$) in general formula (b-1) or (b-2) is replaced by an anion moiety represented by general formula (b-3) or (b-4) shown below (and the cation moiety is the same as cation moiety within formula (b-1) or (b-2)) may also be used as the onium salt-based acid generator.

[Chemical formula 57]

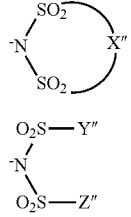
(b-3)

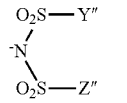
(b-4)

In the above formula, X″ represents an alkylene group of 2 to 6 carbon atoms in which at least one hydrogen atom has been substituted with a fluorine atom, and each of Y″ and Z″ independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y″ and Z″ independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X″ or the alkyl group for Y″ and Z″ within the above-mentioned ranges of the number of carbon atoms, the more the solubility in a resist solvent is improved, and therefore a smaller number is preferred.

Further, in the alkylene group for X″ or the alkyl group for Y″ and Z″, it is preferable that the number of hydrogen atoms substituted with fluorine atoms is as large as possible, because the acid strength increases and the transparency to high energy radiation of 200 nm or less or electron beam is improved.

The ratio of fluorine atoms within the alkylene group or alkyl group, namely the fluorination ratio, is preferably within a range from 70 to 100%, and more preferably from 90 to 100%. It is particularly desirable that the alkylene group or alkyl group is a perfluoroalkylene or perfluoroalkyl group in which all hydrogen atoms are substituted with fluorine atoms.

Further, onium salt-based acid generators in which the anion moiety ($R^{4''}SO_3^-$) in general formula (b-1) or (b-2) is replaced by $R^a$—$COO^-$ (wherein $R^a$ represents an alkyl group or a fluorinated alkyl group) (and the cation moiety is the same as cation moiety within formula (b-1) or (b-2)) may also be used as the onium salt-based acid generator.

Specific examples of the group $R^a$ include the same groups as those listed above for $R^{4''}$ in formula (b-1) or (b-2).

Specific examples of $R^a$—$COO^-$ include a trifluoroacetate ion, an acetate ion, and a 1-adamantanecarboxylate ion.

Furthermore, a sulfonium salt having a cation moiety represented by general formula (b-5) or (b-6) shown below may also be used as an onium salt-based acid generator.

[Chemical formula 58]

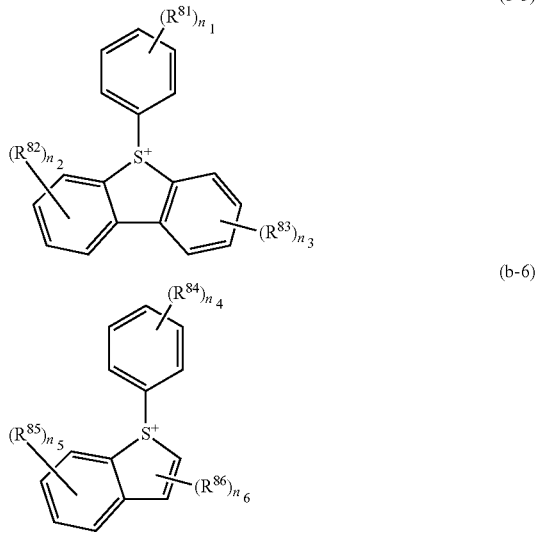

(b-5)

(b-6)

In the above formula, each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

The alkyl group for $R^{81}$ to $R^{86}$ is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have been substituted with hydroxyl groups, and examples thereof include a hydroxymethyl group, hydroxyethyl group and hydroxypropyl group.

When the subscripts $n_1$ to $n_6$ of $R^{81}$ to $R^{86}$ represent an integer of 2 or more, the plurality of $R^{81}$ to $R^{86}$ groups may be the same or different.

$n_1$ is preferably 0 to 2, more preferably 0 or 1, and still more preferably 0.

It is preferable that each of $n_2$ and $n_3$ independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

There are no particular limitations on the anion moiety of the sulfonium salt having a cation moiety represented by formula (b-5) or (b-6), and the same anion moieties as those used within conventionally proposed onium salt-based acid generators may be used. Examples of such anion moieties include fluorinated alkylsulfonate ions such as anion moieties ($R^{4''}SO_3^-$) for onium salt-based acid generators represented by general formula (b-1) or (b-2) shown above, and anion moieties represented by general formula (b-3) or (b-4) shown above.

In the present description, an oxime sulfonate-based acid generator is a compound having at least one group represented by general formula (B-1) shown below, and has a feature of generating acid upon irradiation (exposure). Such oxime sulfonate-based acid generators are widely used for chemically amplified resist compositions, and any of these known compounds may be selected as appropriate.

[Chemical formula 59]

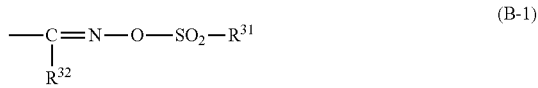

(B-1)

In formula (B-1), each of $R^{31}$ and $R^{32}$ independently represents an organic group.

The organic group for $R^{31}$ and $R^{32}$ refers to a group containing a carbon atom, and may also include atoms other than carbon atoms (such as a hydrogen atom, oxygen atom, nitrogen atom, sulfur atom or halogen atom (such as a fluorine atom or chlorine atom) or the like).

As the organic group for $R^{31}$, a linear, branched or cyclic alkyl group or aryl group is preferable. The alkyl group or aryl group may have a substituent. There are no particular limitations on the substituent, and examples thereof include a fluorine atom and a linear, branched or cyclic alkyl group having 1 to 6 carbon atoms. The expression that the alkyl group or aryl group "may have a substituent" means that some or all of the hydrogen atoms of the alkyl group or aryl group may be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As the organic group for $R^{31}$, an alkyl group of 1 to 4 carbon atoms which has no substituent, or a fluorinated alkyl group of 1 to 4 carbon atoms is particularly desirable.

As the organic group for $R^{32}$, a linear, branched or cyclic alkyl group, an aryl group, or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate-based acid generator include compounds represented by general formula (B-2) or (B-3) shown below.

[Chemical formula 60]

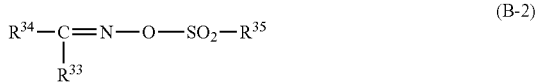

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical formula 61]

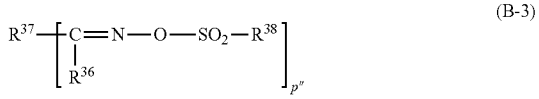

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenyl group, fluorenyl group, naphthyl group, anthryl group or phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group or halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more fluorinated, still more preferably 90% or more fluorinated. A completely fluorinated alkyl group in which 100% of the hydrogen atoms have been substituted with fluorine atoms is particularly desirable.

In general formula (B-3), examples of the alkyl group having no substituent and the halogenated alkyl group for $R^{36}$ include the same groups as those described above for the alkyl group having no substituent and the halogenated alkyl group for $R^{33}$ within formula (B-2).

Examples of the divalent or trivalent aromatic hydrocarbon group for $R^{37}$ include groups in which an additional one or two hydrogen atoms have been removed from the aryl group for $R^{34}$ within the above formula (B-2).

Examples of the alkyl group having no substituent or the halogenated alkyl group for $R^{38}$ include the same groups as those exemplified above for the alkyl group having no substituent or the halogenated alkyl group for $R^{35}$ within formula (B-2).

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p- methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in International Patent Publication No. 2004/074242 pamphlet (Examples 1 to 40 described on pages 65 to 85) may also be used favorably.

Furthermore, the following compounds may also be used as preferred examples.

[Chemical formula 62]

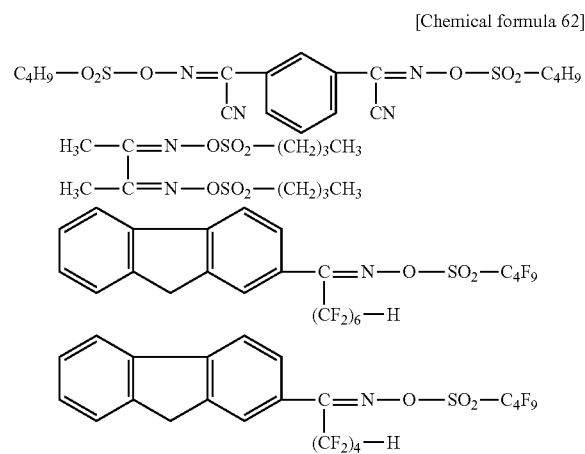

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or two or more types of acid generators may be used in combination.

In the present invention, the use of an onium salt-based acid generator having a fluorinated alkylsulfonate ion as the anion as the component (B) is particularly desirable.

The amount of the component (B) within the resist composition of the present invention is preferably within a range from 0.5 to 50 parts by weight, and more preferably 1 to 40 parts by weight, relative to 100 parts by weight of the component (A). By ensuring that the amount of the component (B) is within the above-mentioned range, formation of a pattern can be performed satisfactorily. Further, by virtue of the above-mentioned range, a uniform solution can be obtained and the storage stability tends to improve.

<Component (G)>

In the present invention, the term "epoxy resin" includes both comparatively low molecular weight polymers (prepolymers) having at least two epoxy groups within each molecule and a molecular weight of not less than 1,000 (and preferably 2,000 or greater), as well as thermosetting resins produced by a ring-opening reaction of the epoxy groups of such prepolymers.

Of these epoxy resins, the component (G) is preferably an epoxy resin having unopened epoxy groups, as such resins produce excellent adhesion between the resist film and the substrate, and better suppress pattern collapse. Examples of such epoxy resins include resins in which an epoxy group represented by general formula (g0-1) shown below exists partway along the main chain of a polymeric compound, with the carbon atoms of the epoxy group forming a portion of the main chain, resins in which an epoxy group represented by general formula (g0-2) shown below is included within the side chains of a polymeric compound, and resins in which an epoxy group represented by general formula (g0-2) shown below forms a terminal of the main chain of a polymeric compound.

[Chemical formula 63]

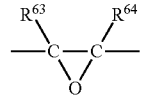 (g 0-1)

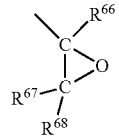 (g 0-2)

In the above formulas, each of $R^{63}$ and $R^{64}$ independently represents a hydrogen atom or an alkyl group, and each of $R^{66}$ to $R^{68}$ independently represents a hydrogen atom or an alkyl group.

In formula (g0-1), each of $R^{63}$ and $R^{64}$ independently represents a hydrogen atom or an alkyl group. The alkyl group for $R^{63}$ and $R^{64}$ is preferably an alkyl group of 1 to 5 carbon atoms, more preferably a methyl group or ethyl group, and most preferably a methyl group. Of the various possibilities, an epoxy group in which each of $R^{63}$ and $R^{64}$ independently represents a hydrogen atom or a methyl group is preferred.

In formula (g0-2), each of $R^{66}$ to $R^{68}$ independently represents a hydrogen atom or an alkyl group. The alkyl group for $R^{66}$ to $R^{68}$ is preferably an alkyl group of 1 to 5 carbon atoms, more preferably a methyl group or ethyl group, and most preferably a methyl group. Of the various possibilities, $R^{66}$ preferably represents a hydrogen atom or a methyl group, whereas each of $R^{67}$ and $R^{68}$ preferably independently represents a hydrogen atom or a methyl group, with those cases where $R^{67}$ and $R^{68}$ both represent hydrogen atoms being particularly desirable.

Of the above possibilities, resins in which an epoxy group exists partway along the main chain of a polymeric compound, with the carbon atoms of the epoxy group forming a portion of the main chain, and resins in which an epoxy group is included within the side chains of a polymeric compound are preferred.

A more specific example of the component (G) is a resin having a repeating structural unit (g1) containing an epoxy group.

Resins having this type of repeating structure are preferred, because the adhesion of the resist film to the substrate or the like improves as the weight average molecular weight of the epoxy resin is increased.

(Structural Unit (g1))

There are no particular limitations on the structural unit (g1) containing an epoxy group, and examples include structural units formed from an organic group containing an epoxy group, wherein the carbon atoms of the epoxy group form a portion of the main chain.

Further, the structural unit (g1) may also be a structural unit derived from a hydroxystyrene, a structural unit derived from an acrylate ester, or a structural unit having a cyclic main chain (hereafter referred to as a "cyclic main chain structural unit"). Of these, structural units derived from acrylate esters are the most desirable.

In the description and claims of the present invention, the expression "structural unit derived from a hydroxystyrene" describes a structural unit formed by cleavage of the ethylenic double bond of a hydroxystyrene.

A "structural unit derived from an acrylate ester" describes a structural unit formed by cleavage of the ethylenic double bond of an acrylate ester.

Further, in the present description, the expression "cyclic main chain structural unit" describes a structural unit having a monocyclic or polycyclic structure, wherein at least one, and preferably two or more, of the carbon atoms within a ring of the cyclic structure constitute part of the main chain.

The term "hydroxystyrene" includes hydroxystyrene, compounds in which the hydrogen atom at the α-position of a hydroxystyrene has been substituted with another substituent such as an alkyl group, and derivatives thereof. Unless specified otherwise, the α-position (α-position carbon atom) of a structural unit derived from a hydroxystyrene refers to the carbon atom to which the benzene ring is bonded.

Examples of the alkyl group for the substituent at the α-position of the hydroxystyrene include alkyl groups of 1 to 5 carbon atoms, and specific examples include linear and branched alkyl groups such as a methyl group, ethyl group, propyl group, isopropyl group, n-butyl group, isobutyl group, tert-butyl group, pentyl group, isopentyl group or neopentyl group.

Examples of preferred structures for the structural unit (g1) include structural units represented by general formula (g1-1) shown below, and structural units represented by general formula (g1-2) shown below.

[Chemical formula 64]

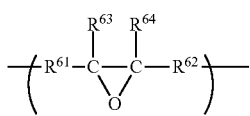

(g1-1)

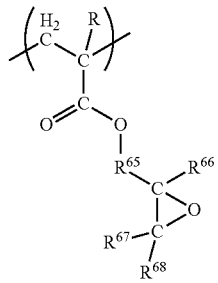

(g1-2)

In the formulas, each of $R^{61}$ and $R^{62}$ independently represents a divalent hydrocarbon group which may have a substituent, each of $R^{63}$ and $R^{64}$ independently represents a hydrogen atom or an alkyl group, R represents a hydrogen atom, an alkyl group of 1 to 5 carbon atoms or a halogenated alkyl group of 1 to 5 carbon atoms, $R^{65}$ represents a divalent hydrocarbon group which may have a substituent, and each of $R^{66}$ to $R^{68}$ independently represents a hydrogen atom or an alkyl group.

In formula (g1-1), each of $R^{61}$ and $R^{62}$ independently represents a divalent hydrocarbon group which may have a substituent.

The expression that the hydrocarbon group "may have a substituent" means that some or all of the hydrogen atoms within the hydrocarbon group may be substituted with an atom other than a hydrogen atom or with a group.

The hydrocarbon group for $R^{61}$ or $R^{62}$ may be either an aliphatic hydrocarbon group or an aromatic hydrocarbon group.

An "aliphatic hydrocarbon group" describes a hydrocarbon group having no aromaticity. The aliphatic hydrocarbon group may be saturated or unsaturated, but is preferably saturated.

Examples of the aliphatic hydrocarbon group for $R^{61}$ or $R^{62}$ include linear or branched aliphatic hydrocarbon groups, and aliphatic hydrocarbon groups containing a ring in the structure thereof.

The linear or branched aliphatic hydrocarbon group is preferably a group of 1 to 10 carbon atoms, more preferably 1 to 8 carbon atoms, still more preferably 1 to 5 carbon atoms, and most preferably 1 or 2 carbon atoms.

The linear aliphatic hydrocarbon group is preferably a linear alkylene group, and specific examples include a methylene group [—$CH_2$—], ethylene group [—$(CH_2)_2$—], trimethylene group [—$(CH_2)_3$—], tetramethylene group [—$(CH_2)_4$—], or pentamethylene group [—$(CH_2)_5$—].

The branched aliphatic hydrocarbon group is preferably a branched alkylene group, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (hereafter also referred to as a "chain-like aliphatic hydrocarbon group") may or may not have a substituent. Examples of the substituent include a fluorine atom, a fluorinated alkyl group of 1 to 5 carbon atoms, and an oxygen atom (═O).

Examples of the aliphatic hydrocarbon group containing a ring in the structure thereof include cyclic aliphatic hydrocarbon groups (groups in which two or more hydrogen atoms have been removed from an aliphatic hydrocarbon ring), and groups in which the cyclic aliphatic hydrocarbon group is bonded to the terminal of an aforementioned chain-like aliphatic hydrocarbon group or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two or more hydrogen atoms have been removed from a monocycloalkane of 3 to 6 carbon atoms is preferable. Examples of the monocycloalkane include cyclopentane and cyclohexane. As the polycyclic group, a group in which two or more hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

Examples of the aromatic hydrocarbon group for $R^{61}$ or $R^{62}$ include divalent aromatic hydrocarbon groups in which an additional one hydrogen atom has been removed from the aromatic hydrocarbon nucleus of a monovalent aromatic hydrocarbon group such as a phenyl group, biphenyl group, fluorenyl group, naphthyl group, anthryl group or phenanthryl group; aromatic hydrocarbon groups in which a portion of the carbon atoms that constitute an aforementioned divalent aromatic hydrocarbon group have been substituted with a hetero atom such as an oxygen atom, sulfur atom or nitrogen atom; and aromatic hydrocarbon groups in which an additional one hydrogen atom has been removed from the aromatic hydrocarbon nucleus of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

As $R^{61}$ or $R^{62}$, a linear aliphatic hydrocarbon group is preferable, a linear alkylene group is more preferable, a linear alkylene group of 1 to 5 carbon atoms is still more preferable, and a methylene group is the most desirable.

In formula (g1-1), each of $R^{63}$ and $R^{64}$ independently represents a hydrogen atom or an alkyl group.

The alkyl group for $R^{63}$ and $R^{64}$ is preferably an alkyl group of 1 to 5 carbon atoms, more preferably a methyl group or ethyl group, and most preferably a methyl group. Of the various possibilities, each of $R^{63}$ and $R^{64}$ preferably represents a hydrogen atom or a methyl group.

In formula (g1-2), R represents a hydrogen atom, an alkyl group of 1 to 5 carbon atoms or a halogenated alkyl group of 1 to 5 carbon atoms, and is the same as defined above for R in the description of component (A1-1). R is preferably a hydrogen atom or an alkyl group of 1 to 5 carbon atoms, and is most preferably a hydrogen atom or a methyl group.

In formula (g1-2), $R^{65}$ represents a divalent hydrocarbon group which may have a substituent. Examples of $R^{65}$ include the same groups as those listed above for $R^{61}$ and $R^{62}$ in formula (g1-1), and of these, a linear aliphatic hydrocarbon group is preferable, a linear alkylene group is more preferable, a linear alkylene group of 1 to 5 carbon atoms is still more preferable, and a methylene group is the most desirable.

In formula (g1-2), each of $R^{66}$ to $R^{68}$ independently represents a hydrogen atom or an alkyl group. The alkyl group for $R^{66}$ to $R^{68}$ is preferably an alkyl group of 1 to 5 carbon atoms, more preferably a methyl group or ethyl group, and most preferably a methyl group. Of the various possibilities, each of $R^{66}$ to $R^{68}$ preferably represents a hydrogen atom or a methyl group.

Specific examples of the structural units represented by the above general formulas (g1-1) and (g1-2) are shown below.

In each of the following formulas, $R^{\alpha}$ represents a hydrogen atom, a methyl group or a trifluoromethyl group.

[Chemical formula 65]

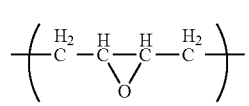

(g1-1-1)

[Chemical formula 66]

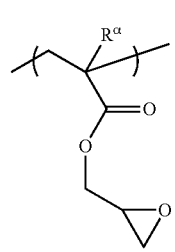

(g1-2-1)

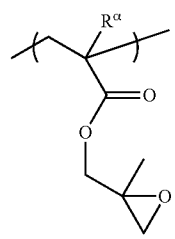

(g1-2-2)

The component (G) may include either a single type of structural unit (g1) or a combination of two or more types.

Of the various possibilities, in those cases where the component (G) includes a structural unit represented by formula (g1-1), a polymer (homopolymer) formed from a repeating single type of structural unit represented by formula (g1-1) is preferred.

In those cases where the component (G) includes a structural unit represented by formula (g1-2), a copolymer containing the structural unit represented by formula (g1-2) and one or more of the other structural units described below is preferred.

The amount of the structural unit (g1) within the component (G), based on the combined total of all the structural units that constitute the component (G), is preferably at least 10 mol %, more preferably 20 mol % or greater, still more preferably 30 mol % or greater, and most preferably 35 mol % or greater. This amount of the structural unit (g1) may also be 100 mol %. By ensuring that the amount of the structural unit (g1) is at least as large as the lower limit of the above range, cross-linking of the component (G) during resist pattern formation can be promoted, thereby improving the adhesion of the resist film to substrates and the like, and pattern collapse can also be better suppressed. Further, in the case of substrates that have not been subjected to a treatment with hexamethyldisilazane (HMDS) or the like, pattern collapse can be inhibited even more reliably.

Particularly in those cases where the component (G) is a copolymer, the amount of the structural unit (g1) within the copolymer, based on the combined total of all the structural units that constitute the component (G), is preferably within a range from 10 to 60 mol %, more preferably from 20 to 50 mol %, and still more preferably from 30 to 40 mol %. By ensuring that this amount is at least as large as the lower limit of the above-mentioned range, the adhesion of the resist film to the substrate or the like can be improved and pattern collapse can be better suppressed during resist pattern formation. Further, in the case of substrates that have not been subjected to a treatment with hexamethyldisilazane (HMDS) or the like, pattern collapse can be inhibited even more reliably. By ensuring that the mount of the structural unit (g1) is not more than the upper limit of the above-mentioned range, lithography properties such as the depth of focus (DOF), resolution and exposure margin (EL margin) can be improved. Further, a better balance can be achieved with the other structural units.

(Other Structural Units (g2))

If required, the component (G) may also include another structural unit (g2) besides the structural unit (g1), provided the inclusion of this other structural unit does not impair the effects of the present invention.

There are no particular limitations on this other structural unit (g2), although a structural unit derived from a compound that is copolymerizable with the compound that gives rise to the structural unit (g1) is preferred.

Specific examples of preferred forms of the structural unit (g2) include:

structural units derived from acrylic acid and structural units derived from methacrylic acid (hereafter referred to jointly as "structural unit (g21)"), structural units derived from alkyl acrylates such as methyl acrylate and ethyl acrylate (wherein the alkyl group preferably contains 1 to 5 carbon atoms) (hereafter referred to as "structural unit (g22)");

structural units derived from alkyl methacrylates such as methyl methacrylate and ethyl methacrylate (wherein the alkyl group preferably contains 1 to 5 carbon atoms) (hereafter referred to as "structural unit (g23)"); and the structural units (a1) to (a6) described above in connection with the component (A1-1). Of the structural units (a1) to (a6), the structural units (a1), (a2) and (a4) are preferred, as they yield better suppression of pattern collapse and improved lithography properties, and the structural unit (a4) is particularly desirable.

The component (G) may include either a single type of structural unit (g2) or a combination of two or more types.

The amount of the structural unit (g2) within the component (G), based on the combined total of all the structural units that constitute the component (G), is preferably within a range from 10 to 70 mol %, more preferably from 20 to 65 mol %, and still more preferably from 30 to 65 mol %. By ensuring that this amount is at least as large as the lower limit of the above-mentioned range, lithography properties such as the depth of focus (DOF), resolution and exposure margin (EL margin) can be improved. By ensuring that the mount of the structural unit (g2) is not more than the upper limit of the above-mentioned range, pattern collapse can be better suppressed during resist pattern formation. Further, a better balance can be achieved with the structural unit (g1).

In the resist composition of the present invention, as the component (G), either a single epoxy resin or a combination of two or more epoxy resins may be used.

In the present invention, preferred examples of the component (G) include:

polymers (homopolymers) composed of a repeating structural unit (g1), and copolymers having a structural unit (g1) and a structural unit (g2).

As the component (G), epoxy resins having the type of structural unit shown below are particularly desirable.

[Chemical formula 67]

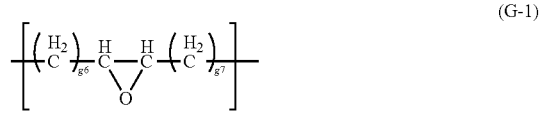

In formula (G-1), each of g6 and g7 independently represents an integer of 1 to 5.

An epoxy resin according to formula (G-1) is a homopolymer composed of repeating structural units represented by the formula (G-1).

In the above formula, each of g6 and g7 preferably independently represents 1 or 2, and more preferably 1. Resins in which g6 and g7 are both 1 are particularly desirable.

[Chemical formula 68]

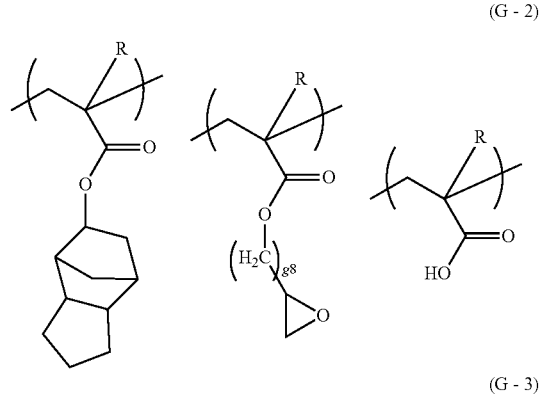

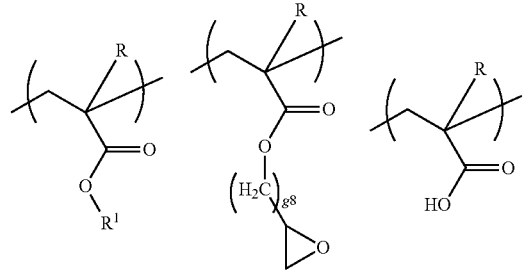

In the above formulas, R is the same as defined above for R in formula (g1-2), wherein the plurality of R groups may be the same or different, g8 represents an integer of 1 to 8, and $R^1$ represents an alkyl group.

In the above formulas, R is preferably a hydrogen atom or an alkyl group of 1 to 5 carbon atoms, and is most preferably a hydrogen atom or a methyl group.

g8 is preferably an integer of 1 to 5, more preferably either 1 or 2, and most preferably 1.

$R^1$ is preferably an alkyl group of 1 to 5 carbon atoms, more preferably a methyl group or ethyl group, and most preferably a methyl group.

The polymer (homopolymer) or copolymer having a structure including a repeating structural unit (g1) can be obtained, for example, by subjecting monomers that give rise to the desired structural units to a conventional radical polymerization or the like using a radical polymerization initiator such as azobisisobutyronitrile (AIBN) or dimethyl azobisisobutyrate.

The weight average molecular weight (Mw) (the polystyrene-equivalent molecular weight determined by gel permeation chromatography) of the component (G) is preferably within a range from 5,000 to 30,000, more preferably from 7,000 to 25,000, and still more preferably from 8,000 to 20,000. By ensuring that the weight average molecular weight is not more than the upper limit of the above-mentioned range, the component (G) exhibits sufficient solubility in a resist solvent to enable its use as a component of a resist composition, whereas ensuring that the weight average molecular weight is at least as large as the lower limit of the above range yields better adhesion of the resist film to the substrate or the like, and better suppression of pattern collapse.

Further, the dry etching resistance and resist pattern shape also tend to improve.

Further, the dispersity (Mw/Mn) is preferably within a range from 1.0 to 6.5, more preferably from 1.5 to 6, and most preferably from 1.5 to 5.

The amount of the component (G) within the resist composition of the present invention is preferably within a range from 0.1 to 5 parts by weight, more preferably from 0.3 to 4 parts by weight, and still more preferably from 0.5 to 2.0 parts by weight, relative to 100 parts by weight of the component (A). Provided the amount is at least as large as the lower limit of the above-mentioned range, pattern collapse can be better suppressed during resist pattern formation. Further, in the case of substrates that have not been subjected to a treatment with hexamethyldisilazane (HMDS) or the like, pattern collapse can be inhibited even more reliably. By ensuring that the amount of the component (G) is not more than the upper limit of the above range, residues can be reduced during resist pattern formation. Further, lithography properties such as the depth of focus (DOF), resolution, exposure margin (EL margin) and resist pattern shape can be improved.

<Optional Components>
[Component (C)]

In those cases where the resist composition of the present invention is a negative-type resist composition, the component (A) includes the component (A2-1), and preferably also includes a cross-linking component (C) (hereafter referred to as "component (C)").

There are no particular limitations on the component (C), which may be selected appropriately from the various cross-linkers used within conventional chemically amplified negative resist compositions.

Examples include aliphatic cyclic hydrocarbons containing a hydroxyl group, a hydroxyalkyl group, or a hydroxyl group and a hydroxyalkyl group, as well as oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups, as well as compounds having an epoxy group.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, compounds that use glycoluril are referred to as glycoluril-based cross-linkers, and compounds that use a compound having an epoxy group are referred to as epoxy-based cross-linkers.

As the component (C), at least one type of cross-linker selected from the group consisting of melamine-based cross-linkers, urea-based cross-linkers, alkylene urea-based cross-linkers, glycoluril-based cross-linkers and epoxy-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (C-1) shown below.

[Chemical formula 69]

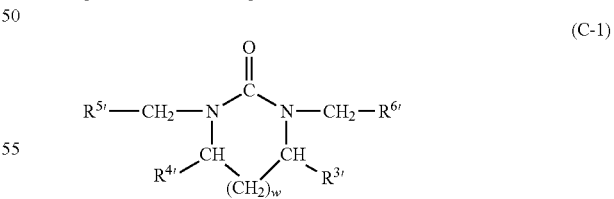

(C-1)

In formula (C-1), each of $R^{5'}$ and $R^{6'}$ independently represents a hydroxyl group or a lower alkoxy group, each of $R^{3'}$ and $R^{4'}$ independently represents a hydrogen atom, a hydroxyl group or a lower alkoxy group, and w represents 0 or an integer of 1 to 2.

When $R^{5'}$ or $R^{6'}$ represents a lower alkoxy group, an alkoxy group of 1 to 4 carbon atoms is preferred, and the alkoxy group may be either linear or branched. $R^{5'}$ and $R^{6'}$ may be either the same or different, but are preferably the same.

When $R^{3'}$ or $R^{4'}$ represents a lower alkoxy group, an alkoxy group of 1 to 4 carbon atoms is preferred, and the alkoxy group may be either linear or branched. $R^{3'}$ and $R^{4'}$ may be either the same or different, but are preferably the same.

w is either 0 or an integer from 1 to 2, and is preferably 0 or 1.

As the alkylene urea-based cross-linker, compounds in which w is 0 (ethylene urea-based cross-linkers) and/or compounds in which w is 1 (propylene urea-based cross-linkers) are preferred.

Compounds represented by general formula (C-1) above can be obtained by a condensation reaction between an alkylene urea and formalin, and by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with either one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

There are no particular restrictions on the epoxy-based cross-linkers, and any cross-linker having an epoxy group may be used. Of such cross-linkers, those having two or more epoxy groups (and a molecular weight of less than 1,000) are preferred. Including two or more epoxy groups improves the cross-linking reaction.

The number of epoxy groups is preferably at least two, more preferably from 2 to 4, and is most preferably 2.

Preferred examples of the epoxy-based cross-linkers are shown below.

[Chemical formula 70]

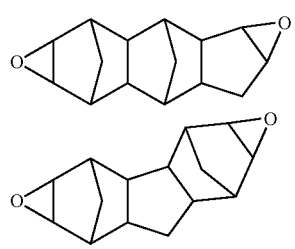

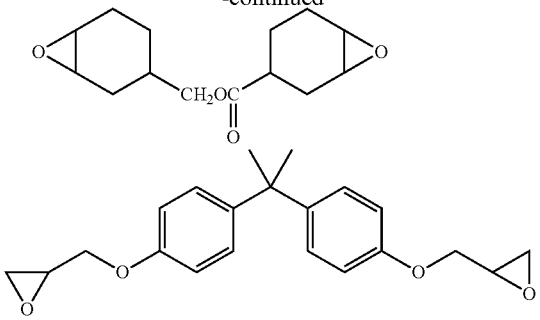

As the component (C), one type of cross-linker may be used alone, or two or more types may be used in combination.

The amount of the component (C) is preferably within a range from 1 to 50 parts by weight, more preferably from 3 to 30 parts by weight, still more preferably from 3 to 15 parts by weight, and most preferably from 5 to 10 parts by weight, relative to 100 parts by weight of the component (A). By ensuring that the amount of the component (C) is at least as large as the lower limit of the above-mentioned range, the formation of cross-linking is able to proceed favorably, and a favorable resist pattern with minimal swelling is obtained. On the other hand, by ensuring that the amount of the component (C) is not more than the upper limit of the above range, the storage stability of the resist coating liquid improves, and deterioration in the sensitivity over time can be suppressed.

[Component (D)]

The resist composition of the present invention preferably also includes a nitrogen-containing organic compound (D) (hereafter referred to as "component (D)") as an optional component.

There are no particular limitations on the component (D) as long as it functions as an acid diffusion control agent, namely, a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable.

An "aliphatic amine" is an amine having one or more aliphatic groups, wherein the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 12 carbon atoms (namely, alkylamines or alkyl alcohol amines), and cyclic amines.

Specific examples of alkylamines and alkyl alcohol amines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine and tri-n-dodecylamine, and alkyl alcohol amines such as diethanolamine, triethanolamine, diisopropanolamine, triisopropanolamine, di-n-octanolamine and tri-n-octanolamine. Among these, trialkylamines of 5 to 10 carbon atoms are preferable, and tri-n-pentylamine or tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine and 1,4-diazabicyclo[2.2.2]octane.

As the component (D), one compound may be used alone, or two or more compounds may be used in combination.

The component (D) is typically used in an amount within a range from 0.01 to 5.0 parts by weight, relative to 100 parts by weight of the component (A). By ensuring that the amount of the component (D) is within the above-mentioned range, the shape of the resist pattern and the post exposure stability of the latent image formed by the pattern-wise exposure of the resist layer are improved.

[Component (E)]

Furthermore, in the resist composition of the present invention, in order to prevent any deterioration in sensitivity and improve the resist pattern shape and the post exposure stability of the latent image formed by the pattern-wise exposure of the resist layer, at least one compound (E) (hereafter referred to as "component (E)") selected from the group consisting of organic carboxylic acids, phosphorus oxo acids and derivatives thereof may be added.

Examples of the organic carboxylic acids include acetic acid, malonic acid, citric acid, malic acid, succinic acid, benzoic acid and salicylic acid.

Examples of the phosphorus oxo acids include phosphoric acid, phosphonic acid and phosphinic acid. Among these, phosphonic acid is particularly desirable.

Examples of the phosphorus oxo acid derivatives include esters in which a hydrogen atom within an above-mentioned oxo acid is substituted with a hydrocarbon group. Examples of the hydrocarbon group include alkyl groups of 1 to 5 carbon atoms and aryl groups of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, diphenyl phosphonate and dibenzyl phosphonate, as well as phenylphosphonic acid.

Examples of phosphinic acid derivatives include phosphinate esters and phenylphosphinic acid.

As the component (E), one type of compound may be used alone, or two or more types of compounds may be used in combination.

The component (E) is preferably an organic carboxylic acid, and is more preferably salicylic acid.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be prepared by dissolving the components for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for chemically amplified resists.

Specific examples of the component (S) include lactones such as γ-butyrolactone; ketones such as acetone, methyl ethyl ketone, cyclohexanone, methyl-n-pentyl ketone, methyl isopentyl ketone and 2-heptanone; polyhydric alcohols, such as ethylene glycol, diethylene glycol, propylene glycol and dipropylene glycol; polyhydric alcohol derivatives, including compounds having an ester bond such as ethylene glycol monoacetate, diethylene glycol monoacetate, propylene glycol monoacetate and dipropylene glycol monoacetate, and compounds having an ether bond such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as mixed solvents containing two or more solvents.

Among these, γ-butyrolactone, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of this mixed solvent can be determined appropriately with due consideration of the compatibility of the PGMEA with the polar solvent, but is preferably in the range of 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the ratio of PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably within a range from 70:30 to 95:5.

The amount of the component (S) is not particularly limited, and may be adjusted appropriately to a concentration which enables coating of a coating solution onto a substrate in accordance with the thickness of the coating film. In general, the organic solvent is used in an amount that yields a solid content for the resist composition that is within a range from 0.5 to 20% by weight, and preferably from 1 to 15% by weight.

Dissolving of the components of the resist composition in the component (S) can be conducted, for example, by simply mixing and stirring each of the above components using a conventional method. Where required, the composition may also be mixed and dispersed using a dispersion device such as a dissolver, a homogenizer, or a triple roll mill. Furthermore, following mixing, the composition may also be filtered using a mesh or a membrane filter or the like.

The resist composition of the present invention has effects that include excellent adhesion of the resist film to substrates and the like, and superior suppression of pattern collapse. The reasons for these effects are not entirely clear, but are thought to include the following.

Namely, the resist composition of the present invention includes the epoxy resin (G) in addition to the base component (A) and the acid generator component (B). During resist pattern formation, following application of the resist composition to the surface of a substrate or the like, when treatments such as prebaking, exposure, and post-exposure baking (PEB) are performed, the epoxy resin (G) cures, forming an epoxy resin layer on the surface of the substrate or the like. It is thought that because the resist film is formed on the surface of the substrate via this epoxy resin layer, the adhesion between the substrate or the like and the resist film is enhanced, thereby inhibiting pattern collapse.

Further, with the resist composition of the present invention, even if the substrate such as a silicon wafer has not been subjected to treatment with hexamethyldisilazane (HMDS) or the like, or even if an organic antireflective film has not been provided, a resist film that exhibits excellent adhesion to the substrate can still be obtained, and pattern collapse can be suppressed. Accordingly, the step for conducting the HMDS treatment and/or the step for forming an organic antireflective film can be omitted from the resist pattern formation process.

Furthermore, in the resist composition of the present invention, the use of an epoxy resin having unopened epoxy rings as the epoxy resin (G) is preferred. Epoxy resins having unopened epoxy rings undergo ready ring-opening of the epoxy groups under the action of acid, base or water, and these ring-opened groups are then able to undergo mutual cross-linking. As a result, during resist pattern formation, following application of the resist composition to the surface of a substrate or the like, when treatments such as prebaking, exposure, and post-exposure baking (PEB) are performed, the unopened epoxy rings undergo ring opening and mutual cross-linking, resulting in the formation of an epoxy resin layer on the surface of the substrate or the like. It is thought that because the resist film is formed on the surface of the substrate via this epoxy resin layer, the adhesion between the substrate or the like and the resist film is further enhanced, resulting in even better suppression of pattern collapse.

As mentioned above, as pattern miniaturization progresses, the adhesion of the resist film to the substrate or the like tends to become unsatisfactory for resist compositions that only employ a resin having a structural unit containing an epoxy group as the base component, or resist compositions that employ a low molecular weight (of approximately 1,000) epoxy compound (non-polymer). According to the resist composition of the present invention, by using a combination of a base component and an epoxy resin that is separate from the base component, a favorable improvement is achieved in the resist film adhesion, enabling pattern collapse to be satisfactorily suppressed. This adhesion improvement effect increases in magnitude as the molecular weight of the epoxy resin increases. It is thought that this is due to an increased number of cross-linking points to the substrate or the like from the combination of the base component and the epoxy resin, and a higher cross-linking density.

The resist composition of the present invention is particularly useful in applications where pattern collapse is more prevalent due to increased pattern miniaturization, and applications where thick-film resists are to be formed (such as implantation processes).

Further, a resist pattern formed using the resist composition of the present invention exhibits favorable lithography properties such as resolution, exposure margin (EL margin), and depth of focus (DOF), and also has an excellent pattern shape.

Because the resolution is superior, the resist composition of the present invention is also particularly useful as a resist material used in the formation of isolated line patterns.

<<Method of Forming Resist Pattern>>

The method of forming a resist pattern according to a second aspect of the present invention includes: using the resist composition of the present invention described above to form a resist film on a substrate, conducting exposure of the resist film, and alkali-developing the resist film to form a resist pattern.

The method of forming a resist pattern according to the present invention can be performed, for example, as follows.

Firstly, the resist composition according to the present invention described above is spin-coated onto a substrate using a spinner or the like, and a prebake (post applied bake (PAB)) is conducted under temperature conditions of 80 to 150° C. for 40 to 120 seconds, and preferably 60 to 90 seconds, to form a resist film. Following selective exposure of the thus formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, post exposure baking (PEB) is conducted under temperature conditions of 80 to 150° C. for 40 to 120 seconds, and preferably 60 to 90 seconds. Subsequently, a developing treatment is conducted using an alkali developing solution such as a 0.1 to 10% by weight aqueous solution of tetramethylammonium hydroxide (TMAH), preferably followed by rinsing with pure water, and drying. If desired, a bake treatment (post bake) may be conducted following the above developing treatment. In this manner, a resist pattern that is faithful to the mask pattern can be obtained.

The substrate is not specifically limited, and a conventionally known substrate can be used. For example, substrates for electronic components, and such substrates having predetermined wiring patterns formed thereon can be used. Specific examples of the material of the substrate include metals such as silicon wafer, copper, chromium, iron and aluminum, as well as glass substrates. Suitable materials for the wiring pattern include copper, aluminum, nickel and gold.

Further, as the substrate, any one of the above-mentioned substrates that has either been subjected to a surface treatment with hexamethyldisilazane (HMDS), or provided with an inorganic and/or organic film on the surface thereof may also be used. As the inorganic film, an inorganic antireflective film (inorganic BARC) may be used. As the organic film, an organic antireflective film (organic BARC) or an organic film such as the lower-layer organic film used in a multilayer resist method may be used.

In the present invention, as described above, even if the substrate is not subjected to an HMDS treatment, or even if a BARC is not provided, a resist film can be formed that still exhibits excellent adhesion to the substrate, and still provides superior suppression of pattern collapse.

Here, a "multilayer resist method" is a method in which at least one layer of an organic film (a lower-layer organic film) and at least one layer of a resist film (an upper-layer resist film) are provided on a substrate, and a resist pattern formed within the upper-layer resist film is used as a mask to conduct patterning of the lower-layer organic film. This method is capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (a double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (a three-layer resist method).

The wavelength to be used for exposure is not particularly limited, and the exposure can be conducted using radiation such as an ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective for use with a KrF excimer laser, ArF excimer laser, EB and EUV, and is particularly effective to an ArF excimer laser.

The exposure method used with the resist film may be either a general exposure method (dry exposure) conducted in air or an inert gas such as nitrogen, or an immersion exposure (liquid immersion lithography) method.

In liquid immersion lithography, the region between the resist film and the lens at the lowermost point of the exposure apparatus is pre-filled with a solvent (an immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environmental issues and versatility.

The method of forming a resist pattern according to the present invention is useful for forming a resist pattern within applications that involve the formation of a thick-film resist (such as implantation processes).

Further, the method of forming a resist pattern according to the present invention can also be applied to double exposure methods and double patterning methods.

EXAMPLES

A more detailed description of the present invention is presented below based on a series of examples, although the scope of the present invention is in no way limited by these examples.

In the following examples, a unit represented by a chemical formula (1) is designated as "compound (1)", and the same labeling system applies for compounds represented by other formulas.

<Synthesis of Base Component (A)>

In the following examples, a polymeric compound used as the base component (A) was obtained by using the compounds (1) to (7) represented by chemical formulas shown below in amounts that corresponded with a predetermined molar ratio, and copolymerizing these compounds using a conventional dropwise polymerization method.

[Chemical formula 71]

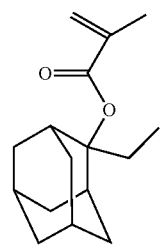

Compound (1)

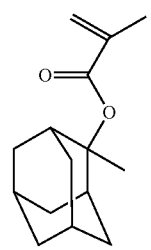

Compound (2)

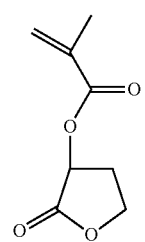

Compound (3)

-continued

Compound (4)

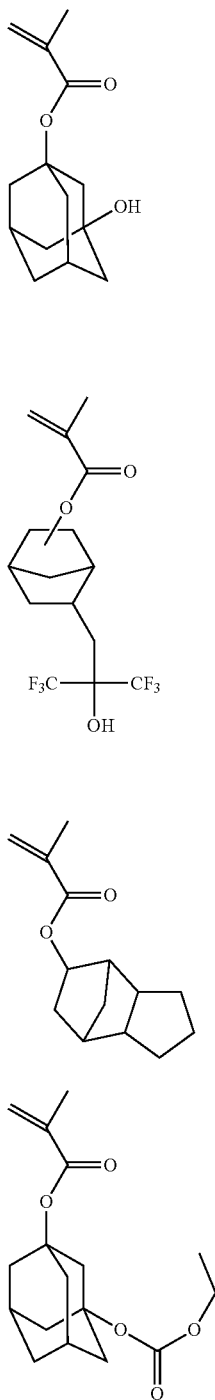

Compound (5)

Compound (6)

Compound (7)

The structural formula of each of the obtained polymeric compounds, together with the weight average molecular weight (Mw), the dispersity (Mw/Mn), and the proportion (mol %) of each of the structural units are detailed below.

The weight average molecular weight (Mw) and dispersity (Mw/Mn) of the polymeric compound were determined by gel permeation chromatography using polystyrene standards. Further, the proportion (mol %) of the structural unit derived from each compound was calculated from the carbon-13 nuclear magnetic resonance spectrum (600 MHz $^{13}$C-NMR).

[Chemical formula 72]

Polymeric compound (1)

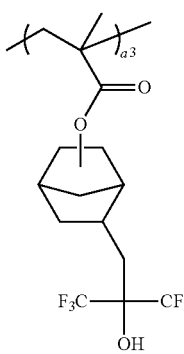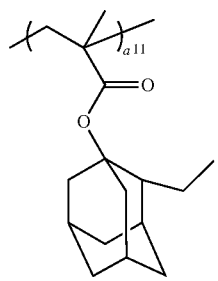

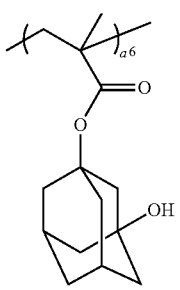

[Mw: 10,000, Mw/Mn: 1.50, a3/a11/a6 = 40/40/20]

[Chemical formula 73]

Polymeric compound (2)

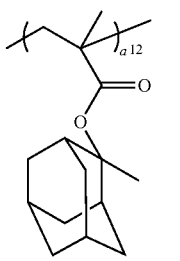

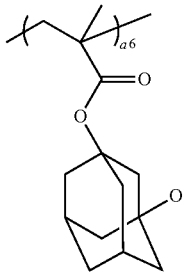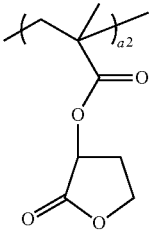

[Mw: 13,000, Mw/Mn: 1.80, a12/a2/a6/a4 = 40/40/15/5]

-continued

[Chemical formula 74]

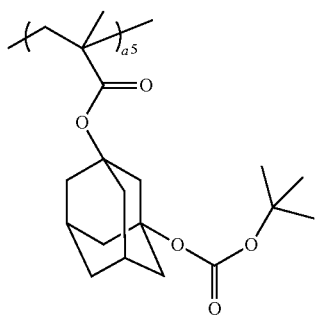

Polymeric compound (3)

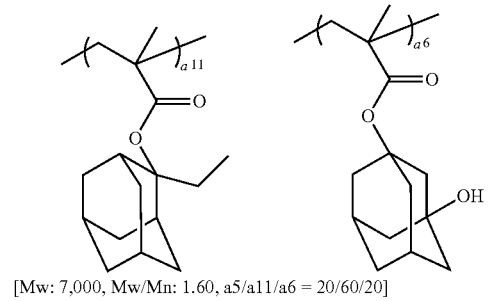

[Mw: 7,000, Mw/Mn: 1.60, a5/a11/a6 = 20/60/20]

<Preparation of Resist Compositions>
(Examples 1 to 5, Comparative examples 1 to 5)
The components shown in Table 1 were mixed together and dissolved to prepare a series of positive resist compositions.

TABLE 1

|  | Component (A) | Component (B) | Component (G) | Component (D) | Component (E) | Component (S) | |
|---|---|---|---|---|---|---|---|
| Comparative example 1 | (A)-1 [100] | (B)-1 [3.50] | — | (D)-1 [1.00] | (E)-1 [1.00] | (S)-1 [25] | (S)-2 [1150] |
| Comparative example 2 | (A)-1 [100] | (B)-1 [3.50] | (G)-1 [1.0] | (D)-1 [1.00] | (E)-1 [1.00] | (S)-1 [25] | (S)-2 [1150] |
| Example 1 | (A)-1 [100] | (B)-1 [3.50] | (G)-2 [1.5] | (D)-1 [1.00] | (E)-1 [1.00] | (S)-1 [25] | (S)-2 [1150] |
| Comparative example 3 | (A)-2 [100] | (B)-1 [3.50] | — | (D)-1 [1.00] | (E)-1 [1.00] | (S)-1 [25] | (S)-2 [1150] |
| Comparative example 4 | (A)-2 [100] | (B)-1 [3.50] | (G)-1 [1.0] | (D)-1 [1.00] | (E)-1 [1.00] | (S)-1 [25] | (S)-2 [1150] |
| Example 2 | (A)-2 [100] | (B)-1 [3.50] | (G)-2 [1.5] | (D)-1 [1.00] | (E)-1 [1.00] | (S)-1 [25] | (S)-2 [1150] |
| Comparative example 5 | (A)-3 [100] | (B)-2 [3.33] | — | (D)-2 [0.75] | — | — | (S)-2 [1150] |
| Example 3 | (A)-3 [100] | (B)-2 [3.33] | (G)-2 [0.60] | (D)-2 [0.75] | — | — | (S)-2 [1150] |
| Example 4 | (A)-3 [100] | (B)-2 [3.33] | (G)-3 [0.60] | (D)-2 [0.75] | — | — | (S)-2 [1150] |
| Example 5 | (A)-3 [100] | (B)-2 [3.33] | (G)-4 [0.60] | (D)-2 [0.75] | — | — | (S)-2 [1150] |

In Table 1, the reference symbols have the meanings shown below. Further, the numerical values in brackets [ ] in Table 1 indicate the amount (in parts by weight) of the component added.

(A)-1: the aforementioned polymeric compound (1)
(A)-2: the aforementioned polymeric compound (2)
(A)-3: the aforementioned polymeric compound (3)
(B)-1: (4-methylphenyl)diphenylsulfonium nonafluoro-n-butanesulfonate
(B)-2: (4-methylphenyl)diphenylsulfonium trifluoromethanesulfonate
(G)-1: the ethyl glycidyl ether represented by chemical formula (G)-1 shown below (Mw: 102)
(G)-2: the polybutadiene epoxide formed from the repeating unit represented by chemical formula (G)-2 shown below (Mw: 18,800, Mw/Mn: 4.54)

[Chemical formula 75]

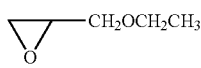
(G)-1

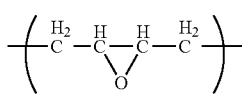
(G)-2

(G)-3: the epoxy resin represented by chemical formula (G)-3 shown below (Mw: 9,600, Mw/Mn: 2.30, a4/g1/g21=35/35/30
(G)-4: the epoxy resin represented by chemical formula (G)-4 shown below (Mw: 8,900, Mw/Mn: 2.20, g23/g1/g21=35/35/30

[Chemical formula 76]

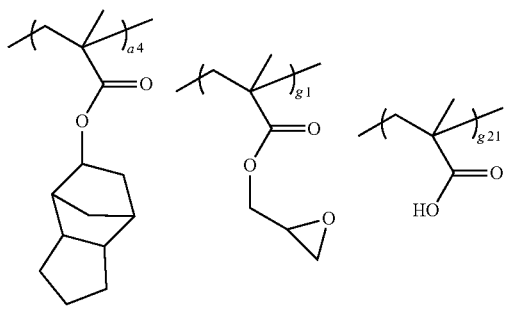
(G)-3

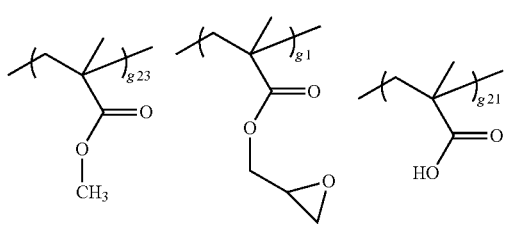
(G)-4

(D)-1: tri-n-octylamine
(D)-2: tri-n-pentylamine
(E)-1: salicylic acid
(S)-1: γ-butyrolactone
(S)-2: a mixed solvent of PGMEA/PGME=6/4 (weight ratio)

<Resist Pattern Formation (1)>

Using a Clean Track Act8 (product name, manufactured by Tokyo Electron Co., Ltd.), each of the resist compositions of examples 1 to 2 and comparative examples 1 to 4 was spin-coated uniformly onto an 8-inch silicon substrate that had been surface-treated with hexamethyldisilazane (HMDS) for 36 seconds at 90° C., and a prebake (PAB) was then conducted on a hotplate for 60 seconds at 90° C. to dry the composition, thereby forming a resist film having a film thickness of 220 nm.

Subsequently, the resist film was selectively exposed through a mask (binary mask) pattern with an ArF excimer laser (193 nm), using an ArF exposure apparatus NSR-5302A (manufactured by Nikon Corporation, NA (numerical aperture)/sigma=0.60/0.75).

The resist film was subjected to a post exposure bake treatment (PEB) at 100° C. for 60 seconds, was subsequently developed for 30 seconds at 23° C. in a 2.38% by weight aqueous solution of tetramethylammonium hydroxide (TMAH), and was then rinsed for 30 seconds in pure water and shaken dry. An additional bake treatment (post bake) was then performed at 100° C. for 60 seconds.

Results of Resist Pattern Formation (1)

(1-1) In each of the examples, a line and space pattern (L/S pattern) having a line width of 250 nm and a pitch of 500 nm was formed in the resist film.

(1-2) In each of the examples, an isolated line resist pattern (ISO pattern) having a line width of 250 nm was formed in the resist film.

<Resist Pattern Formation (2)>

With the exception of replacing the 8-inch silicon substrate that had undergone HMDS treatment from the resist pattern formation (1) above with a 8-inch silicon substrate that had not undergone HMDS treatment, resist pattern formation was conducted in the same manner as resist pattern formation (1).

Results of Resist Pattern Formation (2)

(2-1) In those cases where the resist compositions of comparative examples 1 to 4 were used, pattern collapse occurred and an L/S pattern could not be formed. However, in those cases where the resist compositions of examples 1 and 2 were used, an L/S pattern having a line width of 250 nm and a pitch of 500 nm was formed in the resist film.

(2-2) In those cases where the resist compositions of comparative examples 1 to 4 were used, pattern collapse occurred and an ISO pattern could not be formed. However, in those cases where the resist compositions of examples 1 and 2 were used, an ISO pattern having a line width of 250 nm was formed in the resist film.

[Evaluation of Sensitivity]

For the resist pattern formation methods (1) and (2) described above, the optimum exposure dose Eop (sensitivity, units: $mJ/cm^2$) for formation of the L/S pattern of line width 250 nm and pitch 500 nm was determined. The results are listed in Table 2.

[Evaluation of depth of focus (DOF)]

At the Eop value described above, the focus was shifted up and down appropriately, and the depth of focus (DOF) values (units: μm) across which the above L/S pattern and ISO pattern were able to be formed within a dimensional variation of ±10% from the target dimension of 250 nm (namely, within a range from 225 to 275 nm) were determined. The results are listed in Table 2.

[Evaluation of Resolution]

The critical resolution at the above Eop value was evaluated using a scanning electron microscope S-9220 (product name, manufactured by Hitachi, Ltd.). This evaluation was performed by conducting resist pattern formation, and measuring the line width immediately prior to the point where pattern collapse started to occur. The results are listed in Table 2.

[Evaluation of Exposure Margin (EL Margin)]

The exposure doses with which lines from the L/S pattern and ISO pattern of the above resist pattern formation methods (1) and (2) were able to be formed within a range of ±10% from the target dimension of 250 nm (namely, within a range from 225 to 275 nm) were determined, and the EL margin (unit: %) was the determined using the following formula. The results are listed in Table 2.

EL margin(%)=(|E1−E2|/Eop)×100

In the formula, E1 represents the exposure dose (mJ/cm$^2$) for forming a L/S pattern or ISO pattern with a line width of 225 nm, and E2 represents the exposure dose (mJ/cm$^2$) for forming a L/S pattern or ISO pattern with a line width of 275 nm.

TABLE 2

| Resist pattern formation | | Eop (mJ/cm$^2$) L/S | DOF (μm) | | Critical resolution (nm) ISO | EL margin (%) | |
|---|---|---|---|---|---|---|---|
| | | | L/S | ISO | | L/S | ISO |
| Comparative example 1 | (1) | 17.0 | 1.1 | 1.0 | 160 | 5.70 | 5.30 |
| | (2) | (Pattern collapse occurred, predetermined pattern could not be formed) | | | | | |
| Comparative example 2 | (1) | 19.0 | 1.0 | 1.0 | 160 | 5.37 | 6.66 |
| | (2) | (Pattern collapse occurred, predetermined pattern could not be formed) | | | | | |
| Example 1 | (1) | 20.0 | 1.0 | 1.1 | 140 | 6.16 | 5.93 |
| | (2) | 21.0 | 0.9 | 1.2 | 140 | 6.49 | 6.37 |
| Comparative example 3 | (1) | 20.0 | 1.1 | 1.0 | 170 | 4.31 | 3.98 |
| | (2) | (Pattern collapse occurred, predetermined pattern could not be formed) | | | | | |
| Comparative example 4 | (1) | 22.0 | 1.1 | 1.0 | 170 | 4.45 | 3.86 |
| | (2) | (Pattern collapse occurred, predetermined pattern could not be formed) | | | | | |
| Example 2 | (1) | 21.0 | 1.1 | 1.1 | 160 | 5.27 | 4.76 |
| | (2) | 21.5 | 1.0 | 1.2 | 160 | 5.18 | 4.84 |

From the results in Table 2, comparison of the results for example 1 and comparative examples 1 and 2 confirmed that in the resist pattern formation (1) (where the substrate was subjected to a HMDS treatment), the resist composition of example 1 yielded substantially the same DOF and EL margin values as those for the resist compositions of comparative examples 1 and 2, and the resolution was also favorable.

In the case of the resist pattern formation (2) (where the substrate was not treated with HMDS), the resist composition of example 1 enabled formation of both the L/S pattern and the ISO pattern, and yielded DOF, EL margin and resolution results that were similar to the case where the HMDS treatment was performed. In contrast, the resist compositions of comparative examples 1 and 2 suffered pattern collapse, and the desired patterns could not be formed.

Comparison of example 2 and comparative examples 3 and 4 confirmed that in the resist pattern formation (1) (where the substrate was subjected to a HMDS treatment), the resist composition of example 2 yielded substantially the same DOF value as those for the resist compositions of comparative examples 3 and 4, and the resolution and EL margin were also favorable.

In the case of the resist pattern formation (2) (where the substrate was not treated with HMDS), the resist composition of example 2 enabled formation of both the L/S pattern and the ISO pattern, and yielded DOF, EL margin and resolution results that were similar to the case where the HMDS treatment was performed. In contrast, the resist compositions of comparative examples 3 and 4 suffered pattern collapse, and the desired patterns could not be formed.

The resist compositions of examples 1 and 2 exhibited good resolution, and it can therefore be stated that they are ideal for forming ISO patterns.

<Resist Pattern Formation (3)>

Using a Clean Track Act8 (product name, manufactured by Tokyo Electron Co., Ltd.), each of the resist compositions of examples 3 to 5 and comparative example 5 was spin-coated uniformly onto an 8-inch silicon substrate that had been surface-treated with hexamethyldisilazane (HMDS) for 45 seconds at 150° C., and a prebake (PAB) was then conducted on a hotplate for 60 seconds at 115° C. to dry the composition, thereby forming a resist film having a film thickness of 250 nm.

Subsequently, the resist film was selectively exposed through a mask (6% half-tone mask) pattern with an ArF excimer laser (193 nm), using an ArF exposure apparatus NSR-5302A (manufactured by Nikon Corporation, NA (numerical aperture)=0.60, σ=½ annular illumination).

The resist film was subjected to a post exposure bake treatment (PEB) at 105° C. for 60 seconds, was subsequently developed for 30 seconds at 23° C. in a 2.38% by weight aqueous solution of tetramethylammonium hydroxide (TMAH), and was then rinsed for 30 seconds in pure water and shaken dry. An additional bake treatment (post bake) was then performed at 100° C. for 60 seconds.

As a result, in each of the examples, a line and space pattern having a line width of 200 nm and a pitch of 800 nm (L/S1:3 pattern) was formed in the resist film.

[Evaluation of Sensitivity]

For the resist pattern formation (3) described above, the optimum exposure dose Eop (sensitivity, units: mJ/cm$^2$) for formation of the L/S1:3 pattern of line width 200 nm and pitch 800 nm was determined. The results are listed in Table 3.

[Evaluation of Depth of Focus (DOF)]

At the Eop value described above, the focus was shifted up and down appropriately, and the depth of focus (DOF) values (units: pin) across which the above L/S1:3 pattern was able to be formed within a dimensional variation of ±10% from the target dimension of 200 nm (namely, within a range from 180 to 220 nm) was determined. The results are listed in Table 3.

[Evaluation of Resolution]

The critical resolution at the above Eop value was evaluated using a scanning electron microscope S-9220 (product name, manufactured by Hitachi, Ltd.). This evaluation was performed by conducting resist pattern formation, and measuring the line width immediately prior to the point where pattern collapse started to occur. The results are listed in Table 3.

[Evaluation of Pattern Collapse]

With the exception of altering the Eop (exposure dose) value, line and space patterns were formed in the same manner as the resist pattern formation (3) described above, and the line width and exposure dose immediately prior to the values where pattern collapse started to occur were recorded. These results were recorded in Table 3 under the heading "Collapse [nm/(mJ/cm$^2$)]".

Specifically, in the case of comparative example 5, patterns were formed while the exposure dose was varied across a range from 4.0 to 7.0 mJ/cm² at 0.5 mJ/cm² intervals. The results revealed that pattern collapse occurred at an exposure dose of 7.0 mJ/cm².

In the case of example 3, patterns were formed while the exposure dose was varied across a range from 4.5 to 8.5 mJ/cm² at 0.5 mJ/cm² intervals. The results revealed that pattern collapse occurred at an exposure dose of 8.5 mJ/cm².

In the case of example 4, patterns were formed while the exposure dose was varied across a range from 5.0 to 9.5 mJ/cm² at 0.5 mJ/cm² intervals. The results revealed that pattern collapse occurred at an exposure dose of 9.5 mJ/cm².

In the case of example 5, patterns were formed while the exposure dose was varied across a range from 5.0 to 9.5 mJ/cm² at 0.5 mJ/cm² intervals. The results revealed that pattern collapse occurred at an exposure dose of 9.5 mJ/cm².

The greater the difference between the exposure dose immediately prior to pattern collapse and the Eop value, the less likely the resist pattern is to suffer pattern collapse, and the more resistant the composition is to pattern collapse.

[Evaluation of Resist Pattern Shape]

The L/S1:3 patterns of line width 200 nm and pitch 800 nm formed at the above Eop values were inspected using a scanning electron microscope SEM, and the cross-sectional shape of the pattern was evaluated.

TABLE 3

|  | Comparative example 5 | Example 3 | Example 4 | Example 5 |
|---|---|---|---|---|
| Eop (mJ/cm²) | 6.0 | 6.5 | 7.0 | 7.0 |
| DOF (μm) | 0.7 | 1.2 | 1.2 | 1.1 |
| Critical resolution (nm) | 140 | 130 | 130 | 100 |
| Collapse [nm/(mJ/cm²)] | 170.6/6.5 | 170.9/8.0 | 130.7/9.0 | 128.0/9.0 |

From the results in Table 3 it was confirmed that compared with the resist composition of comparative example 5, the resist compositions of examples 3 to 5 exhibited a greater difference between the exposure dose immediately prior to pattern collapse and the Eop value, indicating a reduced likelihood of pattern collapse and superior resistance to pattern collapse.

Moreover, compared with the resist composition of comparative example 5, the resist compositions of examples 3 to 5 exhibited superior levels of DOF, resolution, and resist pattern shape.

While preferred embodiments of the invention have been described, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A resist composition comprising:
a base component (A) that exhibits changed solubility in an alkali developing solution under action of acid,
an acid generator component (B) that generates acid upon radiation exposure, and
an epoxy resin (G), wherein
said epoxy resin (G) has a weight average molecular weight within a range from 5,000 to 30,000, and an amount of said epoxy resin (G) is within a range from 0.1 to 4 parts by mass, relative to 100 parts by mass of said base component (A).

2. The resist composition according to claim 1, wherein said epoxy resin (G) has a repeating structure comprising a structural unit (g1) containing an epoxy group, and an amount of said structural unit (g1), based on a combined total of all structural units that constitute said epoxy resin (G), is not less than 10 mol %.

3. The resist composition according to claim 1, wherein said base component (A) comprises a resin component (A1-1) that exhibits increased solubility in an alkali developing solution under action of acid.

4. The resist composition according to claim 3, wherein said resin component (A1-1) comprises a structural unit (a1) derived from an acrylate ester containing an acid-dissociable, dissolution-inhibiting group.

5. The resist composition according to claim 4, wherein said resin component (A1-1) further comprises a structural unit (a2) derived from an acrylate ester containing a lactone-containing cyclic group.

6. The resist composition according to claim 4, wherein said resin component (A1-1) further comprises a structural unit (a3) derived from an acrylate ester containing a polar group-containing aliphatic hydrocarbon group.

7. The resist composition according to claim 4, wherein said resin component (A1-1) further comprises a structural unit (a4) derived from an acrylate ester containing a non-acid-dissociable aliphatic polycyclic group.

8. The resist composition according to claim 4, wherein said resin component (A1-1) further comprises a structural unit (a5) represented by general formula (a5-1) shown below:

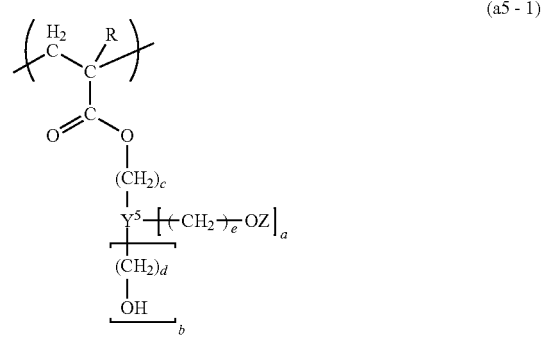

(a5-1)

wherein R represents a hydrogen atom, an alkyl group of 1 to 5 carbon atoms or a halogenated alkyl group of 1 to 5 carbon atoms, $Y^5$ represents an aliphatic hydrocarbon group which may have a substituent, Z represents a monovalent organic group, a represents an integer of 1 to 3 and b represents an integer of 0 to 2, provided that a+b=1 to 3, and each of c, d and e independently represents an integer of 0 to 3.

9. The resist composition according to claim 4, wherein said resin component (A1-1) further comprises a structural unit (a6) represented by general formula (a6-1) shown below:

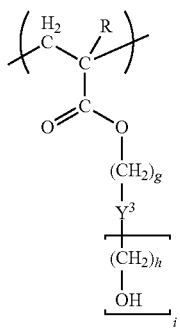

(a6 - 1)

wherein R represents a hydrogen atom, an alkyl group of 1 to 5 carbon atoms or a halogenated alkyl group of 1 to 5 carbon atoms, $Y^3$ represents an alkylene group or an aliphatic cyclic group, each of g and h independently represents an integer of 0 to 3, and i represents an integer of 1 to 3.

10. The resist composition according to claim 1, further comprising a nitrogen-containing organic compound (D).

11. A method of forming a resist pattern, comprising:
    using the resist composition according to any one of claims 1 to 10 to form a resist film on a substrate, conducting radiation exposure of said resist film, and alkali-developing said resist film to form a resist pattern.

* * * * *